United States Patent
Chu et al.

(10) Patent No.: US 12,284,859 B2
(45) Date of Patent: *Apr. 22, 2025

(54) ORGANIC LIGHT-EMITTING DEVICE AND APPARATUS INCLUDING THE SAME

(71) Applicant: SAMSUNG DISPLAY CO., LTD., Yongin-si (KR)

(72) Inventors: Seungjin Chu, Yongin-si (KR); Kyungsik Kim, Yongin-si (KR); Sungwook Kim, Yongin-si (KR); Seulong Kim, Yongin-si (KR); Tsuyoshi Naijo, Yongin-si (KR); Yunjee Park, Yongin-si (KR); Sungsoo Bae, Yongin-si (KR); Dongchan Lee, Yongin-si (KR); Hyewon Choi, Yongin-si (KR); Jaeweon Hur, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 21 days.

This patent is subject to a terminal disclaimer.

(21) Appl. No.: 18/179,306

(22) Filed: Mar. 6, 2023

(65) Prior Publication Data
US 2023/0225144 A1 Jul. 13, 2023

Related U.S. Application Data

(63) Continuation of application No. 16/996,599, filed on Aug. 18, 2020, now Pat. No. 11,626,566.

(30) Foreign Application Priority Data

Dec. 16, 2019 (KR) .................. 10-2019-0168146

(51) Int. Cl.
*H10K 50/12* (2023.01)
*H10K 50/15* (2023.01)
(Continued)

(52) U.S. Cl.
CPC .......... *H10K 50/12* (2023.02); *H10K 85/324* (2023.02); *H10K 85/615* (2023.02);
(Continued)

(58) Field of Classification Search
CPC .......................... H10K 2101/40; H10K 50/12
See application file for complete search history.

(56) References Cited

U.S. PATENT DOCUMENTS 9,385,335 B2   7/2016  Pflumm et al.
9,748,510 B2   8/2017  Ito et al.
(Continued)

FOREIGN PATENT DOCUMENTS

KR   10-2009-0116091 A   11/2009
KR   10-2014-0027218 A    3/2014
(Continued)

OTHER PUBLICATIONS

Korean Notice of Allowance issued Oct. 21, 2024, in corresponding KR Patent Application No. 10-2019-0168146 (3 pages).

*Primary Examiner* — Vu A Nguyen
(74) *Attorney, Agent, or Firm* — Womble Bond Dickinson (US) LLP

(57) ABSTRACT

An organic light-emitting device includes a mixed layer, an emission layer, and a buffer layer and satisfies one of Equation 1 or Equation 2 and Equation 3:

$T1(D) \geq T1(Mix)+0.3$ eV          Equation 1

$T1(H) \geq T1(Mix)+0.3$ eV          Equation 2

$T1(Mix) < T1(Buffer)+0.5$ eV.       Equation 3.

20 Claims, 1 Drawing Sheet

(51) Int. Cl.
  *H10K 50/16* (2023.01)
  *H10K 85/30* (2023.01)
  *H10K 85/60* (2023.01)
(52) U.S. Cl.
  CPC ....... *H10K 85/654* (2023.02); *H10K 85/6572* (2023.02); *H10K 85/6574* (2023.02); *H10K 50/15* (2023.02); *H10K 50/16* (2023.02)

(56) References Cited

U.S. PATENT DOCUMENTS

| | | | |
|---|---|---|---|
| 10,629,825 B2 | 4/2020 | Cho et al. | |
| 11,626,566 B2 * | 4/2023 | Chu | H10K 85/631 257/40 |
| 2017/0133590 A1 | 5/2017 | Cho et al. | |
| 2017/0346029 A1 | 11/2017 | Kim et al. | |
| 2020/0048232 A1 | 2/2020 | Cha et al. | |

FOREIGN PATENT DOCUMENTS

| | | |
|---|---|---|
| KR | 10-2015-0004564 A | 1/2015 |
| KR | 10-2015-0126528 A | 11/2015 |
| KR | 10-2016-0101519 A | 8/2016 |
| KR | 10-2017-0053205 A | 5/2017 |
| KR | 10-1956790 B1 | 3/2019 |
| KR | 10-2019-0042439 A | 4/2019 |

\* cited by examiner

10

| |
|---|
| 190 |
| 156 |
| 155 |
| 154 |
| 110 |

ORGANIC LIGHT-EMITTING DEVICE AND APPARATUS INCLUDING THE SAME

CROSS-REFERENCE TO RELATED APPLICATION

This application is a continuation of U.S. patent application Ser. No. 16/996,599, filed Aug. 18, 2020, which claims priority to and the benefit of Korean Patent Application No. 10-2019-0168146, filed on Dec. 16, 2019, in the Korean Intellectual Property Office, the entire content of both of which is incorporated herein by reference.

BACKGROUND

1. Field

One or more aspects of embodiments of the present disclosure relate to an organic light-emitting device and an apparatus including the same.

2. Description of Related Art

Organic light-emitting devices are self-emission devices that produce full-color images, and also have wide viewing angles, high contrast ratios, short response times, and excellent characteristics in terms of brightness, driving voltage, and/or response speed, compared to devices in the art.

The organic light-emitting device may include a first electrode on a substrate, and a hole transport region, an emission layer, an electron transport region, and a second electrode, which are sequentially arranged on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state, thereby generating light.

SUMMARY

One or more aspects of embodiments of the present disclosure are directed toward an organic light-emitting device and an apparatus including the same.

Additional aspects will be set forth in part in the description which follows and, in part, will be apparent from the description, or may be learned by practice of the presented embodiments of the disclosure.

An embodiment of the present disclosure provides an organic light-emitting device including:
a first electrode,
a second electrode facing the first electrode,
an emission layer between the first electrode and the second electrode,
a mixed layer between the first electrode and the emission layer, and
a buffer layer between the emission layer and the second electrode,
wherein the mixed layer includes a first compound and a second compound,
the first compound and the second compound are different from each other,
the emission layer includes a host and a dopant,
the host includes the second compound, and
the organic light-emitting device satisfies one of Equation 1 or Equation 2, and Equation 3:

$$T1(D) \geq T1(Mix) + 0.3 \text{ eV} \quad \text{Equation 1}$$

$$T1(H) \geq T1(Mix) + 0.3 \text{ eV} \quad \text{Equation 2}$$

$$T1(Mix) < T1(Buffer) + 0.5 \text{ eV} \quad \text{Equation 3}$$

In Equation 1 to Equation 3,
T1(D) is a triplet energy level (eV) of the dopant,
T1(H) is i) a triplet energy level (eV) of the second compound, if the host is (e.g., consists of) the second compound, or ii) a highest triplet energy level (eV) among triplet energy levels (eV) of one or more additional compounds in the host, if the host further comprises the one or more additional compounds, other than the second compound,
T1(Mix) is a highest triplet energy level (eV) among triplet energy levels (eV) of one or more compounds in the mixed layer,
T1(Buffer) is i) a triplet energy level (eV) of a compound in the buffer layer, if the buffer layer consists of the compound, or ii) a highest triplet energy level (eV) among triplet energy levels (eV) of a plurality of compounds in the buffer layer, if the buffer layer comprises at least two compounds which are different from each other, and
T1(D), T1(H), T1 (Mix), and T1 (Buffer) are each evaluated using a density functional method (DFT).

Another embodiment of the present disclosure provides an apparatus including the organic light-emitting device.

BRIEF DESCRIPTION OF THE DRAWING

The above and other aspects, features, and advantages of certain embodiments of the disclosure will be more apparent from the following description taken in conjunction with the drawing, which is a schematic view of an organic light-emitting device according to an embodiment.

DETAILED DESCRIPTION

Reference will now be made in more detail to embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the drawing, to explain aspects of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Expressions such as "at least one selected from," "one of," and "selected from," when preceding a list of elements, modify the entire list of elements and do not modify the individual elements of the list. Further, the use of "may" when describing embodiments of the present disclosure refers to "one or more embodiments of the present disclosure."

The term "organic layer" used herein refers to a single layer and/or a plurality of layers between the first electrode and the second electrode of the organic light-emitting device. A material included in "the organic layer" is not limited to an organic material.

The expression "(an organic layer) includes a compound represented by Formula 1" as used herein may include a case in which "(an organic layer) includes one compound of Formula 1 or two or more different compounds of Formula 1."

Hereinafter, the organic light-emitting device will be described with reference to drawing illustrating an embodiment of the organic light-emitting device.

An organic light-emitting device 10 of the drawing may include: a first electrode 110; a second electrode 190 facing the first electrode 110; an emission layer 155 between the first electrode 110 and the second electrode 190; a mixed layer 154 between the first electrode 110 and the emission layer 155; and a buffer layer 156 between the emission layer 155 and the second electrode 190.

The first electrode 110 and the second electrode 190 each are the same as described herein.

The mixed layer 154 includes a first compound and a second compound, and the first compound and the second compound may be different from each other. The first compound and the second compound are the same as described in the present specification.

The emission layer 155 may include a host and a dopant, and the host may include the second compound (e.g., the host may be formed of the same second compound as in the mixed layer 154). The host and the dopant are the same as described in the present specification.

The organic light-emitting device 10 may satisfy one of Equation 1 or Equation 2, and Equation 3:

$$T1(D) \geq T1(\text{Mix}) + 0.3 \text{ eV} \quad \text{Equation 1}$$

$$T1(H) \geq T1(\text{Mix}) + 0.3 \text{ eV} \quad \text{Equation 2}$$

$$T1(\text{Mix}) < T1(\text{Buffer}) + 0.5 \text{ eV} \quad \text{Equation 3}$$

In Equation 1 to Equation 3,

T1 (D) is the triplet energy level (eV) of the dopant in the emission layer 155, T1 (H) is i) a triplet energy level (eV) of the second compound, if the host in the emission layer 155 is the second compound, or ii) a highest triplet energy level (eV) among triplet energy levels (eV) of compounds included in the host in the emission layer 155, if the host in the emission layer 155 further comprises one or more additional compounds, other than the second compound, T1 (Mix) is a highest triplet energy level (eV) among triplet energy levels (eV) of compounds included in the mixed layer 154, T1 (Buffer) is i) a triplet energy level (eV) of a compound included in the buffer layer 156, if the buffer layer 156 consists of the compound, or ii) a highest triplet energy level (eV) among triplet energy levels (eV) of compounds included in the buffer layer 156, if the buffer layer 156 comprises at least two compounds which are different from each other, and T1(D), T1(H), T1 (Mix), and T1 (Buffer) may each be evaluated using a density functional method (DFT).

For example, T1(D), T1(H), T1 (Mix), and T1 (Buffer) may be evaluated by using a density functional theory (DFT) of Gaussian program structurally optimized at a level of B3LYP/6-31 G* (d,p).

In one embodiment, the organic light-emitting device 10 may satisfy Equation 1 and Equation 3 at the same time.

Because the organic light-emitting device 10 simultaneously (at the same time) satisfies one of Equation 1 or Equation 2, and Equation 3, as described above (for example, simultaneously satisfies Equation 1 and Equation 3), excitons, which may be present in excess at the interface between the mixed layer 154 and the emission layer 155, may move to the mixed layer 154 having a triplet energy level relatively lower than those of the host and the dopant of the emission layer 155, thus resulting in a decrease in the concentration of excitons in the emission layer 155.

In addition, because the organic light-emitting device 10 simultaneously satisfies one of Equation 1 or Equation 2, and Equation 3, as described above (for example, simultaneously satisfies Equation 1 and Equation 3), the injection of electrons from the buffer layer 156 to the emission layer 155 may be effectively (or suitably) controlled, and thus, the holes and the electrons in the emission layer 155, which may trap holes, may make the balance (e.g., may be suitably balanced).

As a result, deterioration of the emission layer 155 and/or the like during operation of the organic light-emitting device 10 may be substantially prevented or reduced, and thus, the light-emission efficiency and/or lifespan of the organic light-emitting device 10 may be improved.

For example,

T1(D) may be from about 2.0 eV to about 5.0 eV (for example, about 2.0 eV to about 3.0 eV), and/or T1(H) may be from about 1.3 eV to about 4.0 eV (for example, about 1.5 eV to about 2.0 eV), and/or T1 (Mix) may be from about 1.5 eV to about 3.0 eV (for example, from about 1.5 eV to about 2.5 eV), and/or T1 (Buffer) may be from about 1.0 eV to about 2.5 eV (for example, from about 1.5 eV to about 2.5 eV).

The first compound may be a monoamine compound.

For example, the first compound may be a monoamine compound containing an indoloquinoline group or an indoloisoquinoline group.

The second compound may include three or more $C_1$-$C_{60}$ cyclic groups, where the three or more $C_1$-$C_{60}$ cyclic groups may be identical to or different from each other, and the three or more $C_1$-$C_{60}$ cyclic groups may be linked to each other via a single bond.

For example, the second compound may include three or more π-electron-rich $C_5$-$C_{60}$ cyclic groups, where the three or more π-electron-rich $C_5$-$C_{60}$ cyclic groups may be identical to or different from each other, and the three or more r-electron-rich $C_5$-$C_{60}$ cyclic groups may be linked to each other via a single bond.

In one embodiment, the second compound may include at least one anthracene group.

In one or more embodiments, the first compound may be a compound represented by Formula 1, and/or the second compound may be a compound represented by Formula 2:

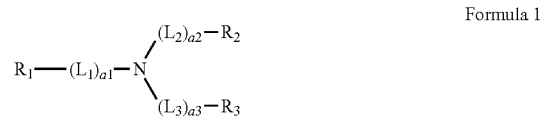

Formula 1

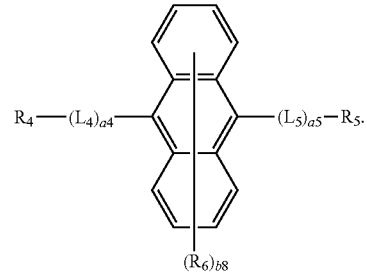

Formula 2

In Formula 1 and Formula 2, $L_1$ to $L_5$ may each independently be a single bond, a $C_5$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, a1 to a5 may each independently be an integer from 1 to 10, $R_3$ may be an indoloquinoline group that is unsubstituted or substituted with at least one $R_{10a}$, or an indoloisoquinoline group that is unsubstituted or substituted with at least one $R_{10a}$, $R_1$, $R_2$, $R_4$, and $R_5$ may each independently be a $C_5$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $R_{10a}$ and $R_6$ may each independently be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$ ($Q_1$), or —P(=O)($Q_1$)($Q_2$), and b8 may be an integer from 0 to 8.

In one embodiment, $L_1$ to $L_5$ in Formulae 1 and 2 may each independently be:

a single bond; or a π-electron-rich $C_5$-$C_{30}$ cyclic group or a pyridine group, each independently unsubstituted or substituted with deuterium, —F, a $C_1$-$C_{20}$ alkyl group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl(norbornanyl group), a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a phenoxy group, or any combination thereof.

a1 to a5 in Formulae 1 and 2 may indicate the numbers of $L_1$ to $L_5$, respectively, and may each independently be an integer from 1 to 10, for example, an integer from 1 to 5, or an integer of 1, 2, or 3. When a1 is 2 or more, two or more of $L_1$(s) may be identical to or different from each other, when a2 is 2 or more, two or more of $L_2$(s) may be identical to or different from each other, when a3 is 2 or more, two or more of $L_3$(s) may be identical to or different from each other, when a4 is 2 or more, two or more of $L_4$(s) may be identical to or different from each other, and when a5 is 2 or more, two or more of $L_5$(s) may be identical to or different from each other.

In one or more embodiments, $R_3$ in Formula 1 may be a group represented by one of Formulae 1A-1 to 1A-10, 1B-1 to 1B-10, and 1C-1 to 1C-10:

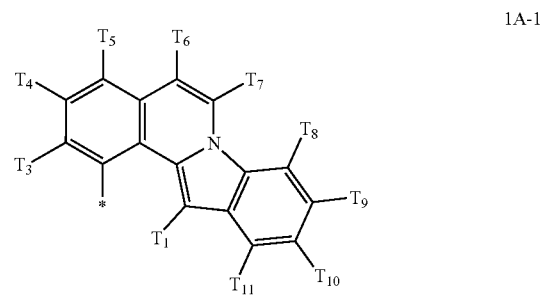

1A-1

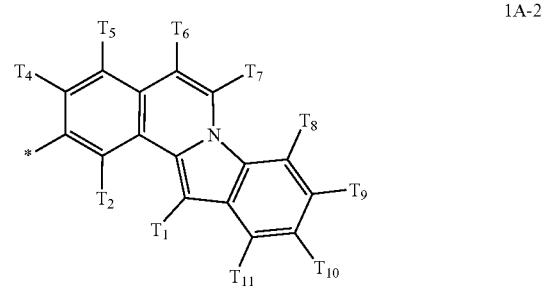

1A-2

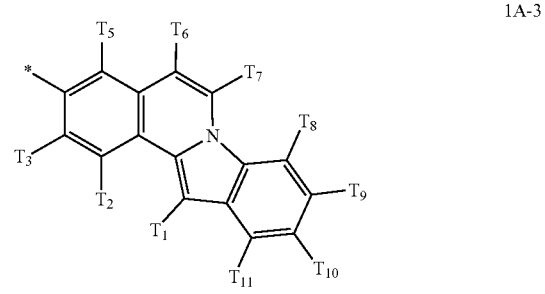

1A-3

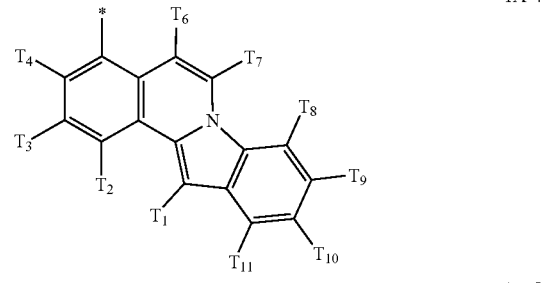

1A-4

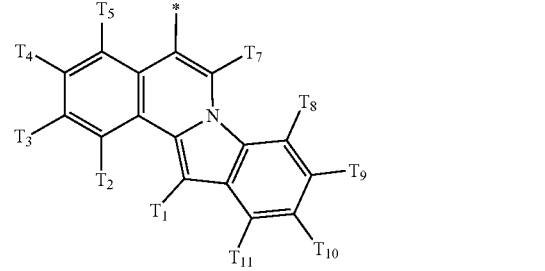

1A-5

1A-6
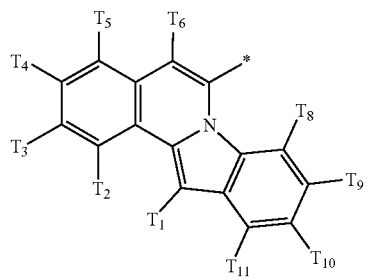
1A-7
1A-8
1A-9
1A-10
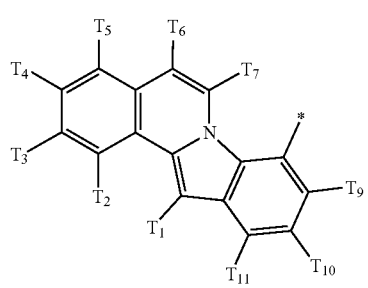
1B-1
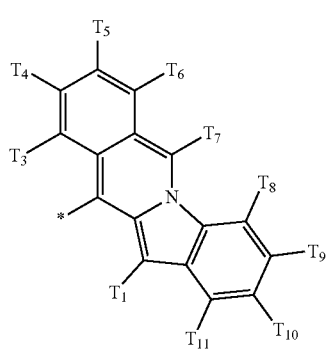
1B-2
1B-3
1B-4
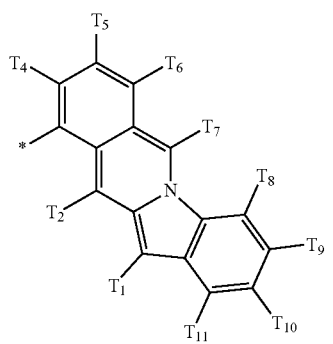
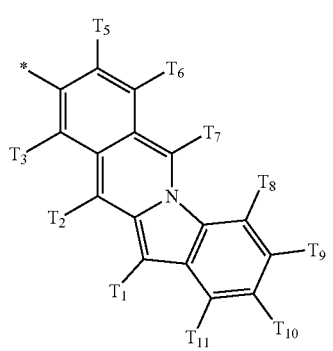
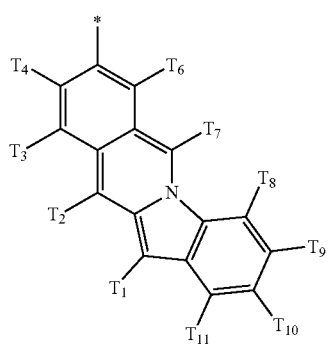

1B-5
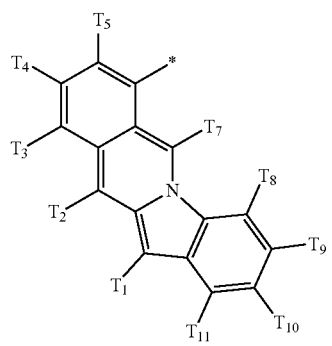
1B-6
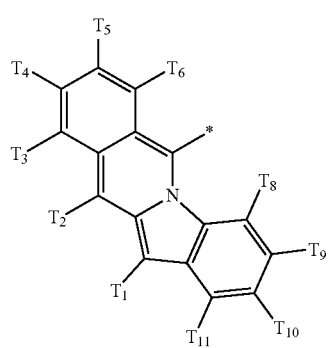
1B-7
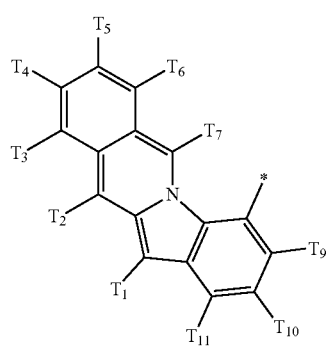
1B-8
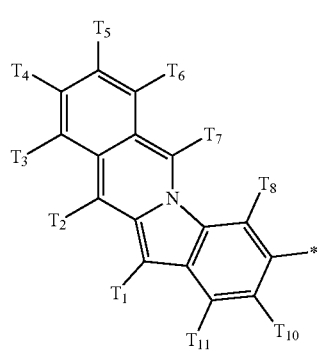
1B-9
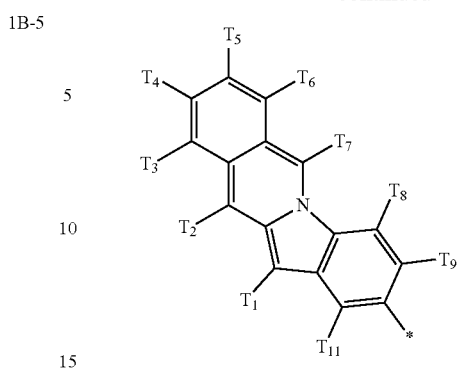
1B-10
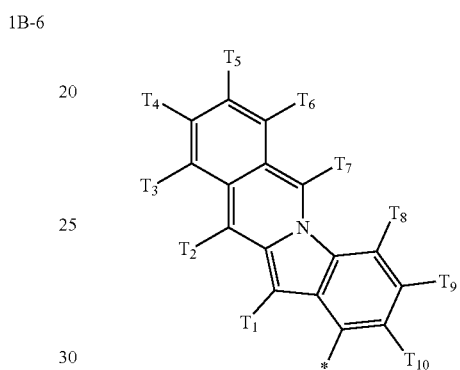
1C-1
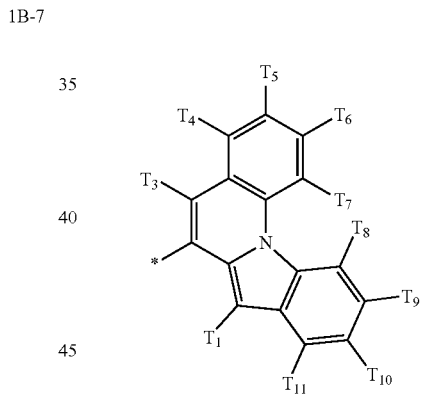
1C-2
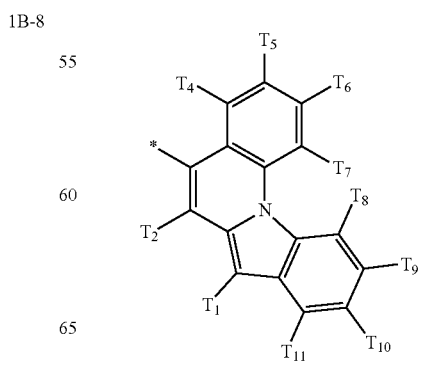

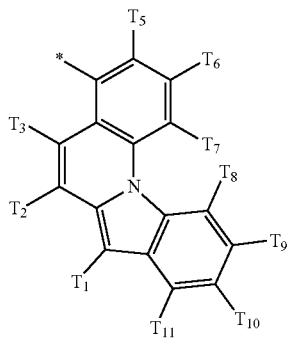
1C-3

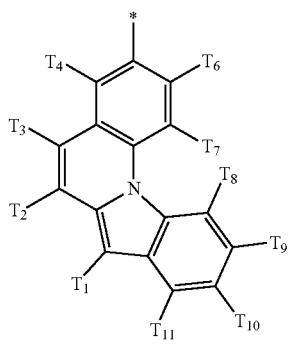
1C-4

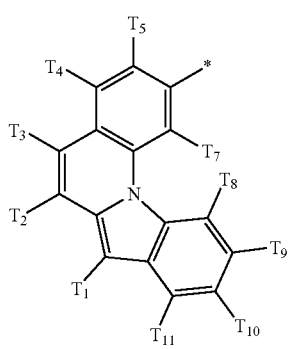
1C-5

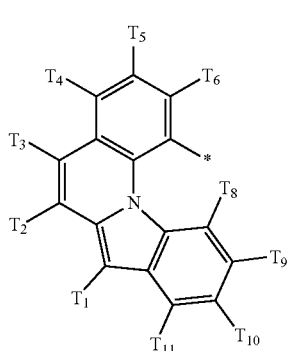
1C-6

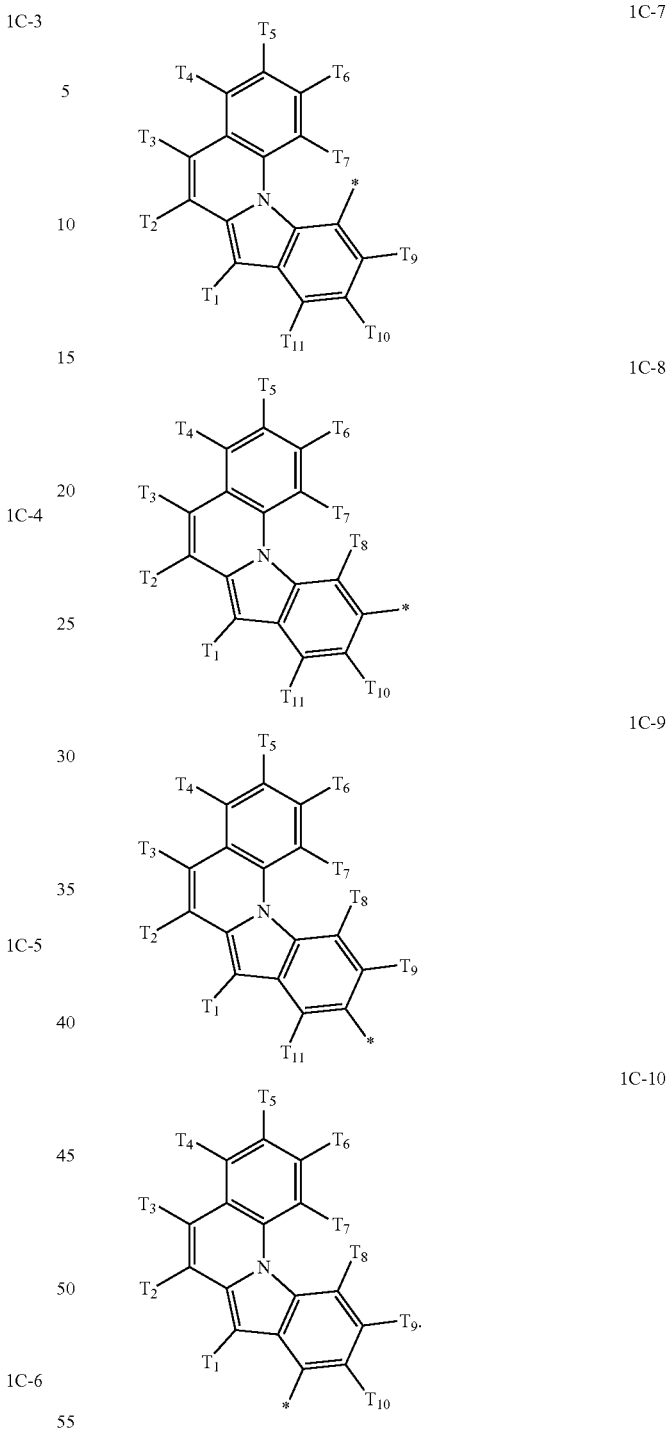

$T_1$ to $T_{11}$ in Formulae 1A-1 to 1A-10, 1B-1 to 1B-10 and 1C-1 to 1C-10 are the same as described in connection with $R_{10a}$, and * indicates a binding site to $L_3$ in Formula 1.

In one or more embodiments, $R_1$, $R_2$, $R_4$, and $R_5$ in Formulae 1 and 2 may each independently be a π-electron-rich $C_5$-$C_{30}$ cyclic group or a pyridine group, each independently unsubstituted or substituted with deuterium, —F, a $C_1$-$C_{20}$ alkyl group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]

pentyl group, a bicyclo[2.1.1]hexyl group, a bicyclo[2.2.1]heptyl(norbornanyl) group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a phenoxy group, or any combination thereof.

In one or more embodiments, $R_{10a}$ and $R_6$ in Formulae 1 and 2 may each independently be:

hydrogen, deuterium, or —F;

a $C_1$-$C_{20}$ alkyl group that is unsubstituted or substituted with deuterium, —F, or any combination thereof; or a π-electron-rich $C_5$-$C_{30}$ cyclic group or a pyridine group, each independently unsubstituted or substituted with deuterium, —F, a $C_1$-$C_{20}$ alkyl group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl(norbornanyl) group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a phenoxy group, or any combination thereof.

b8 in Formula 2 indicates the number of $R_6$(s), and may be an integer from 0 to 8. When b8 is 2 or more, two or more $R_6$(s) may be identical to or different from each other.

In one or more embodiments, the first compound may not include a carbazole group.

In one or more embodiments, the first compound may further include at least one of a dibenzofuran group or a dibenzothiophene group.

In one or more embodiments, the first compound may include at least one selected from Compounds A1 to A80:

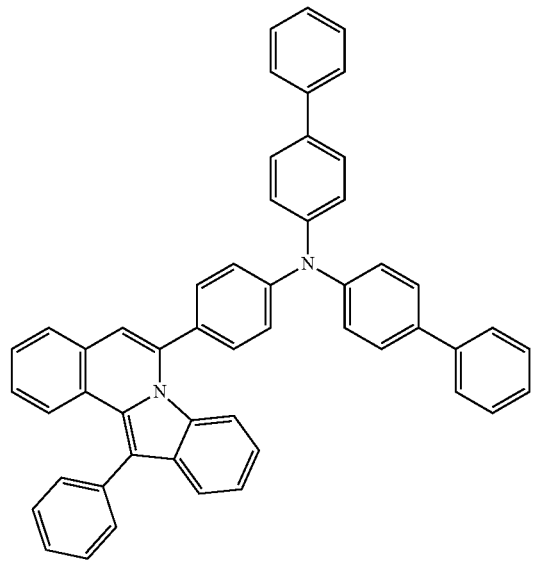

A1

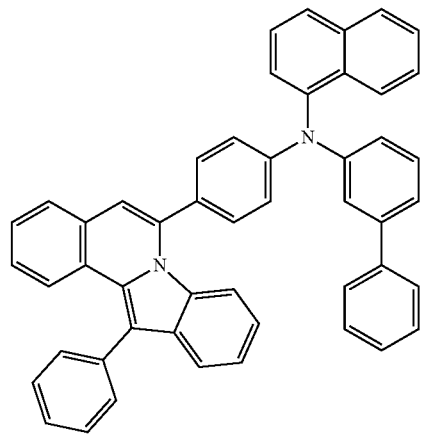

A2

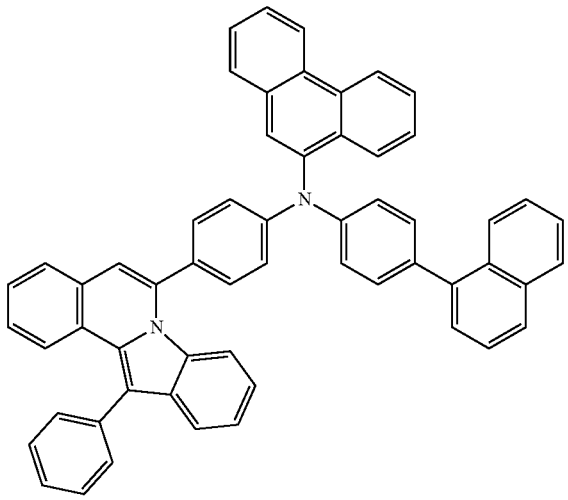

A3

A4
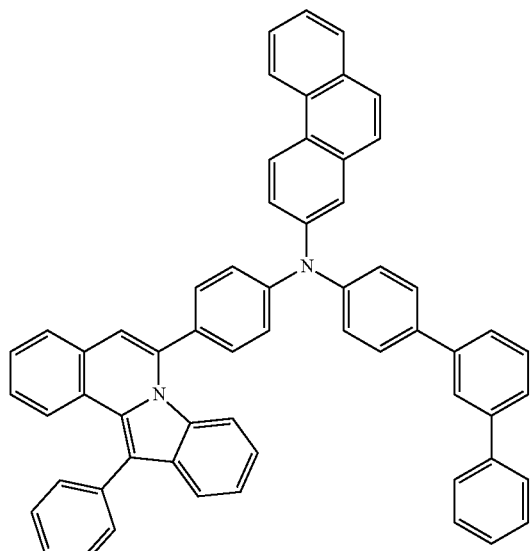
A5
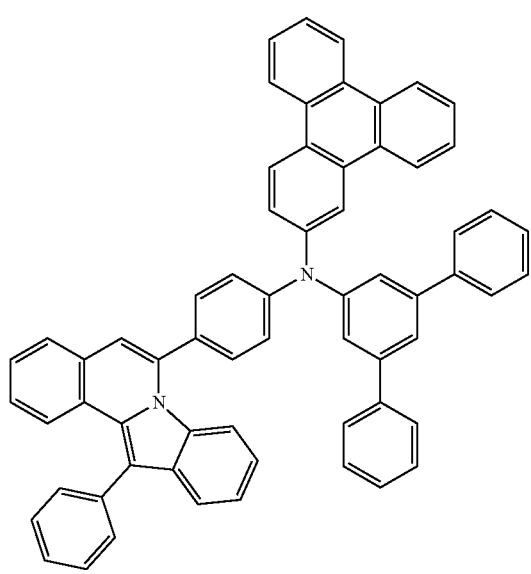
A6
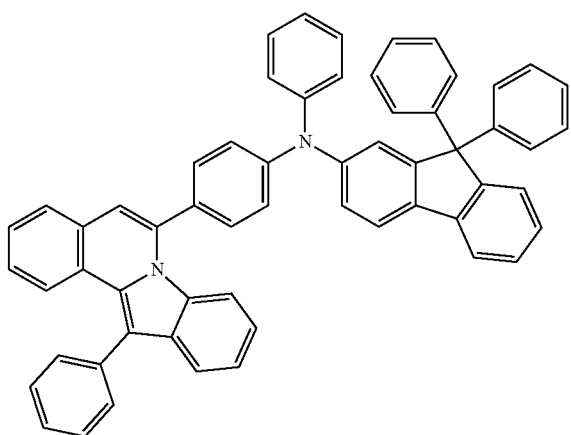
A7
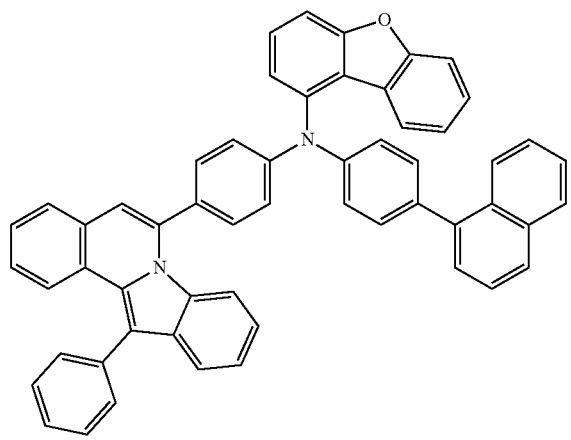
A8
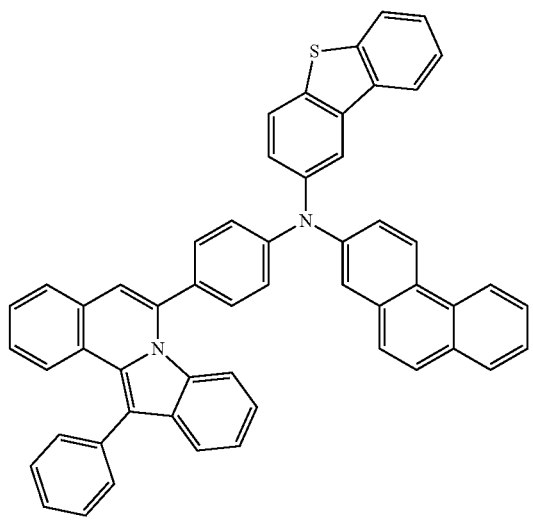
A9
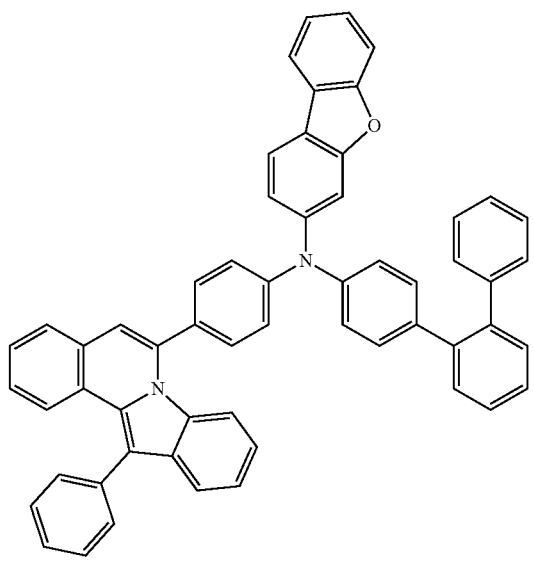

A10
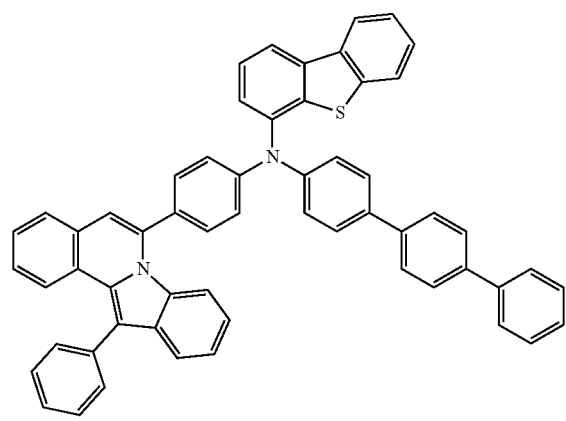
A11
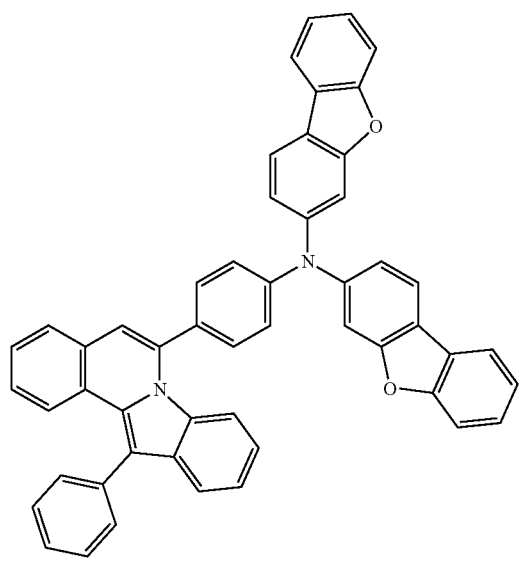
A12
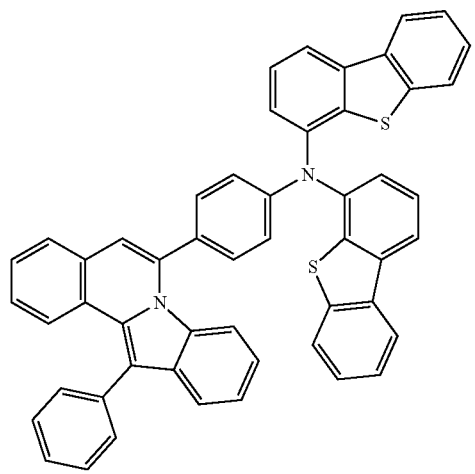
A13
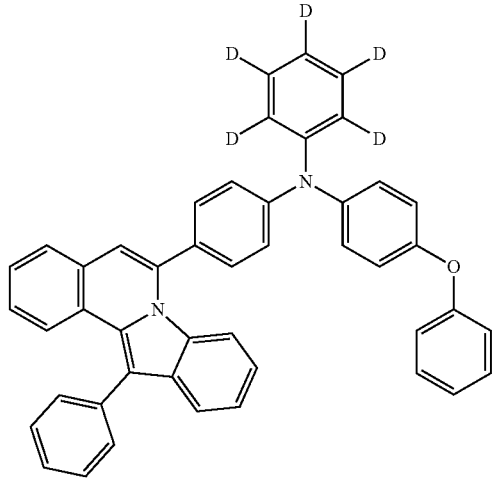
A14
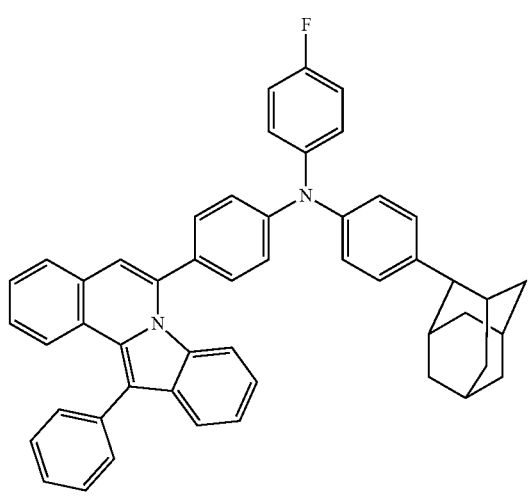
A15
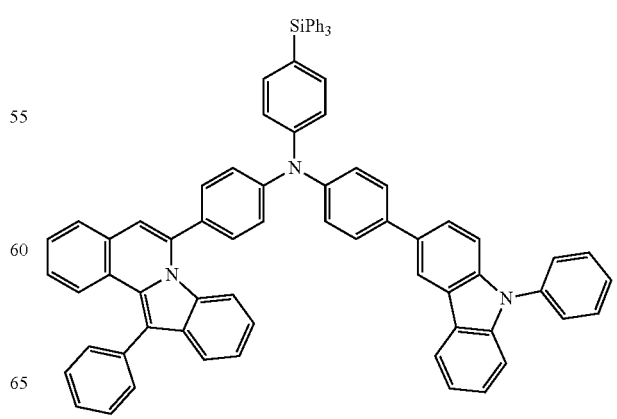

A16
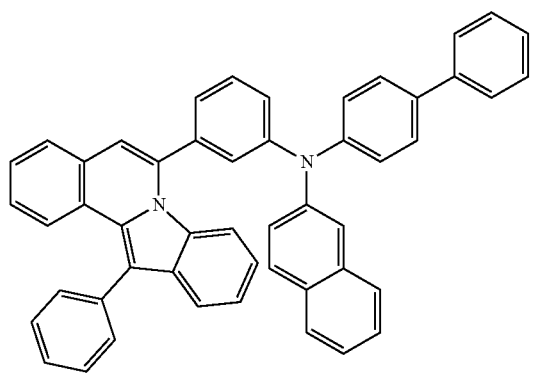
A19
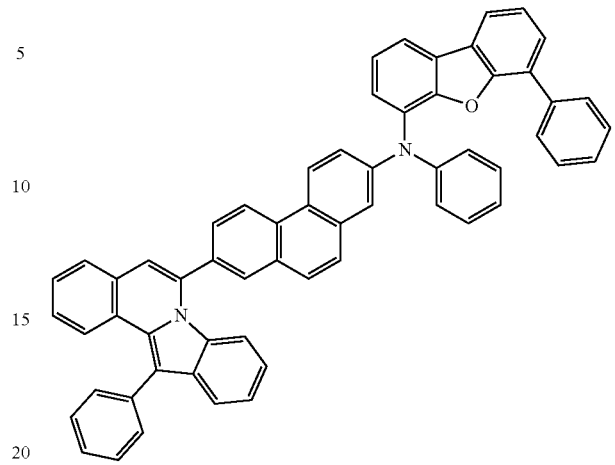
A17
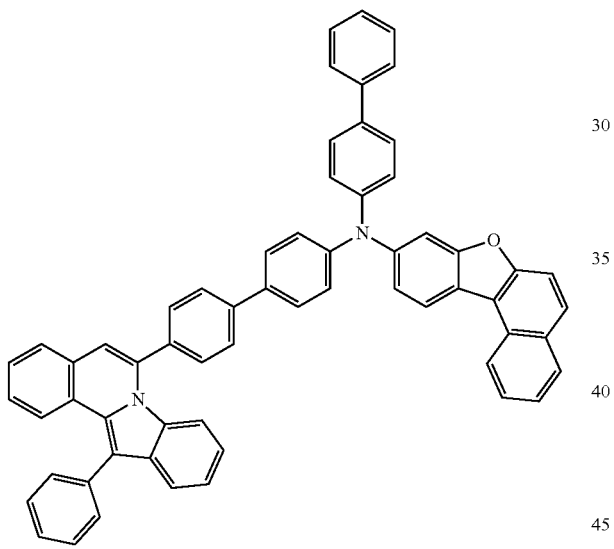
A20
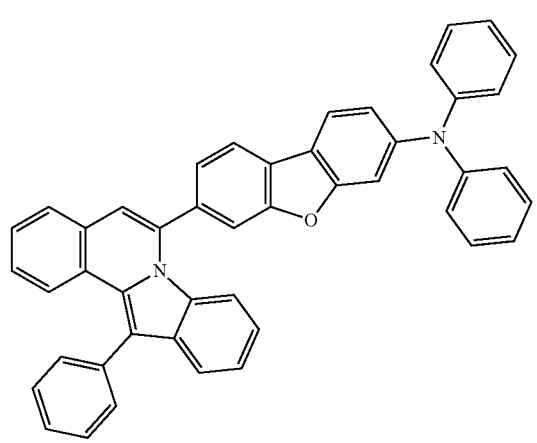
A18
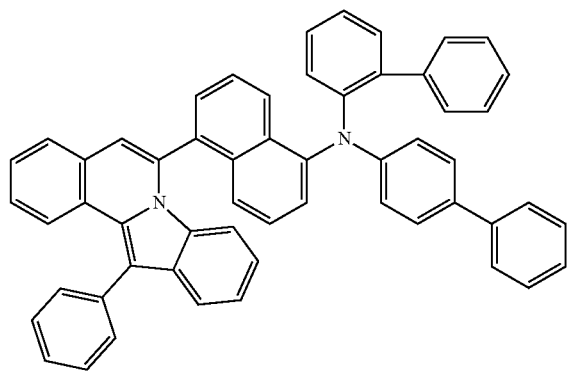
A21
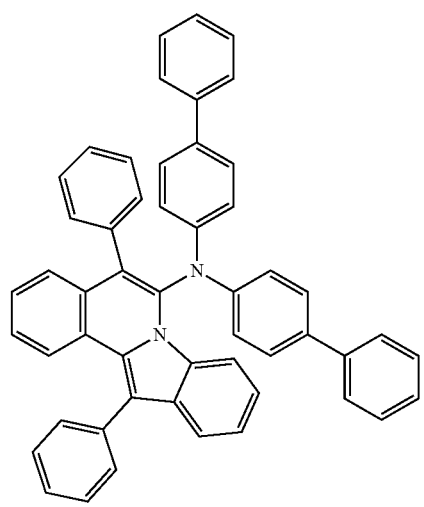

A22
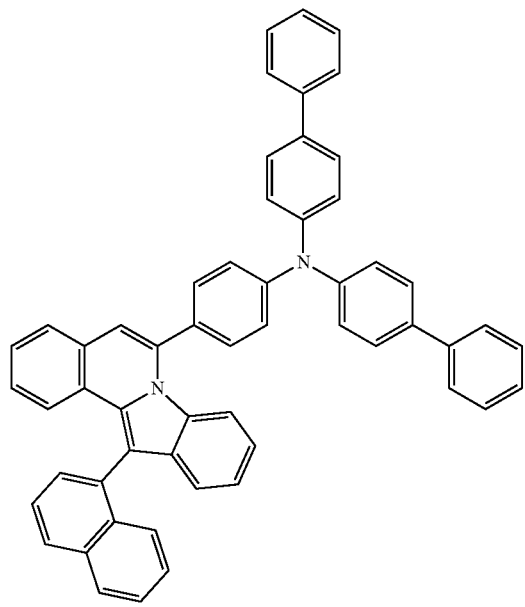
A23
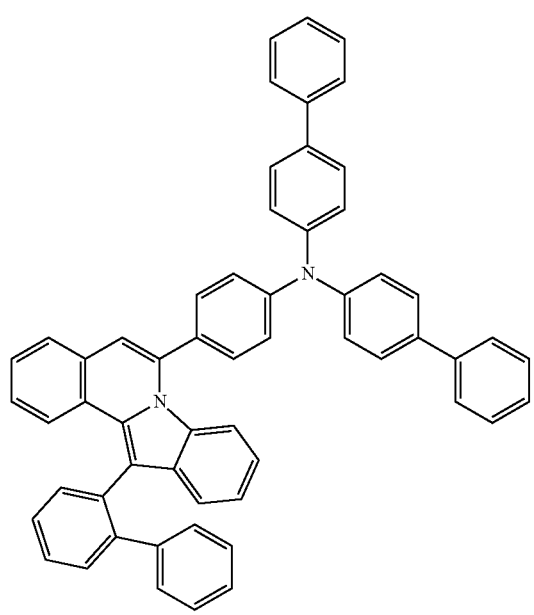
A24
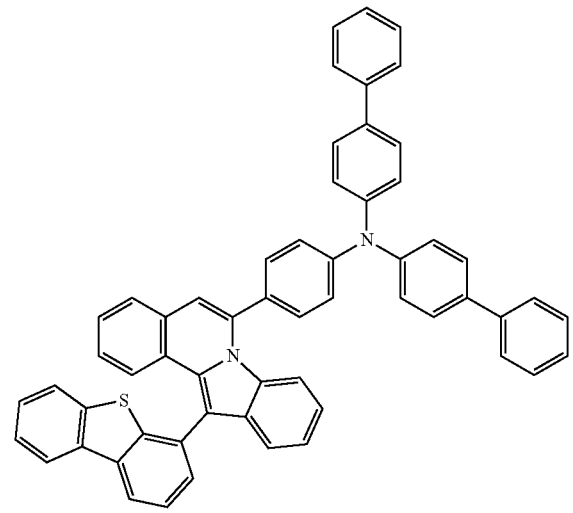
A25
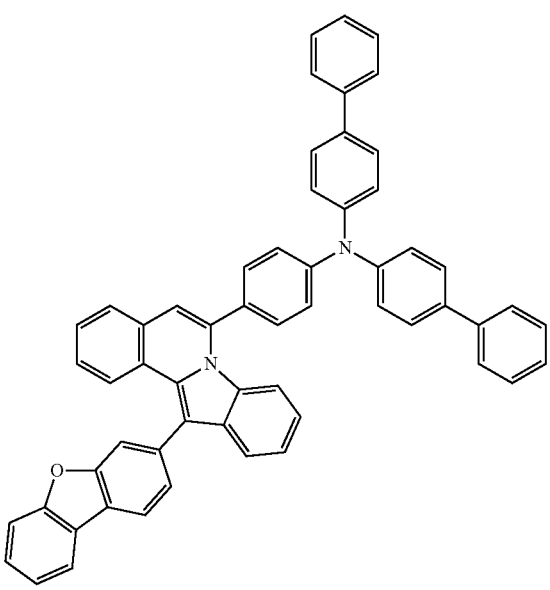
A26
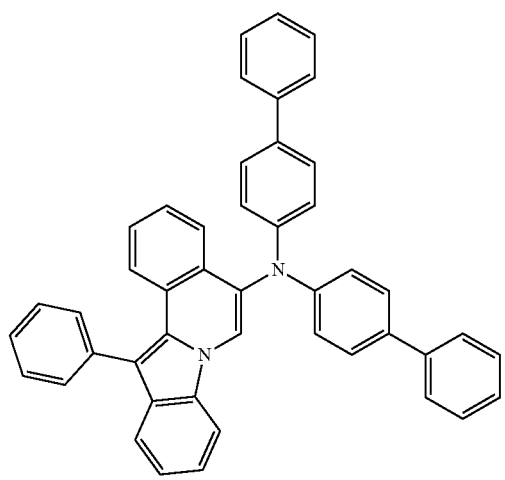

-continued
A27
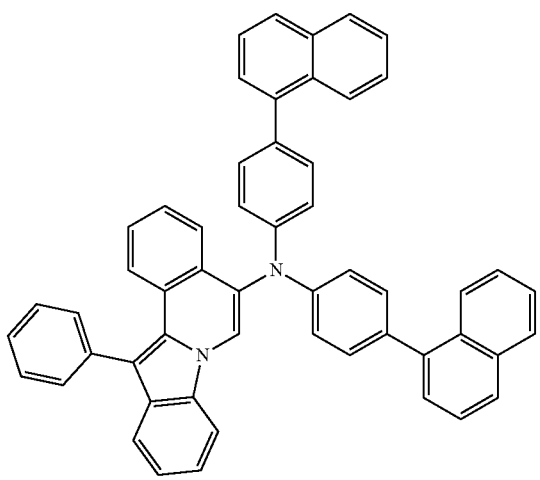
A28
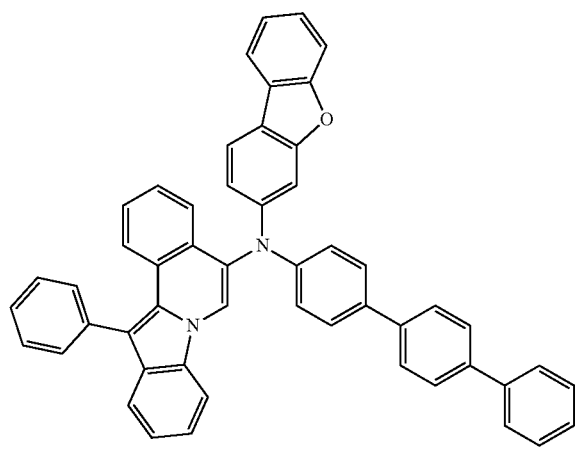
A29
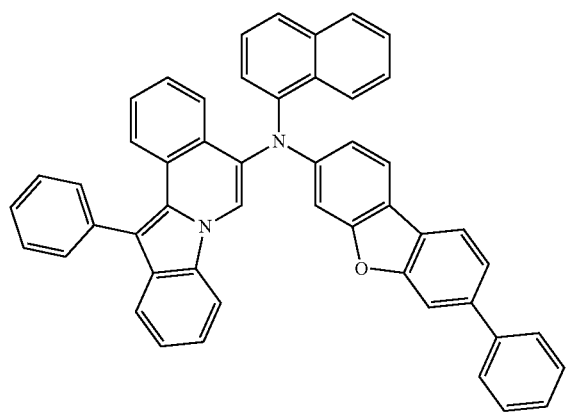
A30
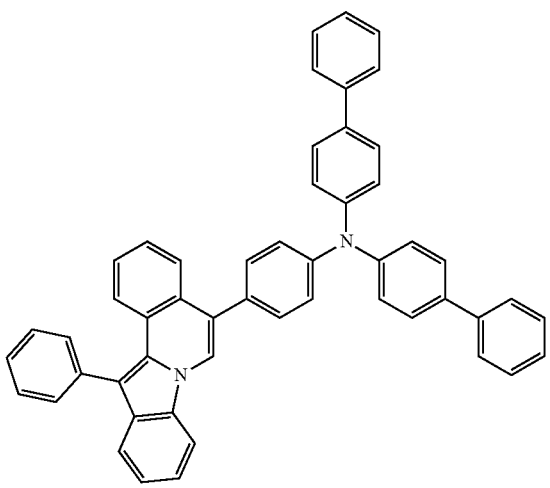
A31
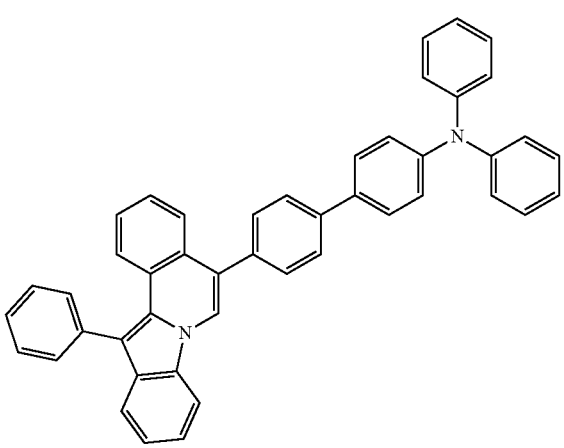
A32

A33
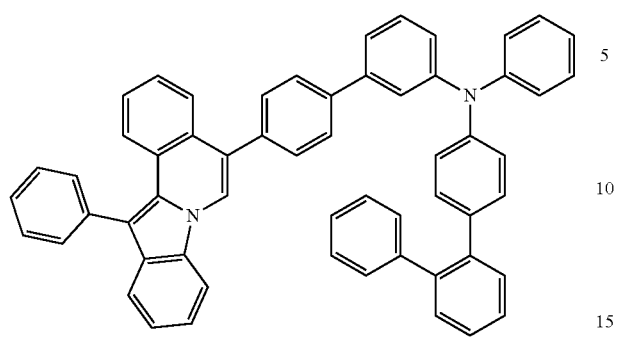
A34
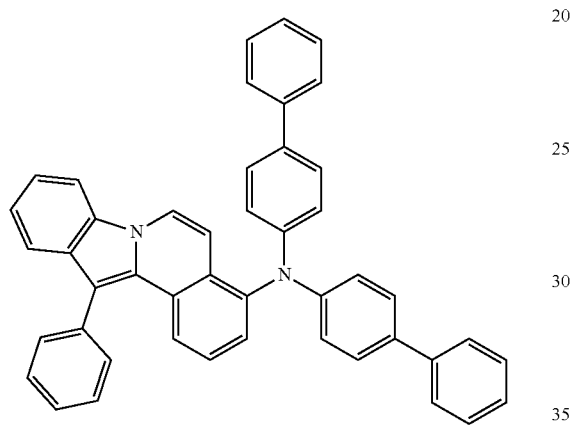
A35
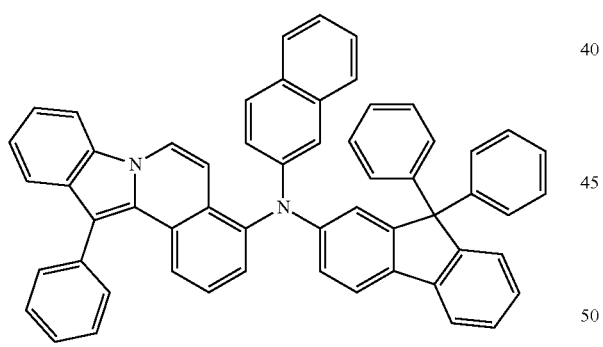
A36
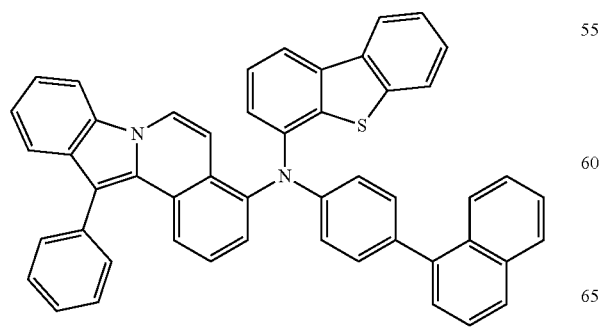
A37
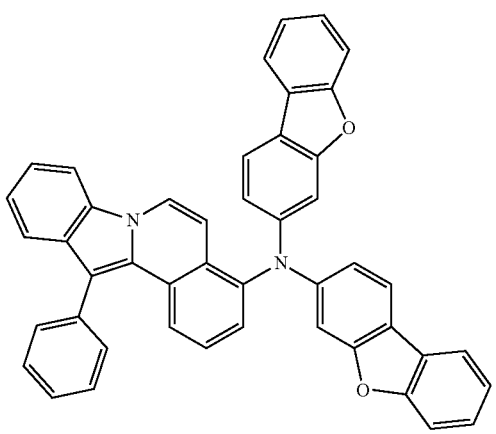
A38
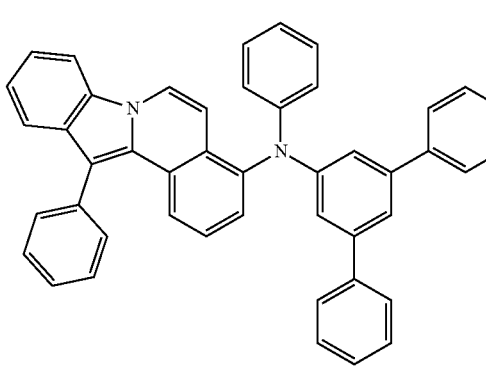
A39
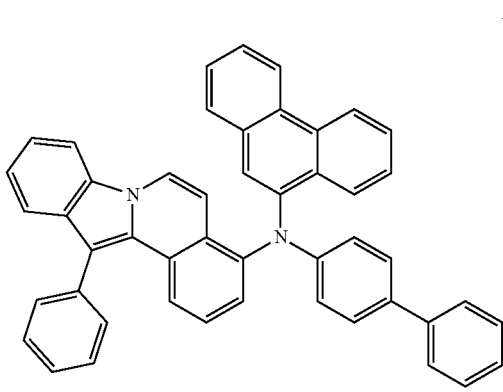
A40
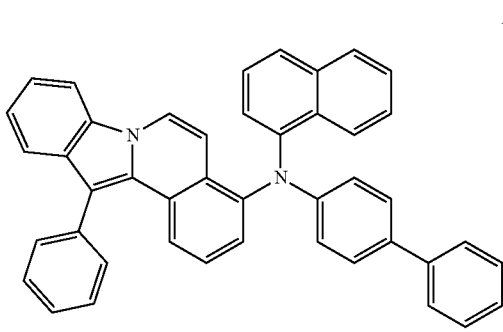

A41
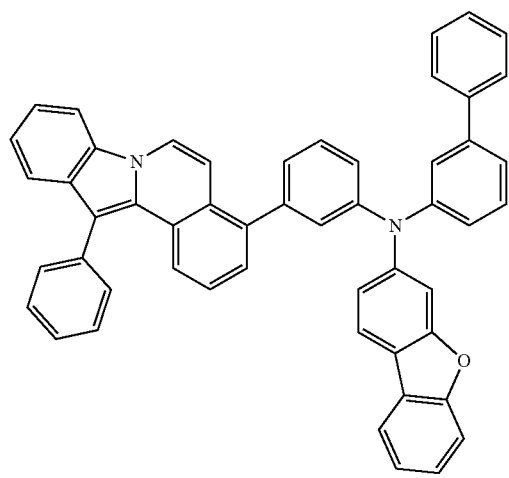
A44
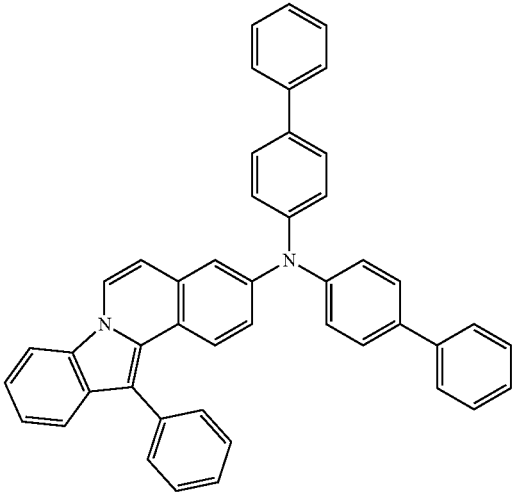
A42
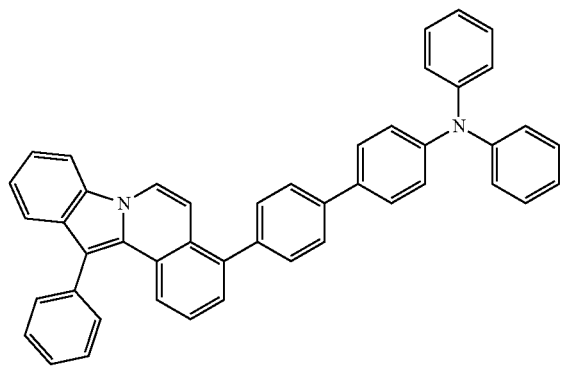
A45
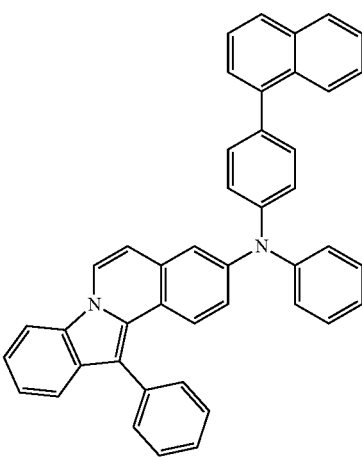
A43
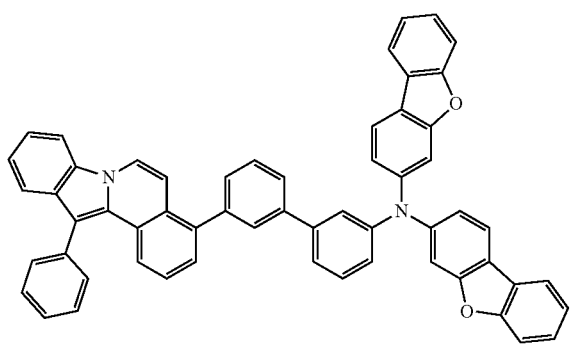
A46
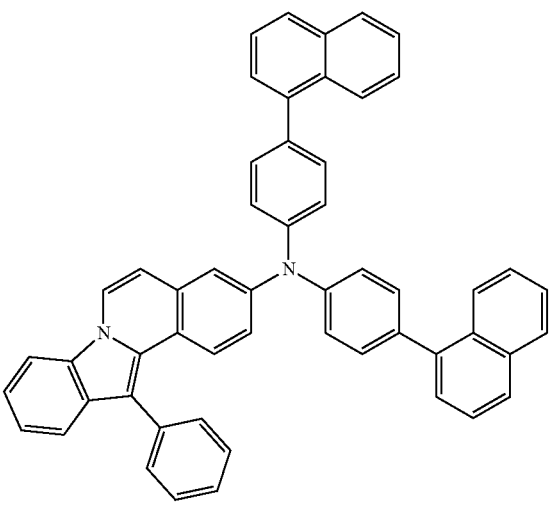

A47
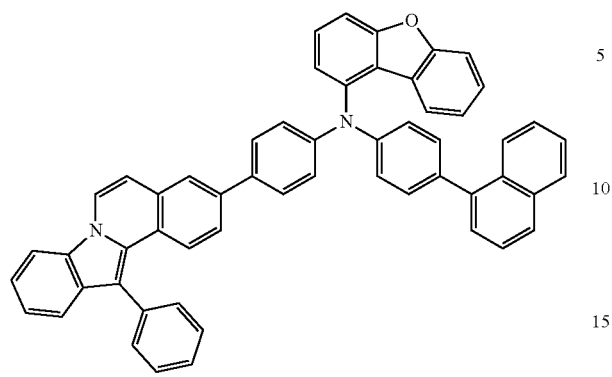
A48
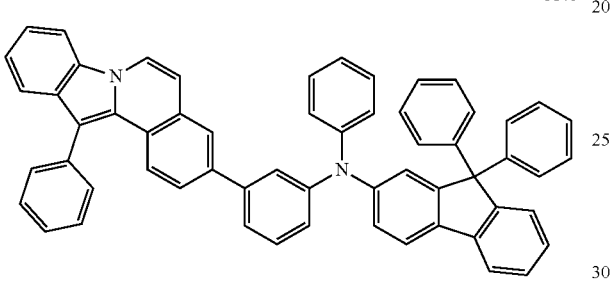
A49
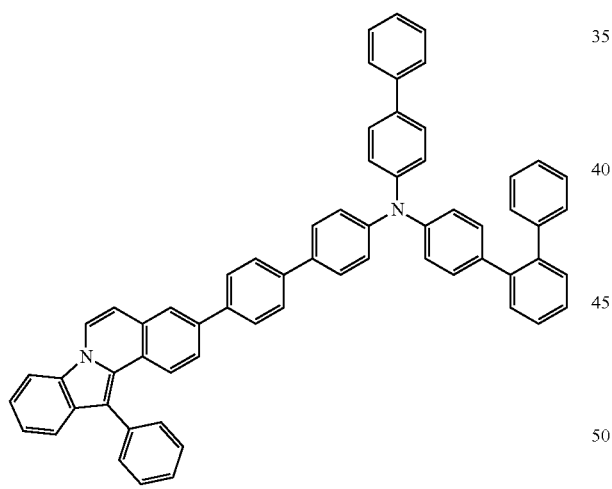
A50
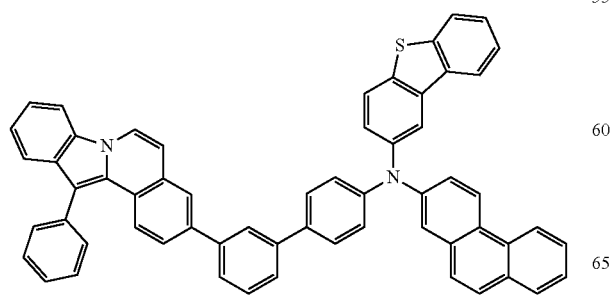
A51
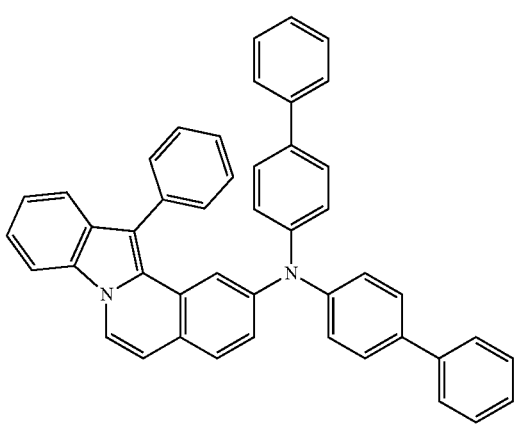
A52
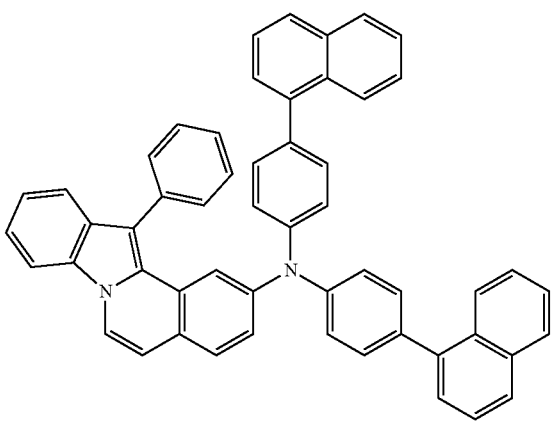
A53
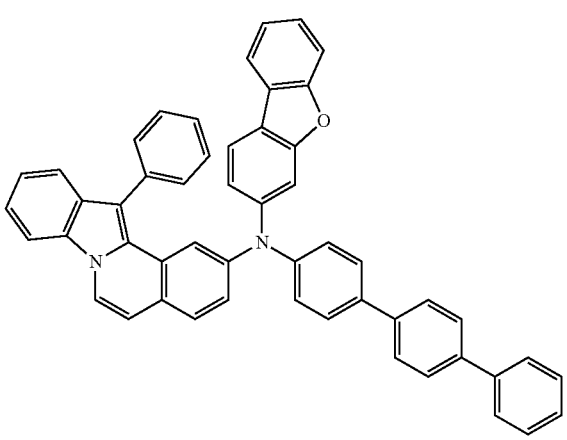

A54
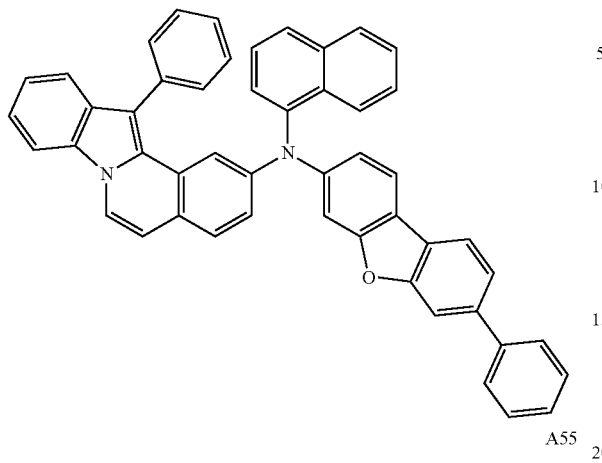
A55
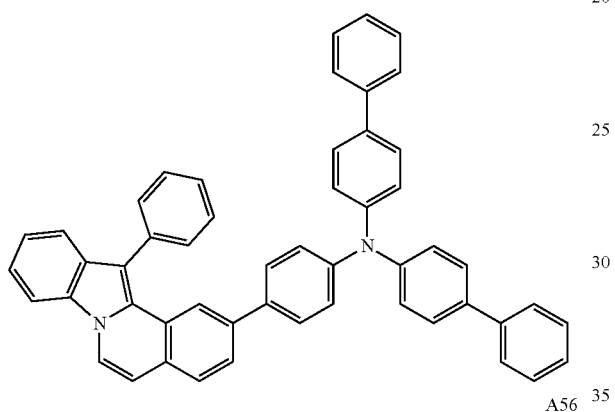
A56
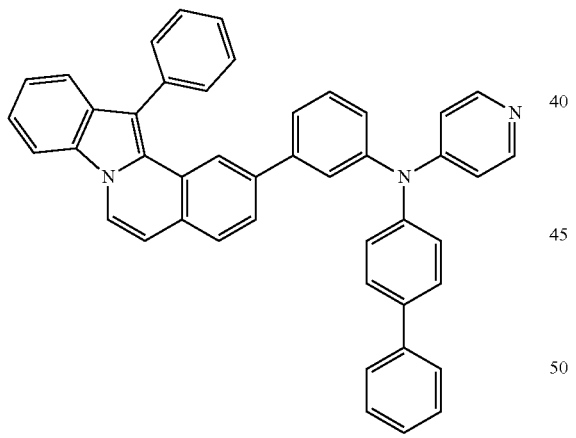
A57
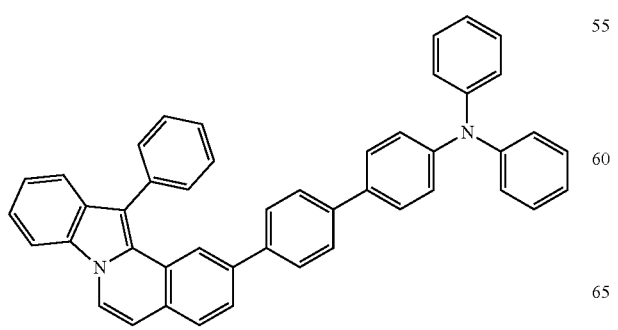
A58
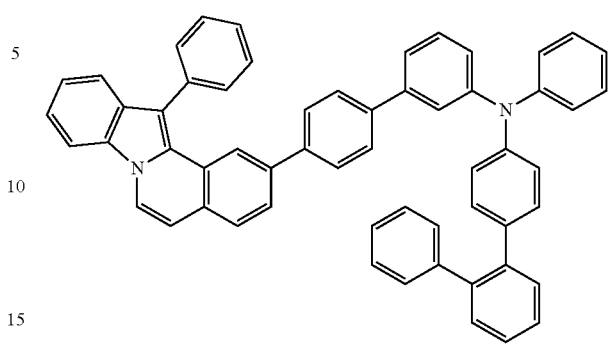
A59
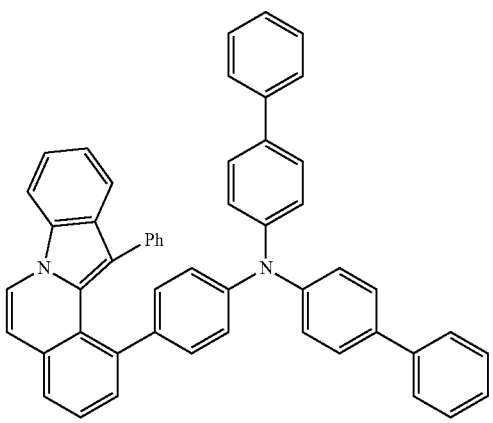
A60
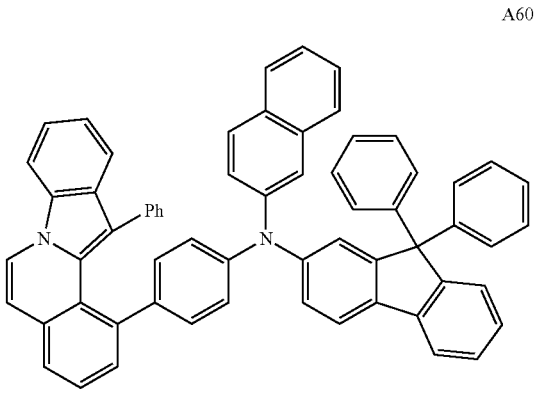
A61
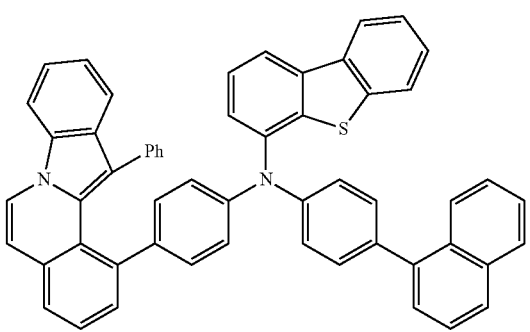

A62
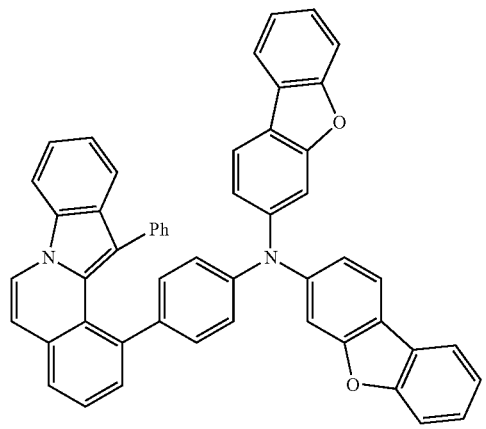
A63
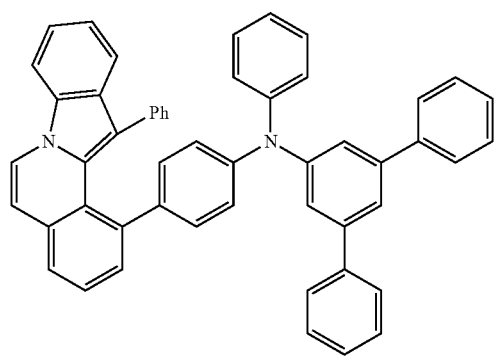
A64
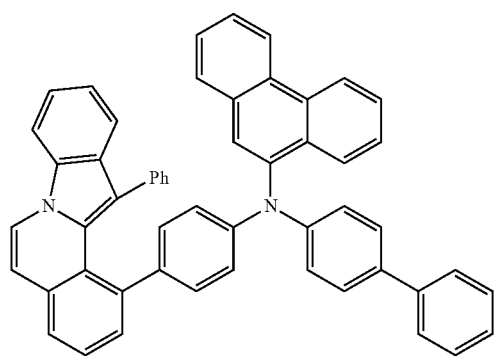
A65
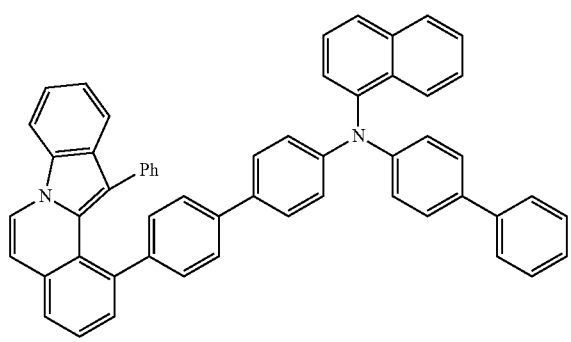
A66
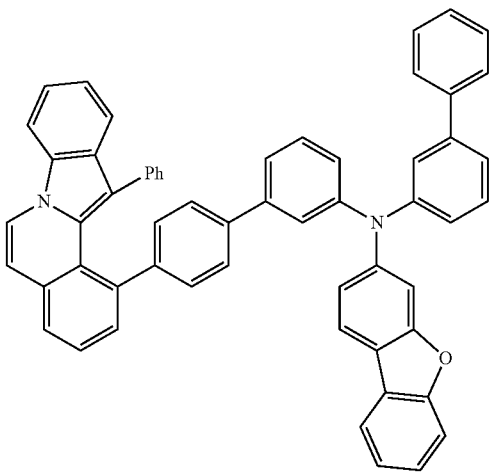
A67
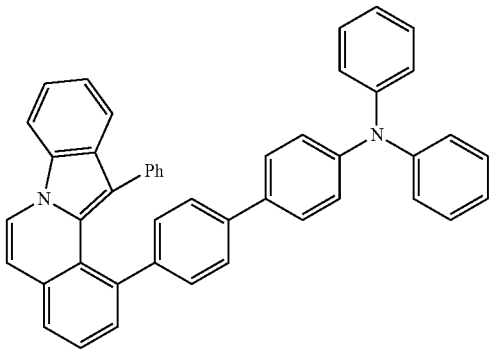
A68
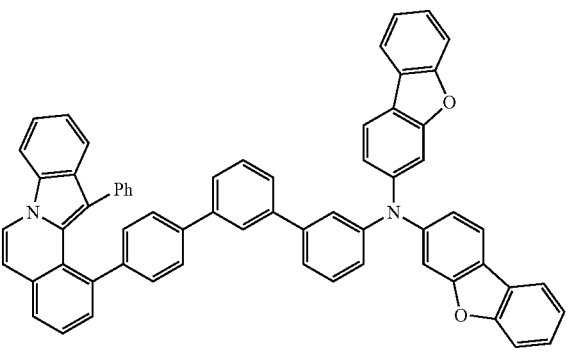

35
-continued
A69
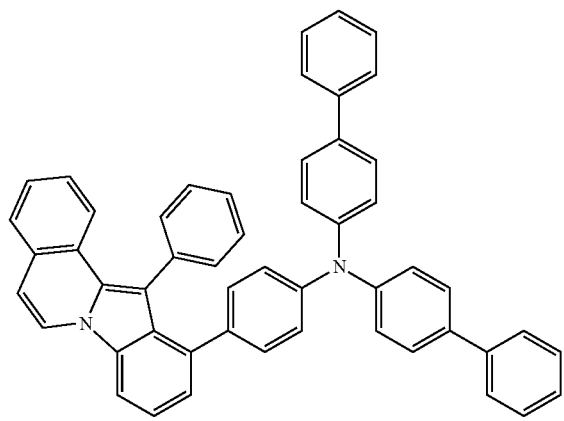
A70
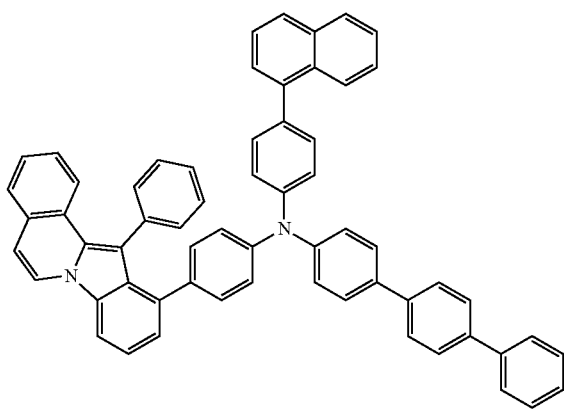
A71
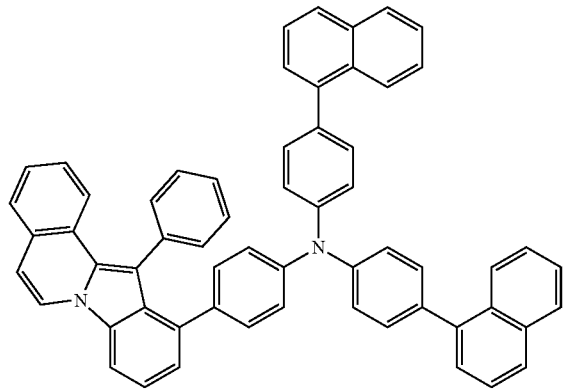
A72
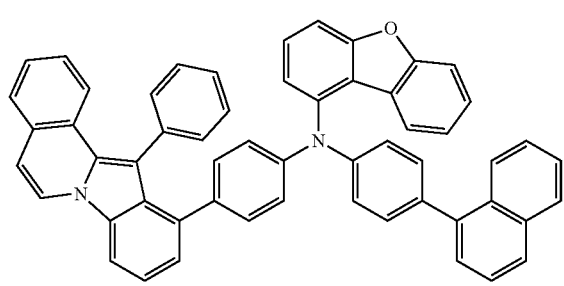
36
-continued
A73
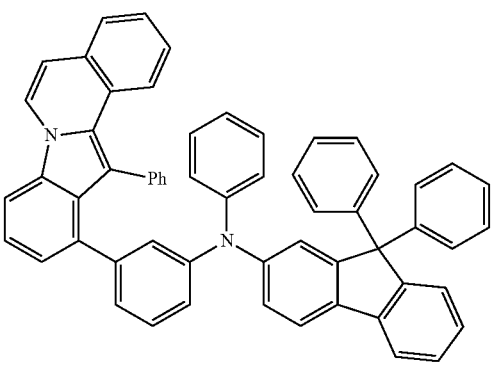
A74
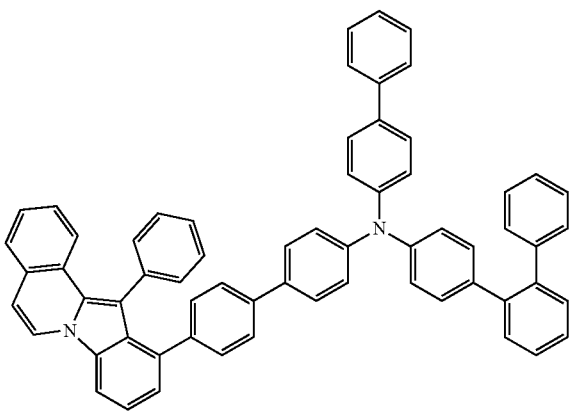
A75

A76
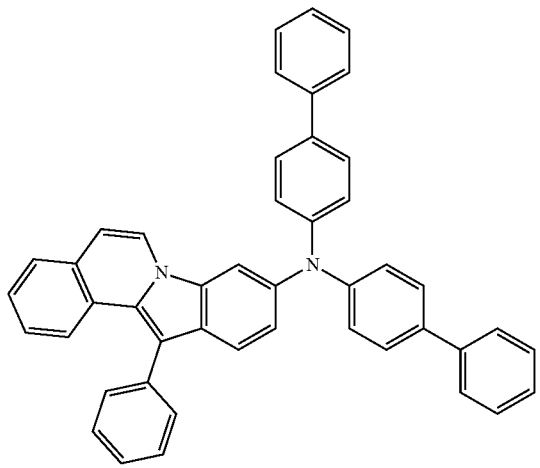
A77
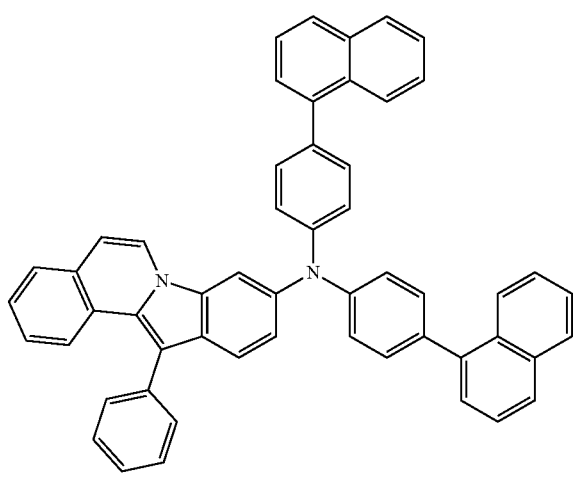
A78
A79
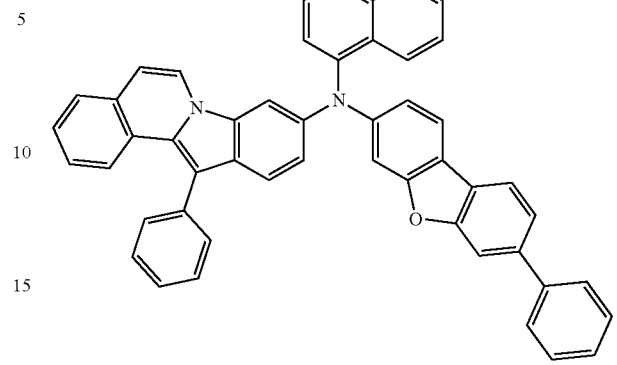
A80
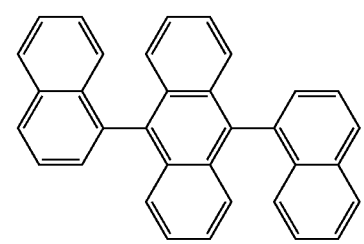
"Ph" in Compounds A1 to A80 indicates a phenyl group.
In one or more embodiments, the second compound may include at least one of Compounds H1 to H26.
H1
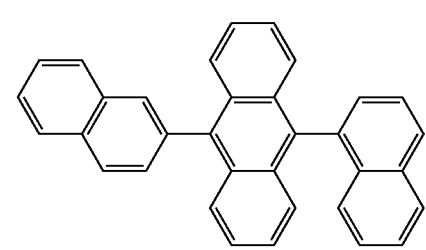
H2

H3
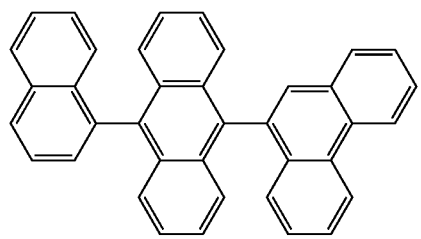
H4
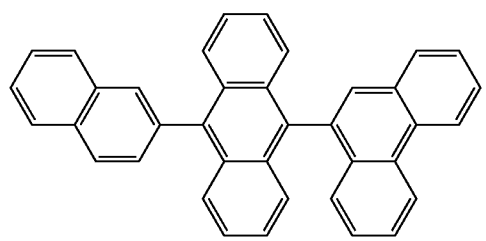
H5
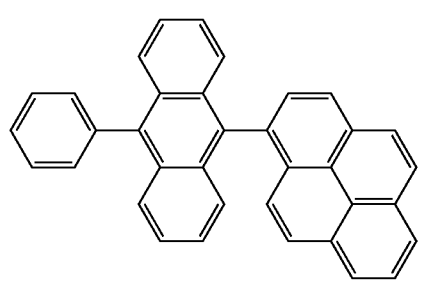
H6
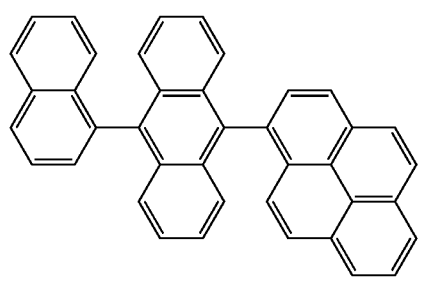
H7
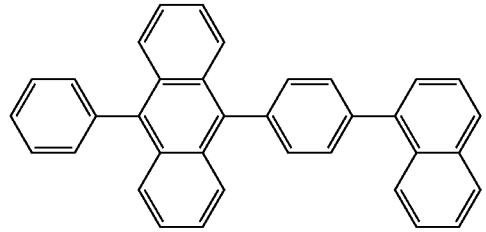
H8
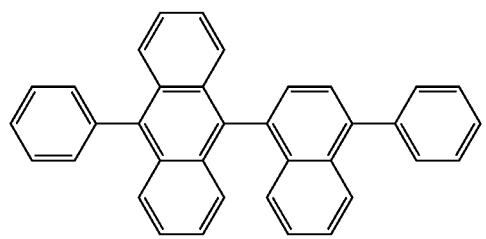
H9
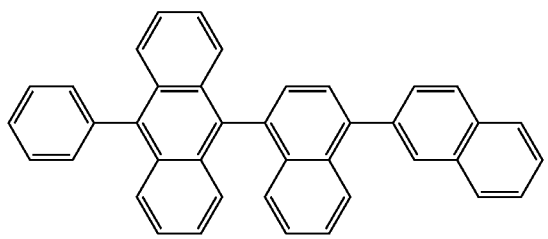
H10
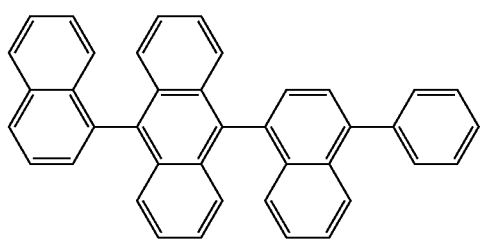
H11
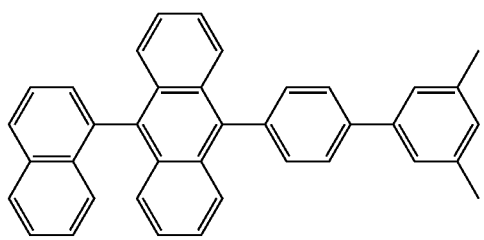
H12
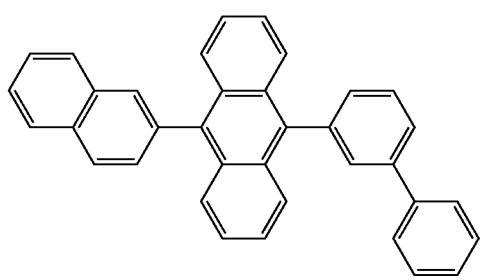
H13
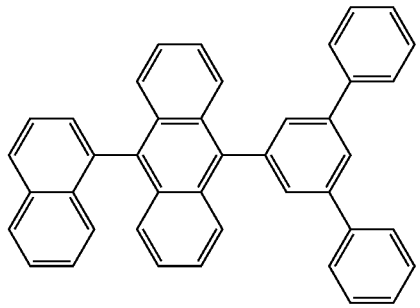

H14
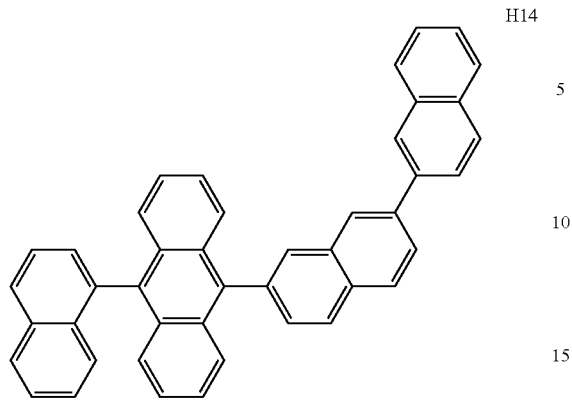
H15
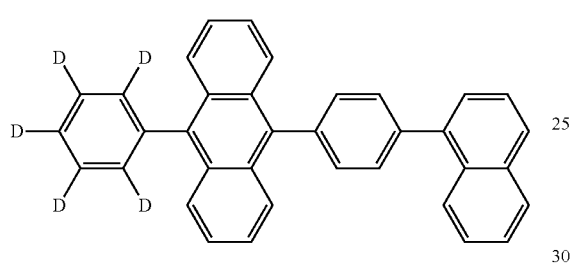
H16
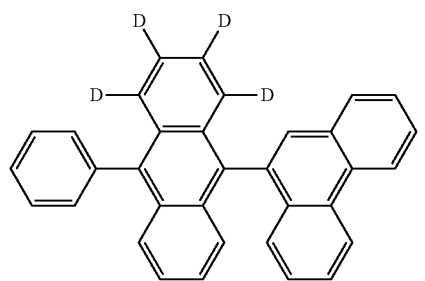
H17
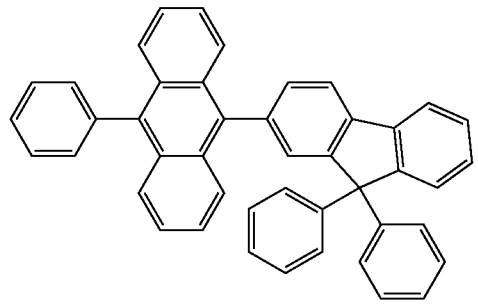
H18
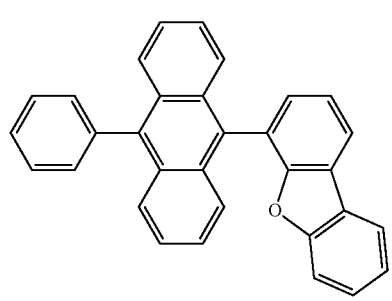
H19
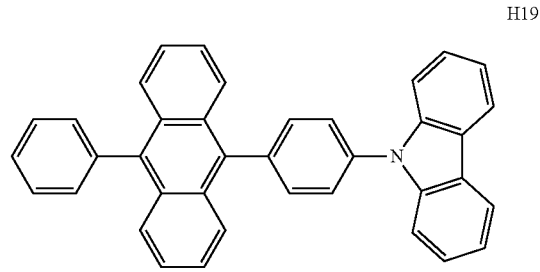
H20
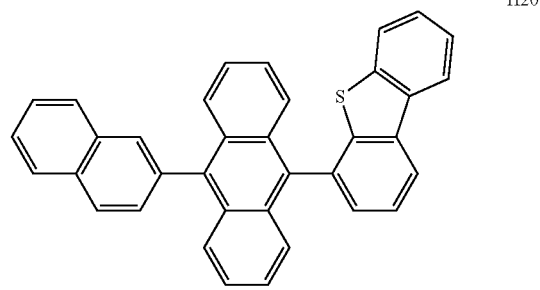
H21
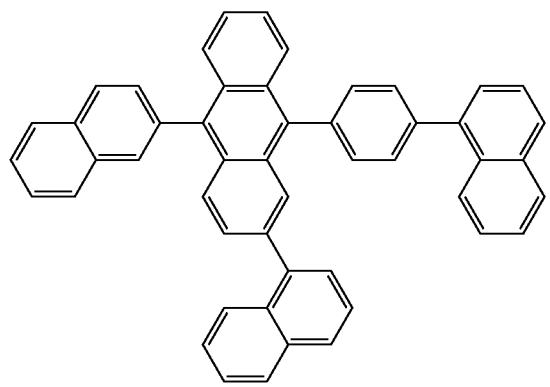
H22
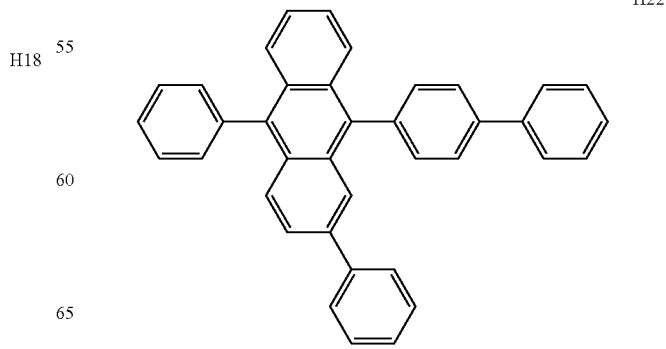

H23
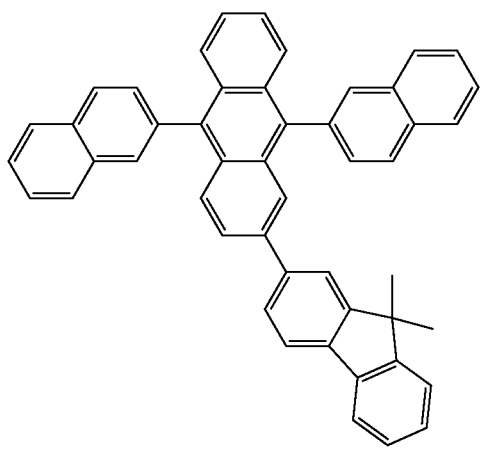

H24
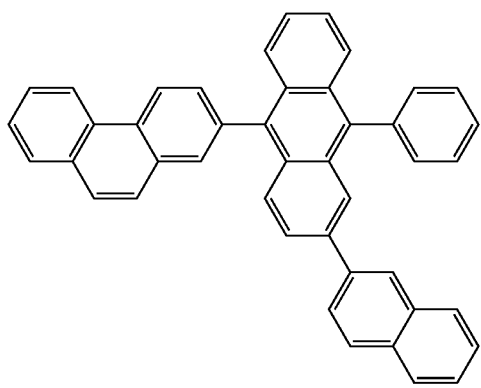

H25
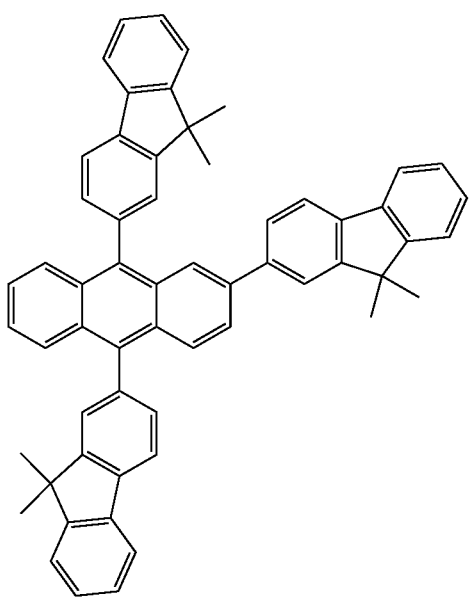

H26
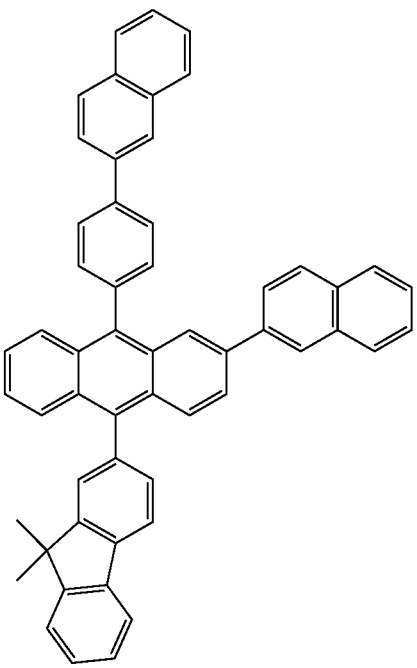

"D" in Compounds H1 to H26 indicates deuterium.

The weight ratio of the first compound to the second compound in the mixed layer 154 may be 1:9 to 9:1, 2:8 to 8:2, 3:7 to 7:3, or 4:6 to 6:4. Meanwhile, the thickness of the mixed layer 154 may be from about 1 nm to about 200 nm, or about 5 nm to about 100 nm. When the weight ratio of the first compound to the second compound in the mixed layer 154 and/or the thickness of the mixed layer 154 are within any of these ranges, excess excitons of the emission layer 155 may effectively (or suitably) move to the mixed layer 154 without an increase in the driving voltage.

The dopant of the emission layer 155 may include a phosphorescent dopant, a fluorescent dopant, or any combination thereof. The fluorescent dopant may include a prompt fluorescent dopant, a delayed fluorescent dopant, or any combination thereof.

The term "delayed fluorescence dopant" refers to a compound satisfying ΔEst=S1−T1<0.3 eV, wherein, S1 is a singlet energy level of the dopant, T1 is a triplet energy level of the dopant, and ΔEst is a difference between singlet energy and triplet energy.

In one embodiment, the dopant of the emission layer 155 may be a fluorescent dopant.

In one or more embodiments, the dopant may be a diamine compound containing a pyrene group. The dopant in the emission layer 155 will be described in more detail later.

The host of the emission layer 155 may include the second compound as described above. The second compound to be included in the host of the emission layer 155 is the same as described herein. In some embodiments, the second compound included in the mixed layer 154 and the second compound included in the host of the emission layer 155 may be identical to each other.

In one embodiment, the host may be the second compound. That is, the host may include only (e.g., may consist of) the second compound.

In one or more embodiments, the host may further include any other suitable host that is different from the second compound, in addition to the second compound.

The buffer layer 156 may include any suitable compound(s) that may satisfy Equation 3 as described above.

For example, the buffer layer 156 may include a hole transport compound, an electron transport compound, or any combination thereof, The hole transport compound is different from the electron transport compound, the hole transport compound may not include an electron transport group, the electron transport compound may include at least one electron transport group, and the electron transport group may be a fluoro group, a cyano group, a π electron-depleted nitrogen-containing $C_1$-$C_{60}$ heterocyclic group, one of the groups represented by the following formulae, or any combination thereof.

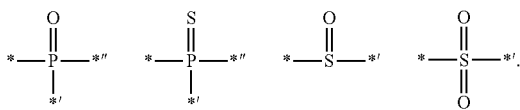

*, *', and *" in the formulae above are each a binding site to a respective neighboring atom.

In one embodiment, the buffer layer 156 may include a compound represented by Formula 3, a compound represented by Formula 4, or any combination thereof:

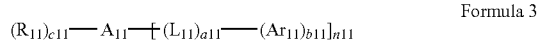

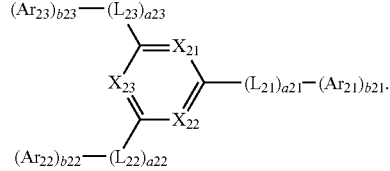

In Formulae 3 and 4, $A_{11}$ may be a naphthalene group, an anthracene group, a triphenylene group, a pyrene group, a chrysene group, or a perylene group, $L_{11}$ and $L_{21}$ to $L_{23}$ may each independently be a single bond, a $C_5$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, a11 and a21 to a23 may each independently be an integer from 1 to 5, $Ar_{11}$ and $Ar_{21}$ to $Ar_{23}$ may each independently be a $C_5$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, b11 and b21 to b23 may each independently be an integer from 1 to 4, n11 may be an integer from 1 to 4, $X_{21}$ may be N or $C(R_{21})$, $X_{22}$ may be N or $C(R_{22})$, and $X_{23}$ may be N or $C(R_{23})$, $R_{11}$ and $R_{21}$ to $R_{23}$ may each independently be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$ ($Q_1$), or —P(=O)($Q_1$)($Q_2$), and c11 may be an integer from 1 to 8.

In one embodiment, $L_{11}$ and $L_{21}$ to $L_{23}$ in Formulae 3 and 4 may each independently be a benzene group, a pentalene group, an indene group, a naphthalene group, an azulene group, a heptalene group, an indacene group, an acenaphthalene group, a fluorene group, a spiro-fluorene group, a benzofluorene group, a phenalene group, a phenanthrene group, an anthracene group, a fluoranthene group, a triphenylene group, a pyrene group, a chrysene group, a naphthacene group, a picene group, a perylene group, pentaphenylene group, a hexacene group, a pyrrole group, an imidazole group, a pyrazole group, a pyridine group, a pyrazine group, a pyrimidine group, a pyridazine group, an isoindole group, indole group, an indazole group, a purine group, a quinoline group, an isoquinoline group, a benzoquinoline group, a phthalazine group, a naphthyridine group, a quinoxaline group, a quinazoline group, a cinnoline group, a carbazole group, a dibenzosilole group, a phenanthridine group, an acridine group, a phenanthroline group, a phenazine group, a benzoxazole group, a benzimidazole group, a furan group, a benzofuran group, a thiophene group, a benzothiophene group, a thiazole group, an isothiazole group, a benzothiazole group, an isooxazole group, an oxazole group, a triazole group, a tetrazole group, an oxadiazole group, a triazine group, a dibenzofuran group, a dibenzothiophene group, a benzocarbazole group, and a dibenzocarbazole group, each independently unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a $C_6$-$C_{20}$ aryl group, a $C_1$-$C_{20}$ heteroaryl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof. In this regard, $Q_1$ to $Q_3$ and $Q_{31}$ to $Q_{33}$ are the same as described herein.

a11 and a21 to a23 in Formulae 3 and 4 indicate the numbers of 11 and $L_{21}$ to $L_{23}$, respectively, and may each independently be an integer from 1 to 5. When a11 is 2 or more, two or more of $L_{11}$(s) may be identical to or different from each other, when a21 is 2 or more, two or more of $L_{21}$ (s) may be identical to or different from each other, when a22 is 2 or more, two or more of $L_{22}$(s) may be identical to or different from each other, and when a23 is 2 or more, two or more of $L_{23}$(s) may be identical to or different from each other.

In one embodiment, $Ar_{11}$ and $Ar_{21}$ to $Ar_{23}$ in Formulae 3 and 4 may each independently be a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-cyclopentane-fluorenyl group, spiro-cyclohexane-fluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a chrysenyl group, a naphthacenyl group, a picenyl group, a perylenyl group, a pentaphenyl group, a hexacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, or an azadibenzosilolyl group, each independently unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a $C_6$-$C_{20}$ aryl group, a $C_1$-$C_{20}$ heteroaryl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof. In this regard, $Q_{31}$ to $Q_{33}$ are the same as described herein.

In one embodiment, b11 and b21 to b23 in Formulae 3 and 4 indicate the numbers of $Ar_{11}$ and $Ar_{21}$ to $Ar_{23}$, respectively, and may each independently be an integer from 1 to 4. When b11 is 2 or more, two or more $Ar_{11}$(s) may be identical to or different from each other, when b21 is 2 or more, two or more $Ar_{21}$(s) may be identical to or different from each other, when b22 is 2 or more, two or more $Ar_{22}$(s) may be identical to or different from each other, and when b23 is 2 or more, two or more $Ar_{23}$(s) may be identical to or different from each other.

In one or more embodiments, n11 in Formula 3 may be 2 or more. When n11 is 2, 3, or 4, for example, two, three, or four groups represented by *-[($L_{11}$)$_{a11}$-($Ar_{11}$)$_{b11}$] may be identical to or different from each other.

In one embodiment, in Formula 3, only one of $X_{21}$ to $X_{23}$ may be N, two of $X_{21}$ to $X_{23}$ may each be N, or all of $X_{21}$ to $X_{23}$ may each be N at the same time.

In one embodiment, in Formula 3, only one of $X_{21}$ to $X_{23}$ may be N, only two of $X_{21}$ to $X_{23}$ may each be N, or all of $X_{21}$ to $X_{23}$ may each be N at the same time.

In one or more embodiments, $R_{11}$ and $R_{21}$ to $R_{23}$ in Formulae 3 and 4 may each independently be:

hydrogen, deuterium, —F, —Cl, —Br, —I, a hydroxyl group, a cyano group, a nitro group, a $C_1$-$C_{20}$ alkyl group, or $C_1$-$C_{20}$ alkoxy group; or a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, or a terphenyl group, each independently unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, a terphenyl group, or any combination thereof.

In one embodiment, $R_{11}$ and $R_{21}$ to $R_{23}$ in Formulae 3 and 4 may each independently be hydrogen, deuterium, —F, —Cl, —Br, —I, a hydroxyl group, a cyano group, a nitro group, a methyl group, an ethyl group, a propyl group, an isobutyl group, a sec-butyl group, a ter-butyl group, pentyl group, an isoamyl group, a hexyl group, a $C_1$-$C_{20}$ alkoxy group, a phenyl group, a naphthyl group, a fluorenyl group, a pyridinyl group, a dibenzofuranyl group, a dibenzothiophenyl group, a biphenyl group, or a terphenyl group.

In one or more embodiments, A11 in Formula 3 may be an anthracene group or a pyrene group.

In one or more embodiments, the buffer layer 156 may include a compound represented by Formula 3-A, a compound represented by Formula 3-B, a compound represented by Formula 4, or any combination thereof:

Formula 3-A

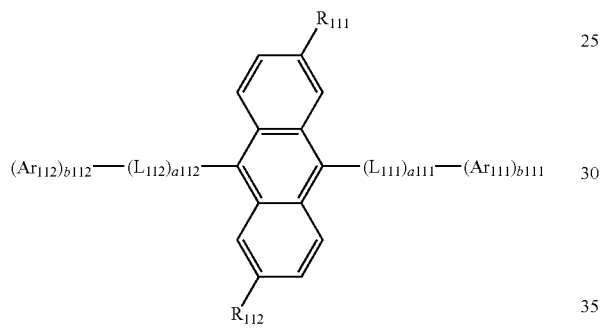

Formula 3-B

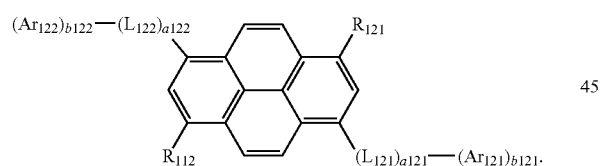

In Formulae 3-A and 3-B, $L_{111}$, $L_{112}$, $L_{121}$ and $L_{122}$ are each independently the same as described in connection with $L_{11}$ in Formula 3, a111, a112, a121, and a122 are each independently the same as described in connection with a11 in Formula 3, $Ar_{111}$, $Ar_{112}$, $Ar_{121}$, and $Ar_{122}$ are each independently the same as described in connection with $Ar_{11}$ in Formula 3, b111, b112, b121, and b122 are each independently the same as described in connection with b11 in Formula 3, and $R_{111}$, $R_{112}$, $R_{121}$, and $R_{122}$ are each independently the same as described in connection with $R_{11}$ in Formula 3.

In one embodiment, the compound represented by Formula 3 may include at least one of Compounds BF3-1 to BF3-27, and the compound represented by Formula 4 may include at least one of Compounds BF4-1 to BF4-11:

BF3-1

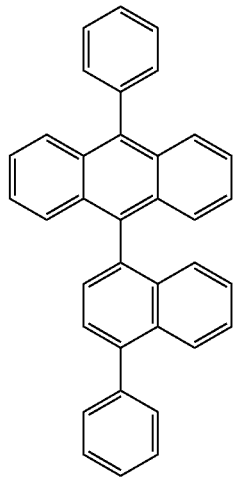

BF3-2

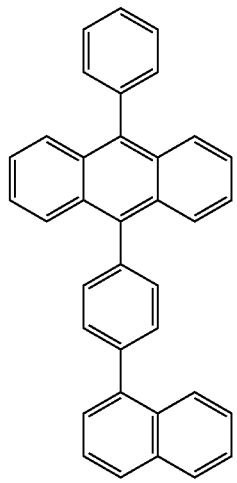

BF3-3

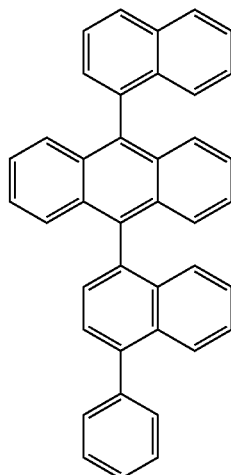

BF3-4
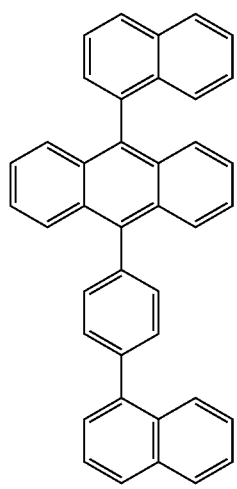
BF3-5
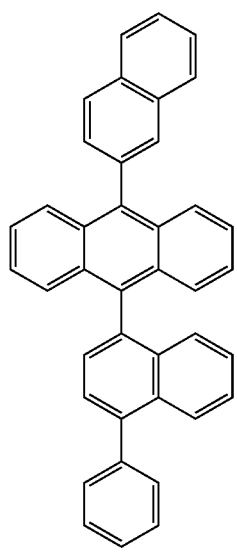
BF3-6
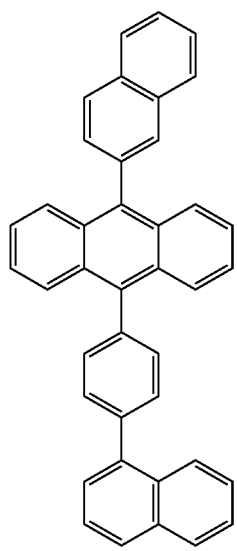
BF3-7
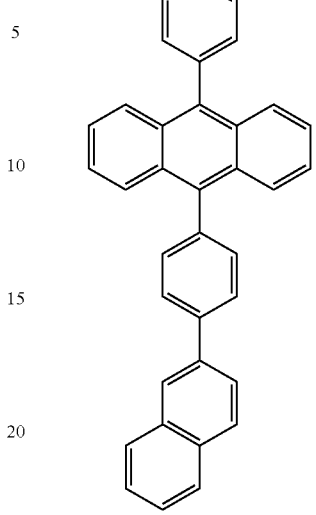
BF3-8
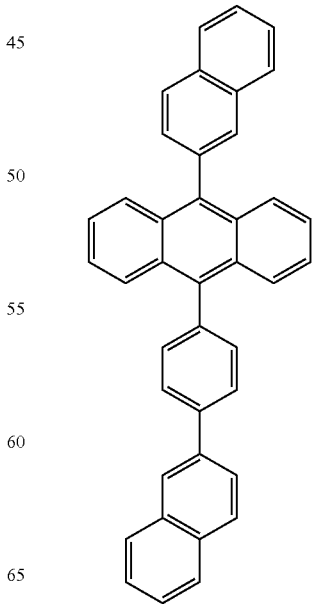

BF3-9
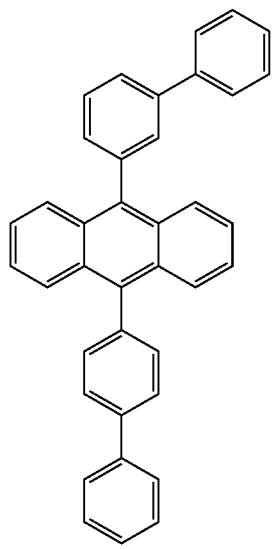
BF3-11
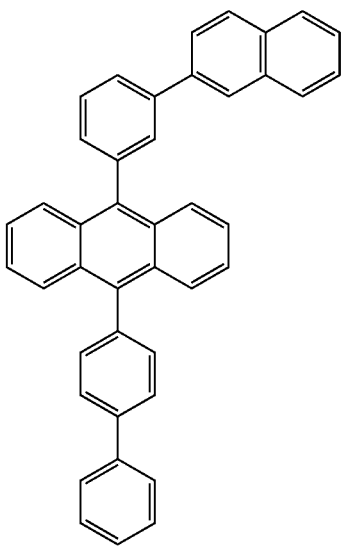
BF3-12
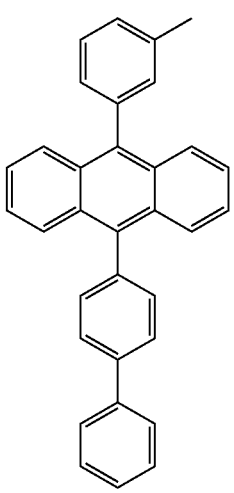
BF3-10
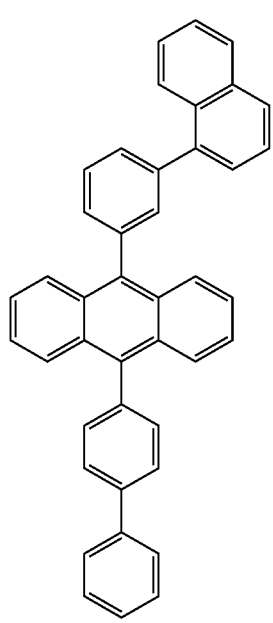
BF3-13
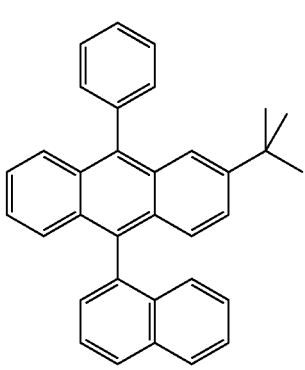

BF3-14
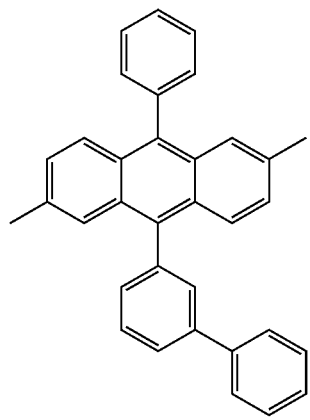
BF3-15
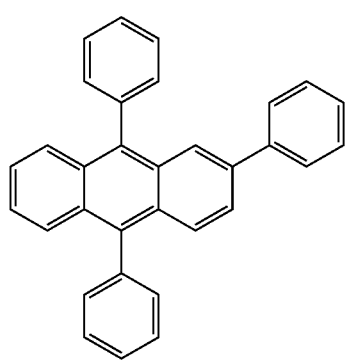
BF3-16
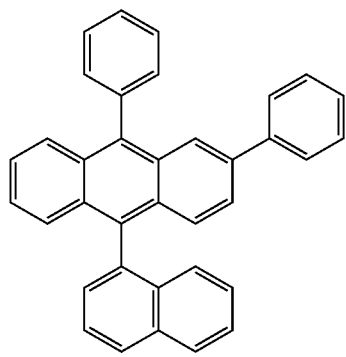
BF3-17
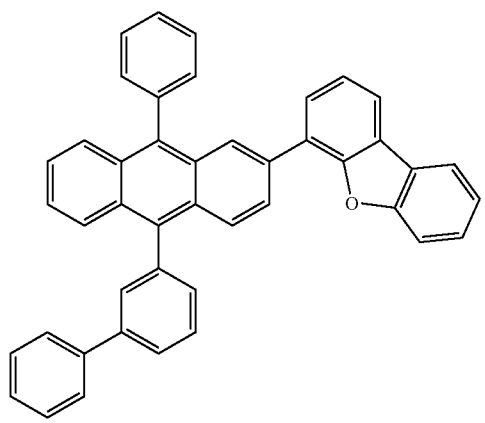
BF3-18
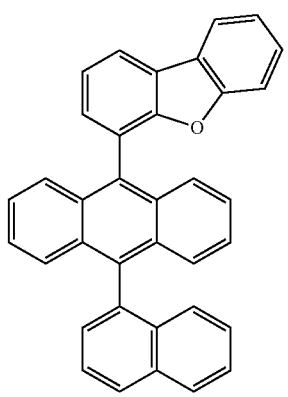
BF3-19
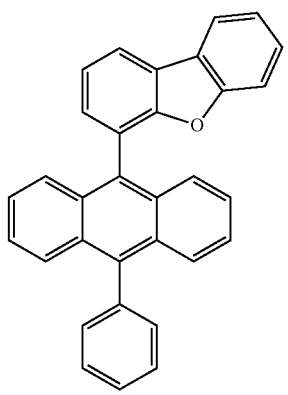
BF3-20
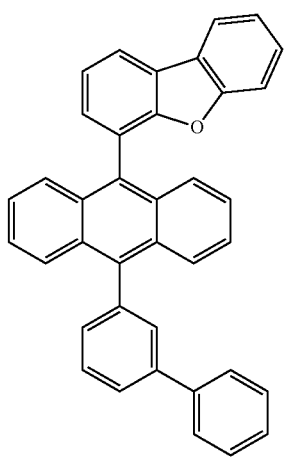
BF3-21
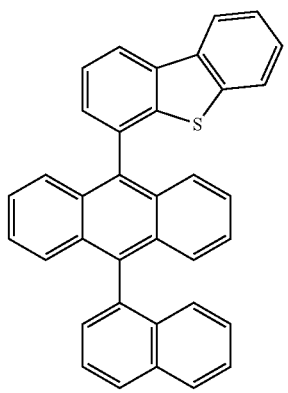

BF3-22
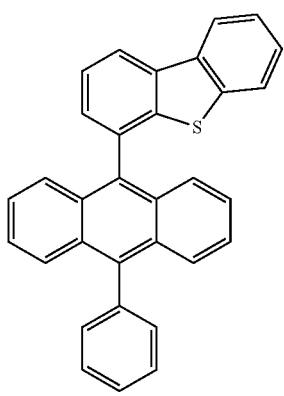
BF3-25
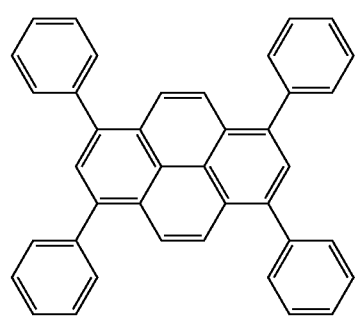
BF3-23
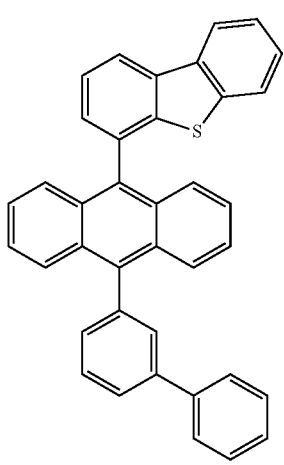
BF3-26
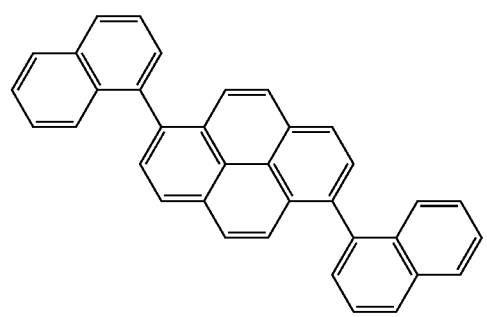
BF3-27
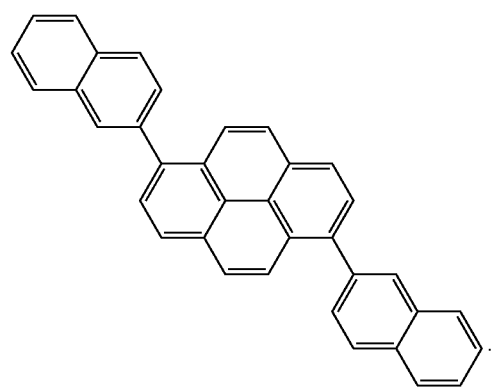
BF3-24
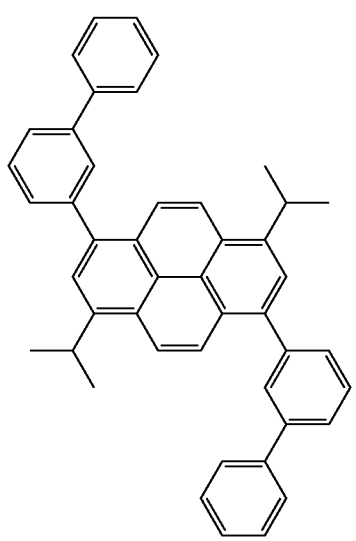
BF4-1
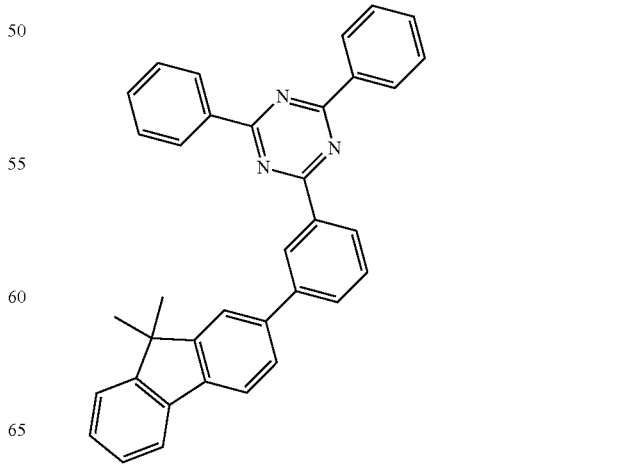

-continued

BF4-2

BF4-3

BF4-4

BF4-5

BF4-6

BF4-7

-continued

BF4-8
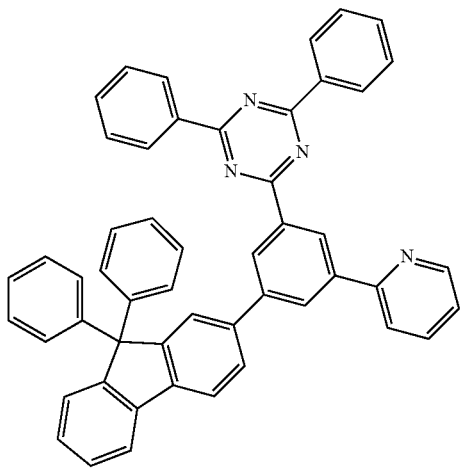

BF4-9
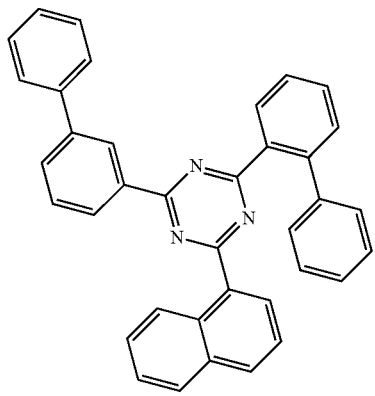

BF4-10
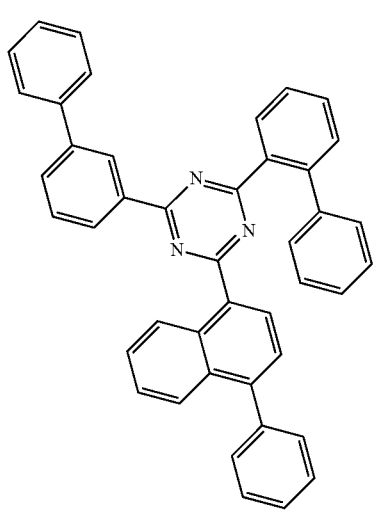

-continued

BF4-11
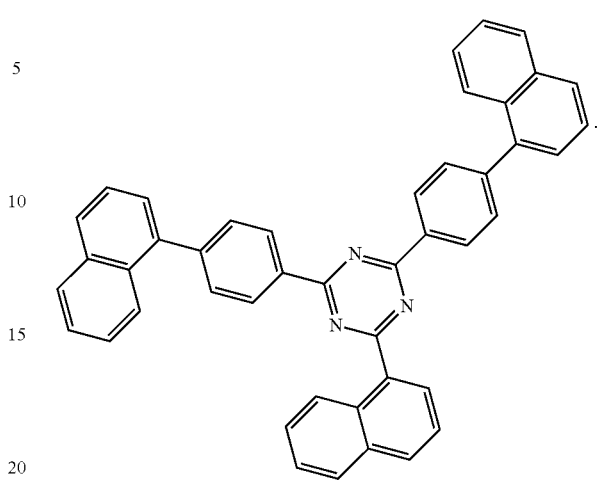

In one embodiment, the mixed layer 154 and the emission layer 155 may be in direct contact with each other, and the emission layer 155 and the buffer layer 156 may be in direct contact with each other. As a result, excitons may easily move from the emission layer 155 to the mixed layer 154, and injection of electrons from the buffer layer 156 to the emission layer 155 may be effectively (or suitably) controlled.

In some embodiments, the organic light-emitting device 10 may further include an interlayer between the first electrode 110 and the mixed layer 154, a hole transport region between the first electrode 110 and the mixed layer 154, an electron transport region between the buffer layer 156 and the second electrode 190, or any combination of the interlayer, the hole transport region, and the electron transport region. The hole transport region and the electron transport region may be understood by referring to the related descriptions thereof to be presented in more detail later.

When the organic light-emitting device 10 further includes the interlayer, the interlayer may include a first compound according to the present embodiments. Here, the first compound included in the interlayer and the first compound included in the mixed layer 154 may be identical to each other.

In one embodiment, the interlayer may include the first compound of the present embodiments, and may not include the second compound of the present embodiments.

In one or more embodiments, the interlayer may consist of (e.g., may include only) the first compound.

In one or more embodiments, the interlayer and the mixed layer 154 may be in direct contact with each other.

In one or more embodiments, the thickness of the interlayer may be from about 1 nm to about 200 nm, or from about 5 nm to about 100 nm. When the thickness of the interlayer satisfies any of these ranges, the injection of holes into the emission layer 155 may be effectively (or suitably) performed.

When the organic light-emitting device 10 further includes a hole transport region, the hole transport region may include a compound containing a carbazole group.

When the organic light-emitting device 10 further includes a hole transport region and an interlayer as described above, the organic light-emitting device 10 may have the structure in which the first electrode 110, the hole transport region, the interlayer, the mixed layer 154, the emission layer 155, the buffer layer 156, and the second electrode 190 are sequentially stacked in this stated order.

When the organic light-emitting device 10 further includes a hole transport region, an interlayer, and an electron transport region, the organic light-emitting device 10 may have the structure in which the first electrode 110, the hole transport region, the interlayer, the mixed layer 154, the emission layer 155, the buffer layer 156, the electron transport region, and the second electrode 190 are sequentially stacked in this stated order.

Hereinafter, each layer that may be included in the organic light-emitting device 10 of the drawing will be described in more detail.

First Electrode 110

In the drawing, a substrate may be additionally provided under the first electrode 110 or above the second electrode 190. The substrate may be a glass substrate and/or a plastic substrate, each having excellent mechanical strength, thermal stability, transparency, surface smoothness, ease of handling, and/or water resistance.

The first electrode 110 may be formed by depositing or sputtering a material for forming the first electrode 110 on the substrate. When the first electrode 110 is an anode, the material for forming the first electrode 110 may include materials with a high work function to facilitate hole injection.

The first electrode 110 may be a reflective electrode, a semi-transmissive electrode, or a transparent electrode. When the first electrode 110 is a transparent electrode, a material for forming a first electrode may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

Hole Transport Region

Although not shown in the drawing, the organic light-emitting device 10 may further include a hole transport region between the first electrode 110 and the mixed layer 154.

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include a hole injection layer (HIL), a hole transport layer (HTL), an emission auxiliary layer, an electron blocking layer(EBL), or any combination thereof.

For example, the hole transport region may have a single-layered structure including a single layer including a plurality of different materials or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/ electron blocking layer structure, wherein for each structure, constituting layers are sequentially stacked from the first electrode 110 in this stated order. In one or more embodiments, the hole transport region may include a first hole transport layer and a second hole transport layer.

The hole transport region may include m-MTDATA, TDATA, 2-TNATA, NPB(NPD), p-NPB, TPD, Spiro-TPD, spiro-NPB, methylated NPB, TAPC, HMTPD, 4,4′,4″-tris (N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT:PSS), polyaniline/camphor sulfonic acid (Pani/CSA), polyaniline/poly(4-styrenesulfonate) (PANI/PSS), poly(9,9-dioctylfluorene-co-N-(4-butylphenyl)-diphenylamin (TBF), a compound represented by Formula 201, a compound represented by Formula 202, or any combination thereof:

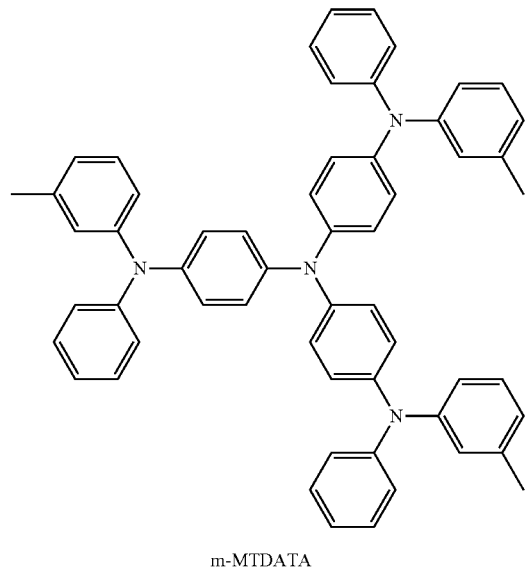

m-MTDATA

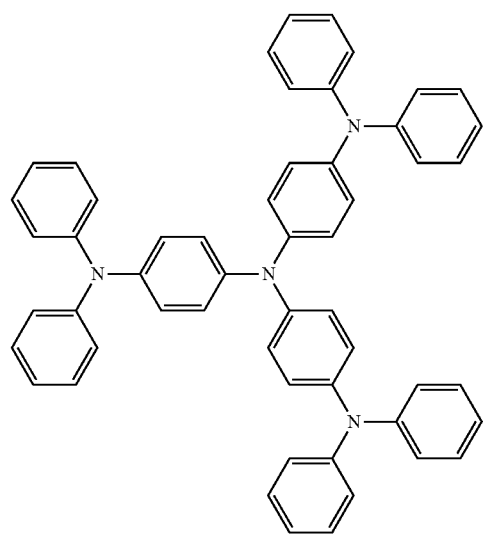

TDATA

-continued
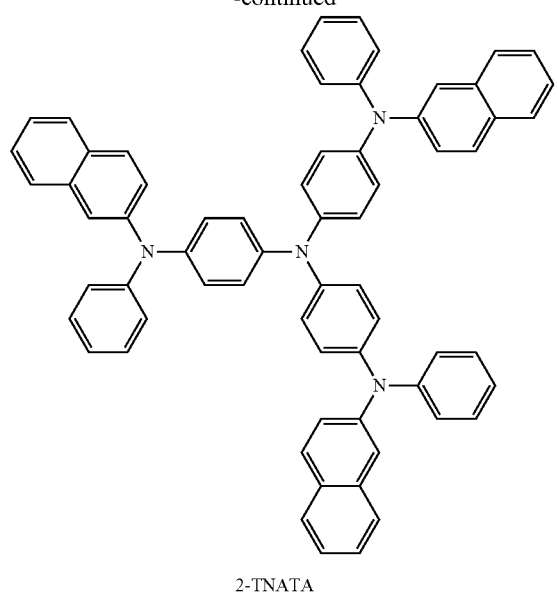
2-TNATA
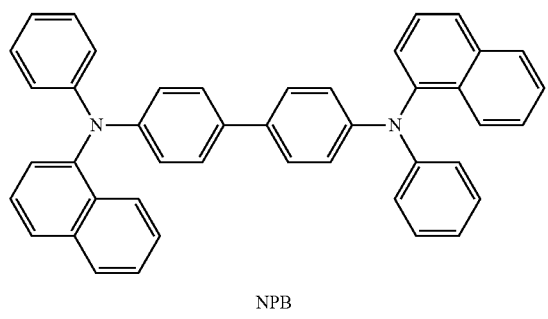
NPB
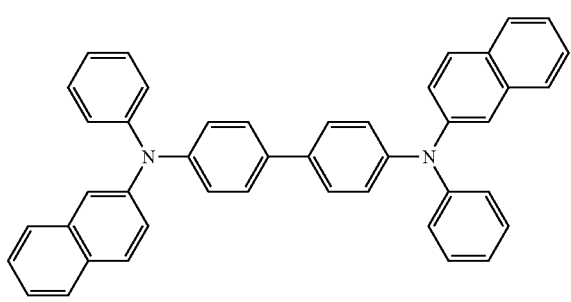
β-NPB
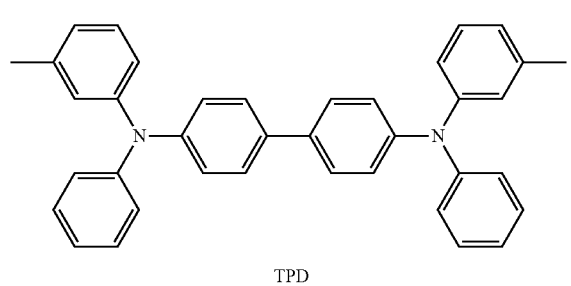
TPD
-continued
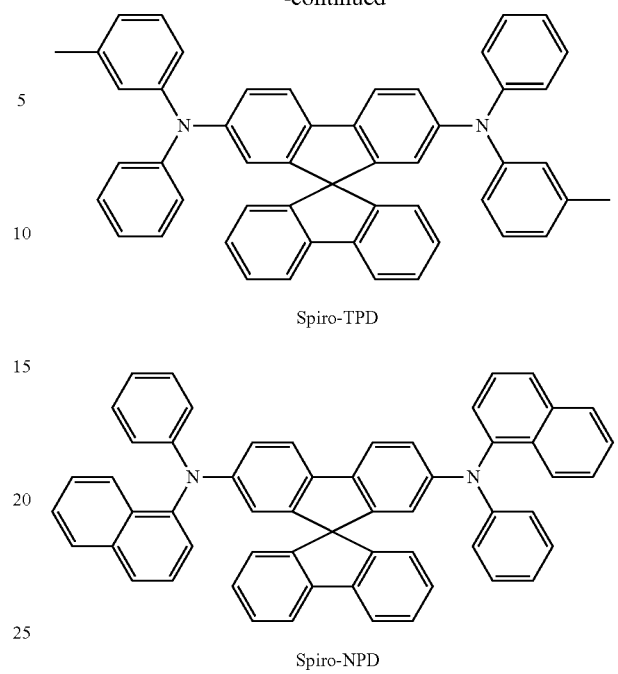
Spiro-TPD
Spiro-NPD
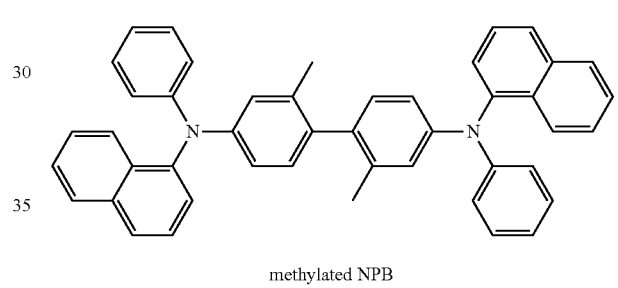
methylated NPB
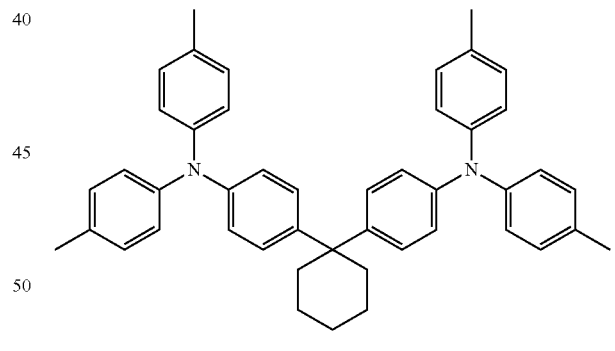
TAPC
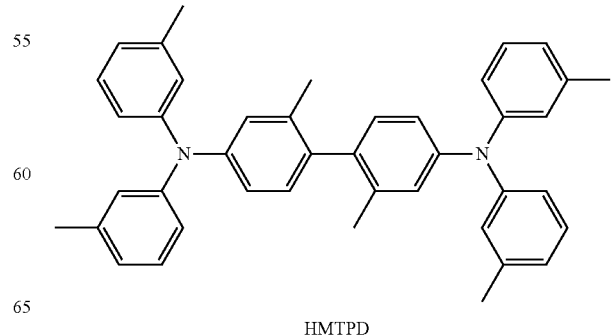
HMTPD

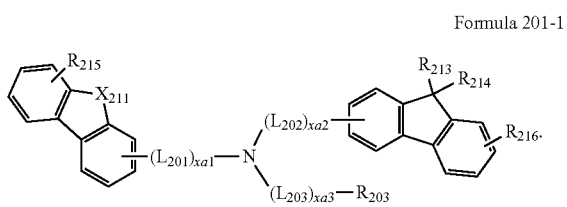

Formula 201

$R_{201}$—$(L_{201})_{xa1}$—N
                               \—$(L_{202})_{xa2}$—$R_{202}$
                               \—$(L_{203})_{xa3}$—$R_{203}$

Formula 202

$R_{201}$—$(L_{201})_{xa1}$\
$R_{202}$—$(L_{202})_{xa2}$/ N—$(L_{205})_{xa5}$—N \—$(L_{203})_{xa3}$—$R_{203}$
                                                 \—$(L_{204})_{xa4}$—$R_{204}$.

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, and/or a diphenyl-methylene group, and $R_{203}$ and $R_{204}$ may optionally be linked to each other via a single bond, a dimethyl-methylene group, and/or a diphenyl-methylene group.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one of $R_{201}$ to $R_{204}$ in Formula 202 may each independently be a carbazolyl group which is unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, a dibenzothiophenyl group, or any combination thereof, but embodiments of the present disclosure are not limited thereto.

The compound represented by Formula 201 may be represented by Formula 201-1 below:

Formula 201-1

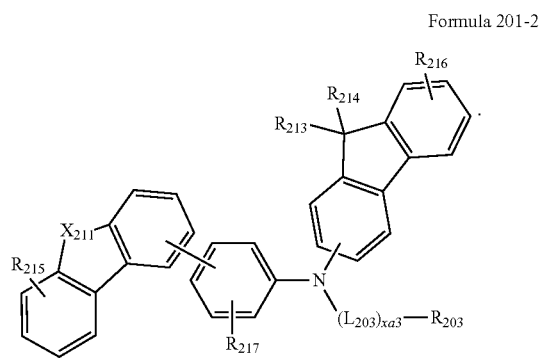

In one embodiment, the compound represented by Formula 201 may be represented by Formula 201-2 below, but embodiments of the present disclosure are not limited thereto:

Formula 201-2

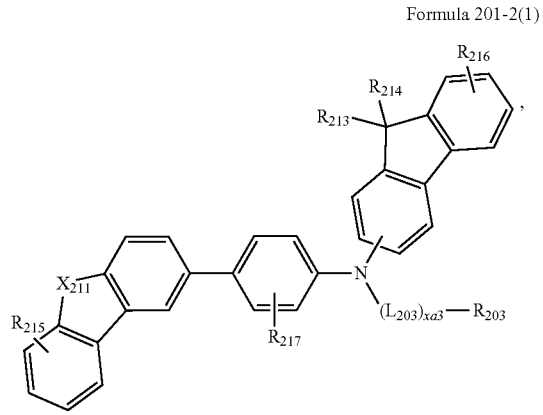

In one or more embodiments, the compound represented by Formula 201 may be represented by Formula 201-2(1) below, but embodiments of the present disclosure are not limited thereto:

Formula 201-2(1)

In one or more embodiments, the compound represented by Formula 201 may be represented by Formula 201A below:

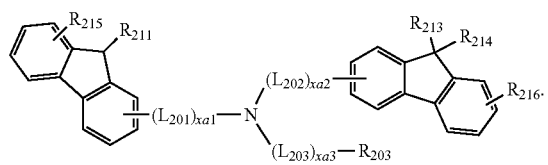

Formula 201A

In one or more embodiments, the compound represented by Formula 201 may be represented by Formula 201A(1) below, but embodiments of the present disclosure are not limited thereto:

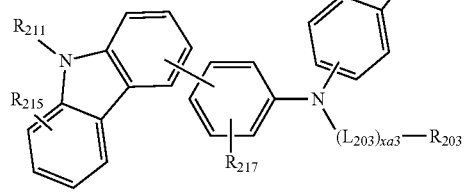

Formula 201A(1)

In one or more embodiments, the compound represented by Formula 201 may be represented by Formula 201A-1 below, but embodiments of the present disclosure are not limited thereto:

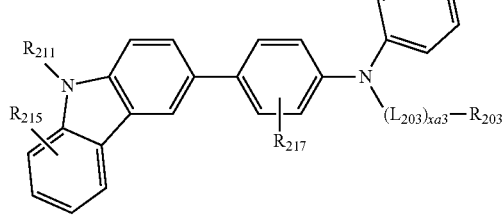

Formula 201A-1

In one embodiment, the compound represented by Formula 202 may be represented by Formula 202-1 below:

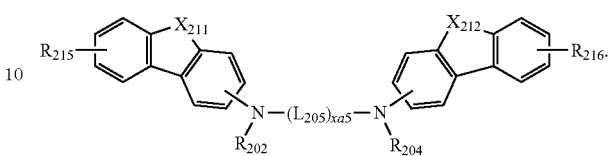

Formula 202-1

In one or more embodiments, the compound represented by Formula 202 may be represented by Formula 202-1(1) below:

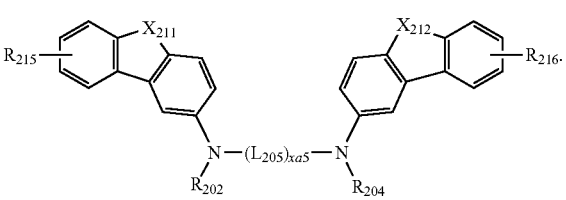

Formula 202-1(1)

In one or more embodiments, the compound represented by Formula 202 may be represented by Formula 202A below:

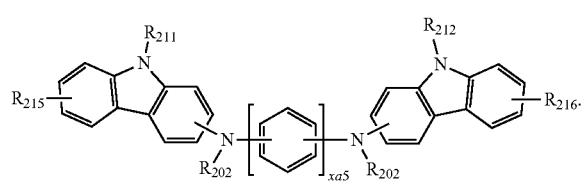

Formula 202A

In one or more embodiments, the compound represented by Formula 202 may be represented by Formula 202A-1 below:

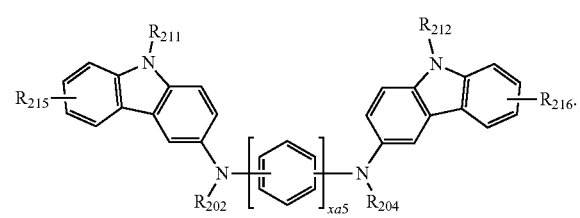

Formula 202A-1

In Formulae 201-1, 201-2, 201-2(1), 201A, 201 A(1), 201A-1, 202-1, 202-1(1), 202A, and 202A-1, $L_{201}$ to $L_{203}$, xa1 to xa3, xa5, and $R_{202}$ to $R_{204}$ are the same as described above, $L_{205}$ may be a phenylene group or a fluorenylene group, $X_{211}$ may be O, S, or $N(R_{211})$, $X_{212}$ may be O, S, or $N(R_{212})$, $R_{211}$ and $R_{212}$ may each independently be the same as described in connection with $R_{203}$, and $R_{213}$ to $R_{217}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

The hole transport region may include at least one compound selected from Compounds HT1 to HT48, but embodiments of the present disclosure are not limited thereto:

HT1

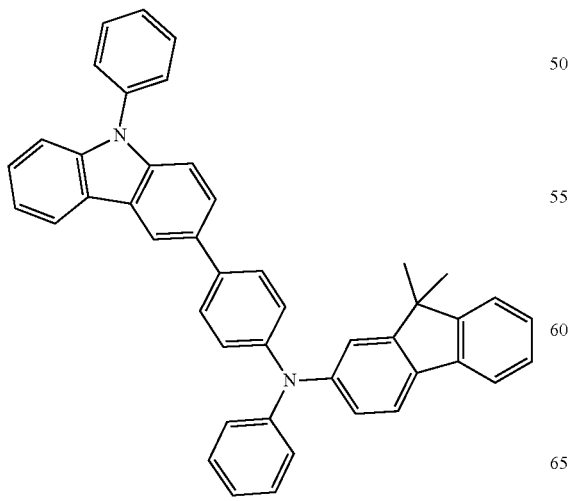

HT2

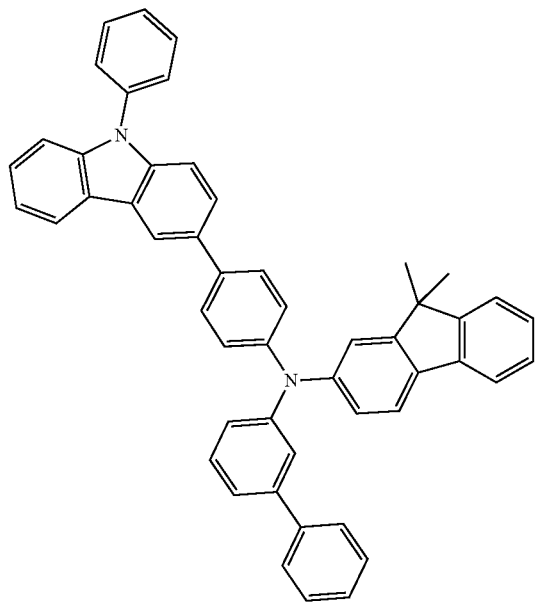

HT3

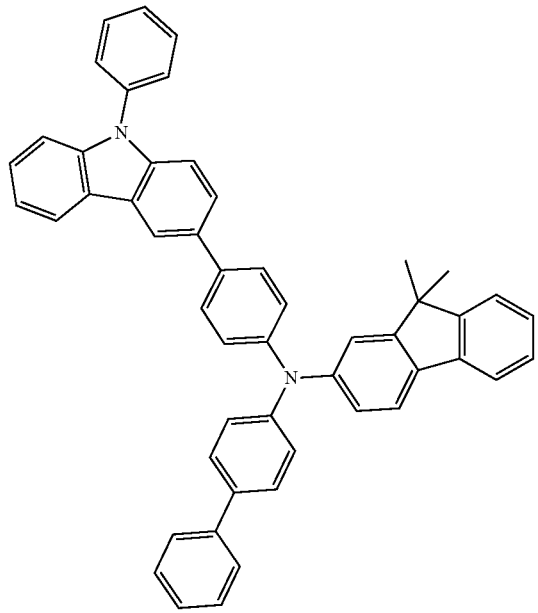

HT4
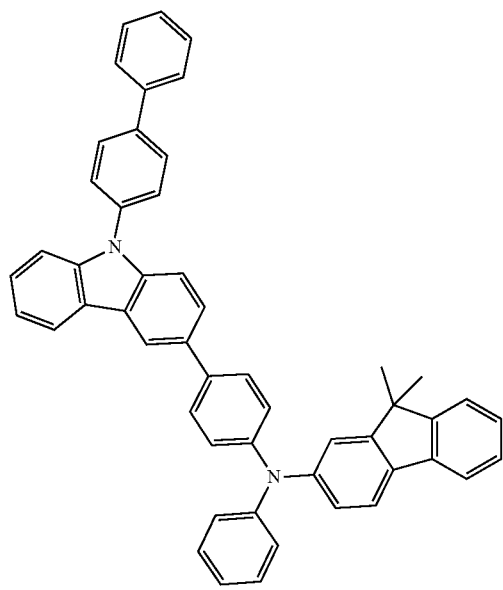
HT5
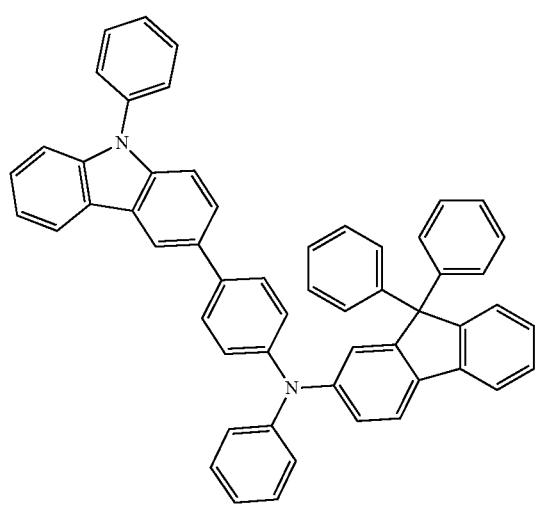
HT6
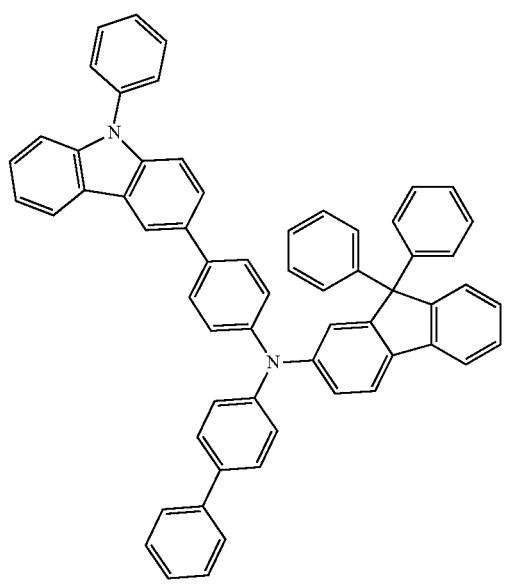
HT7
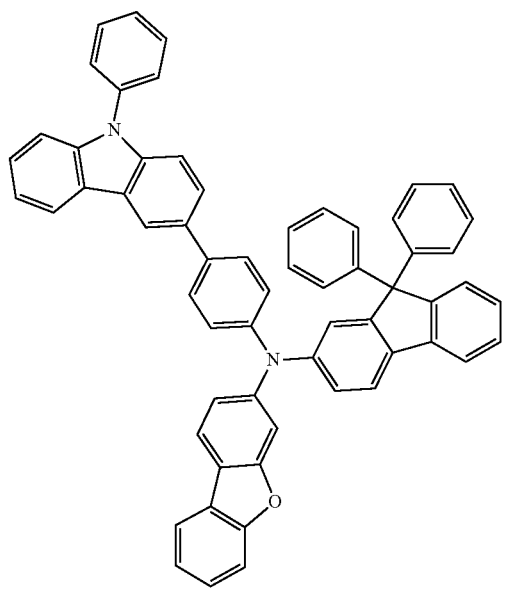

HT8
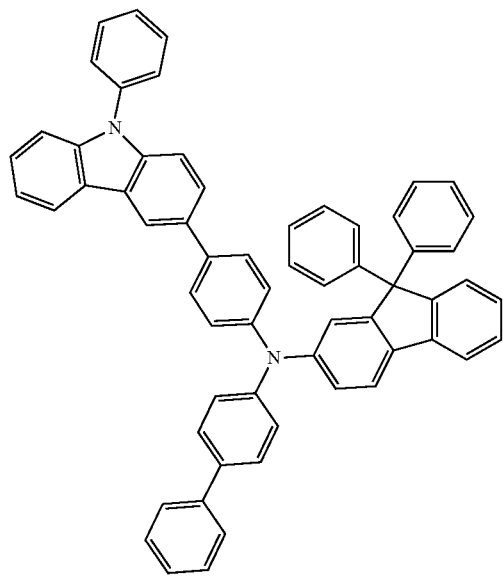
HT10
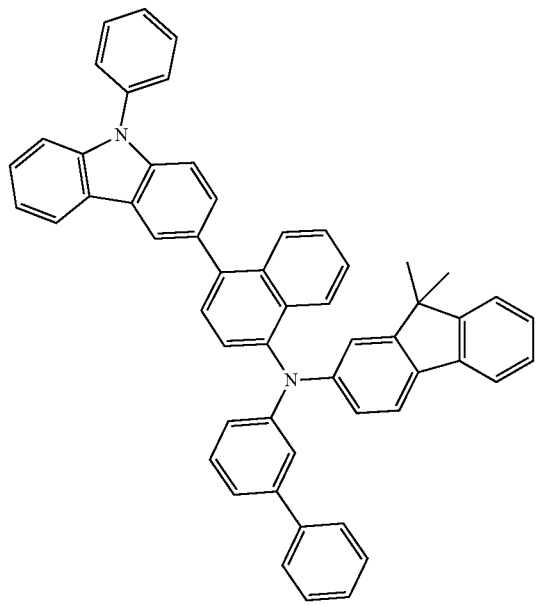
HT11
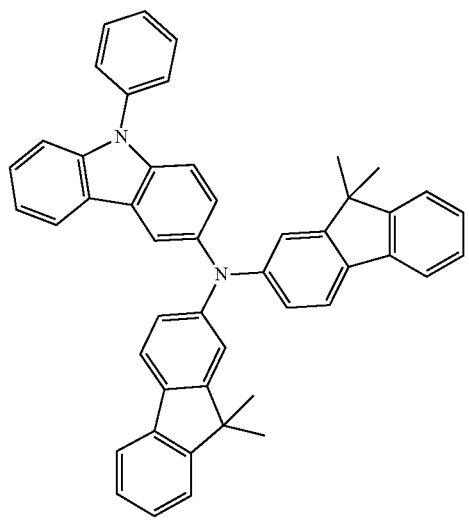
HT9
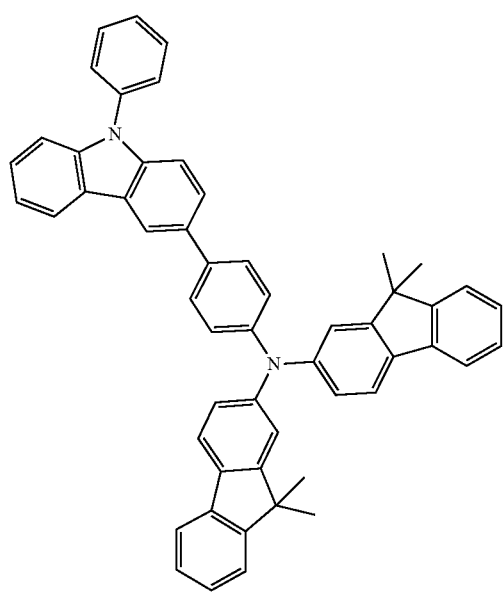
HT12
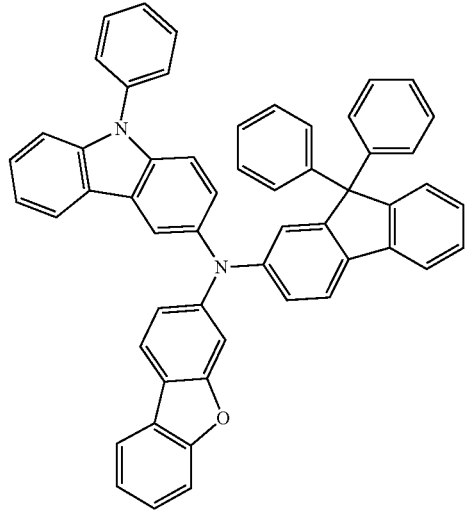

-continued
HT13
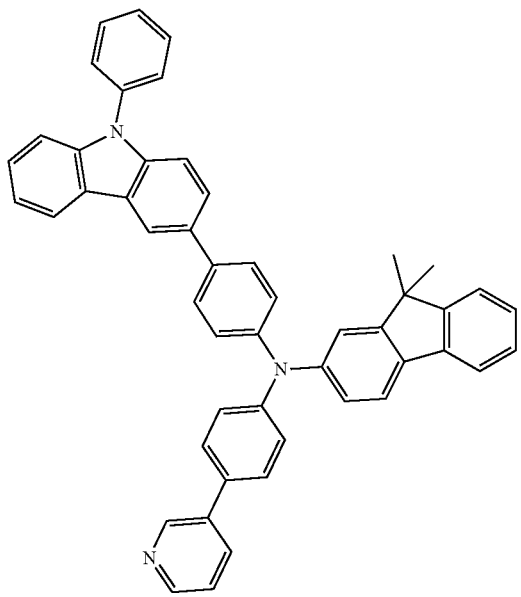
HT14
HT15
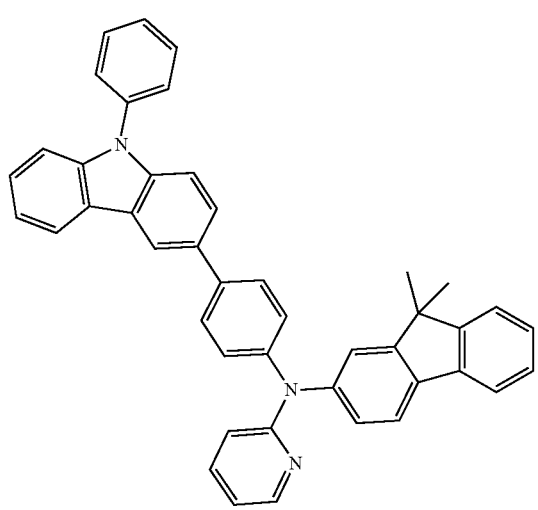
HT16
HT17
HT18

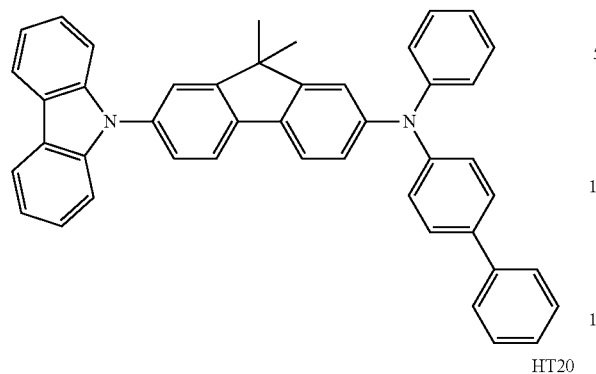
HT19
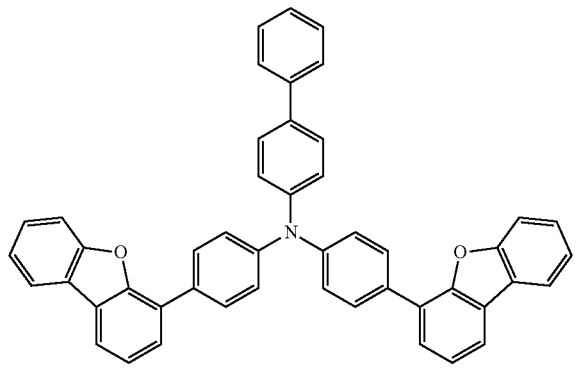
HT22
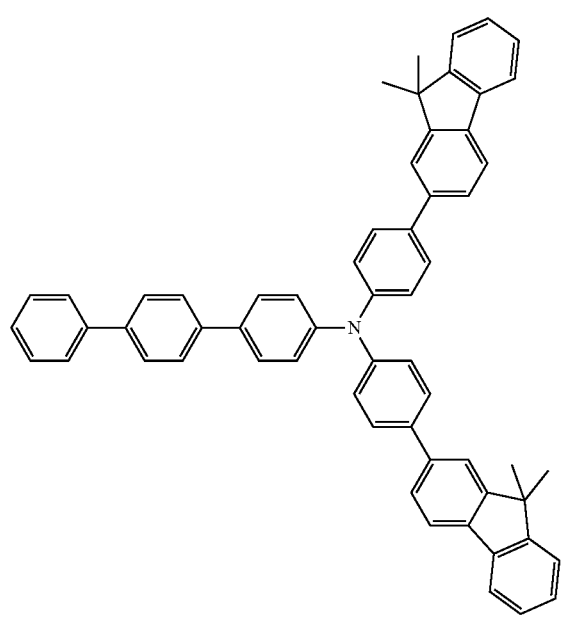
HT20
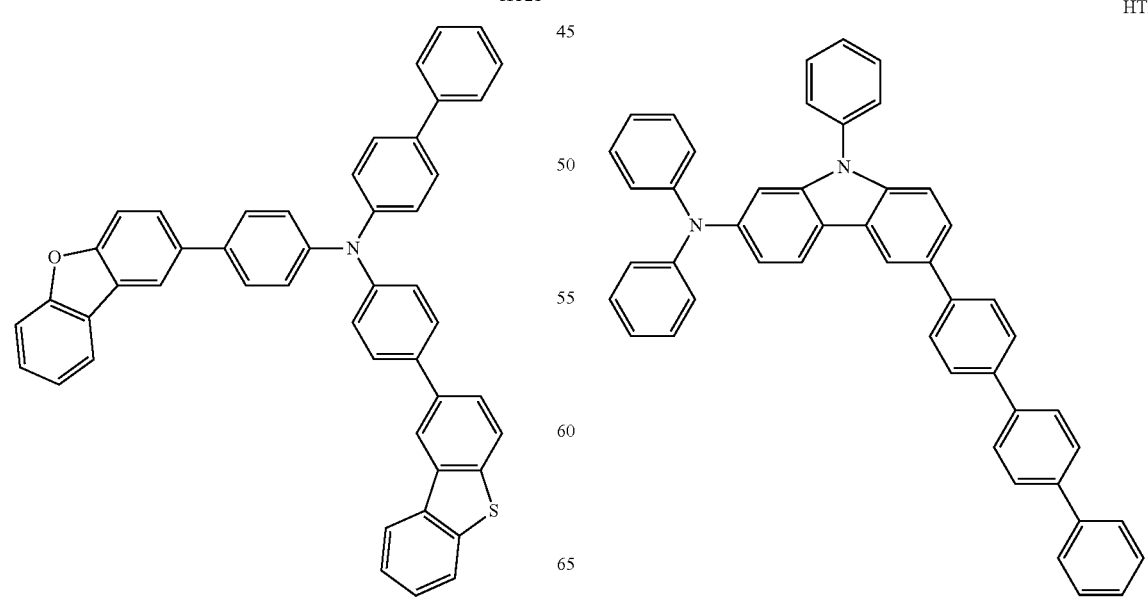
HT21

HT26
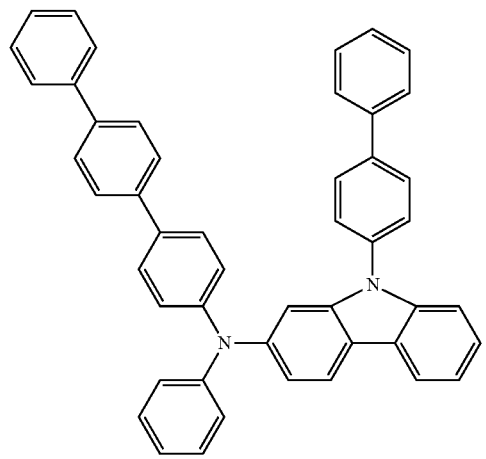
HT27
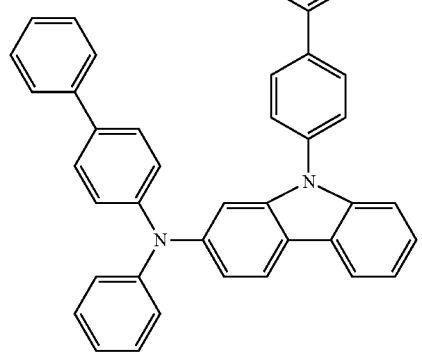
HT28
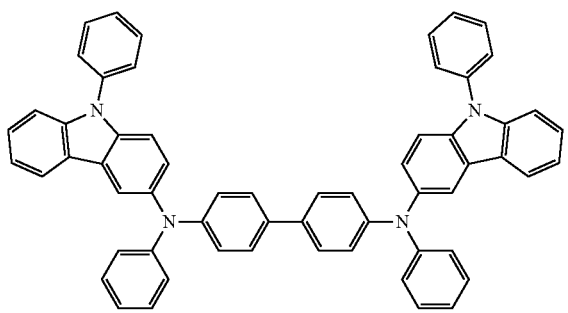
HT29
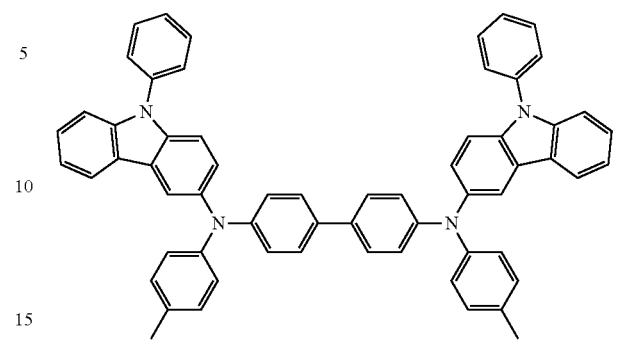
HT30
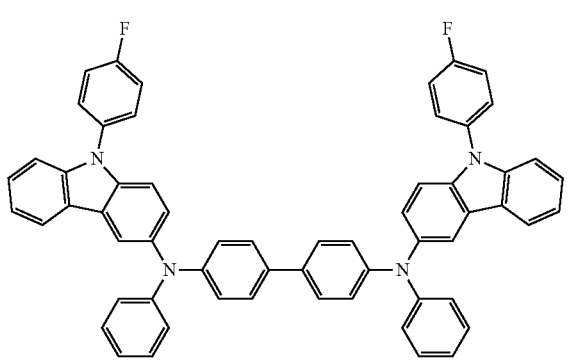
HT31
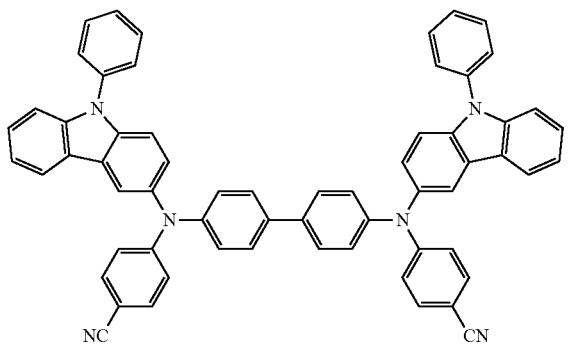
HT32
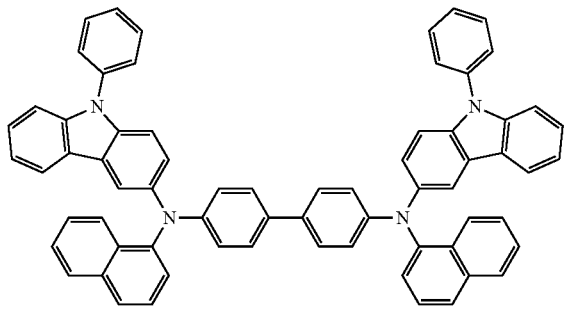

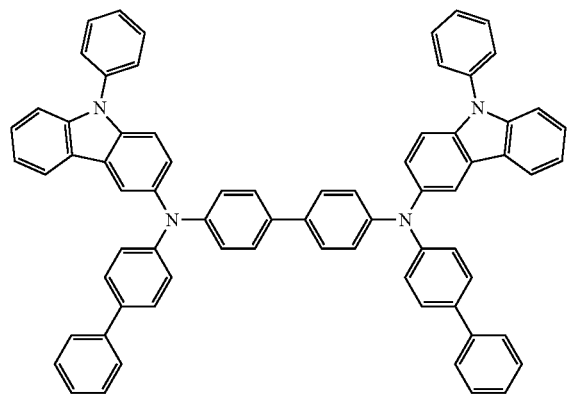
HT33
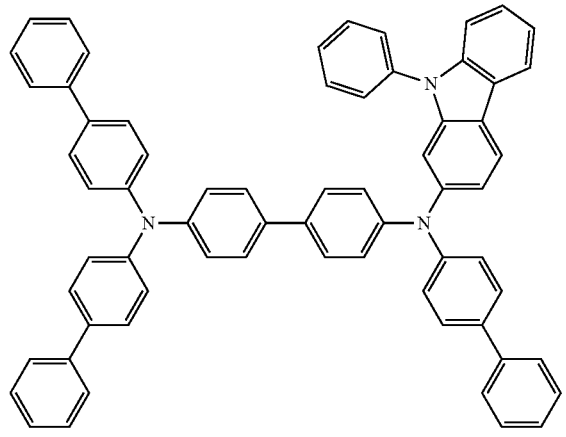
HT36
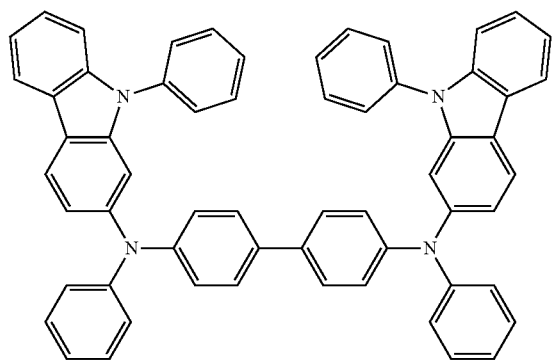
HT34
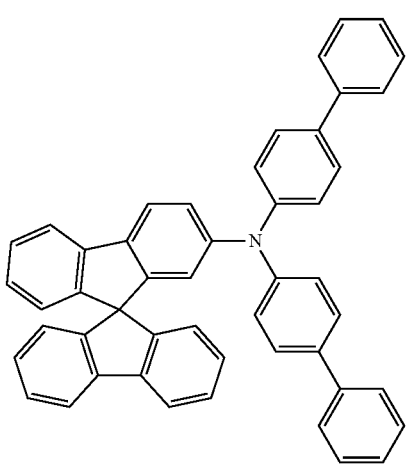
HT37
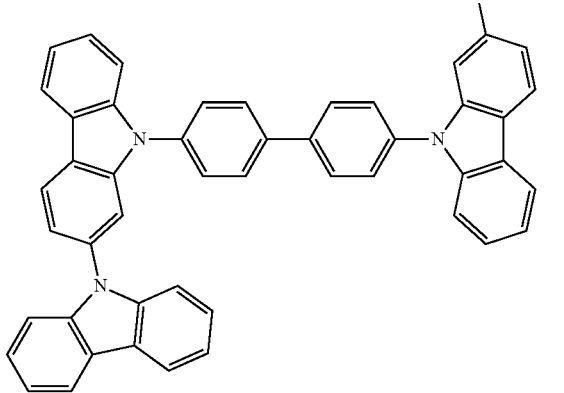
HT35
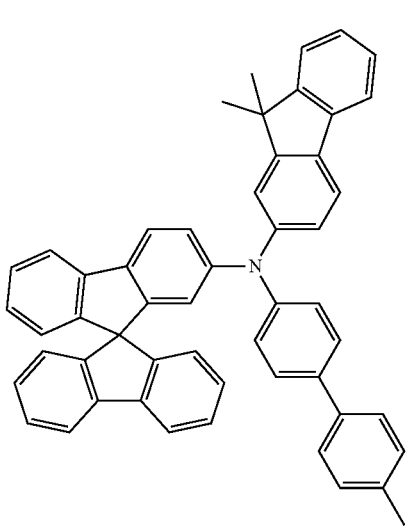
HT38

HT39
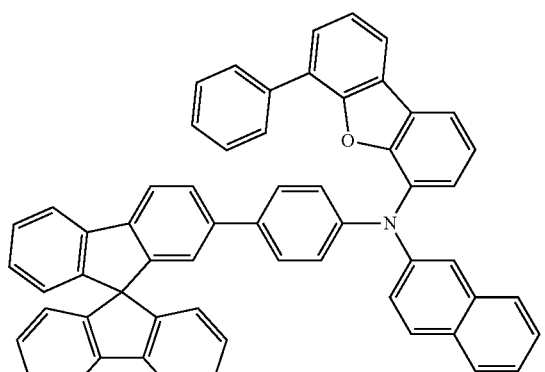
HT42
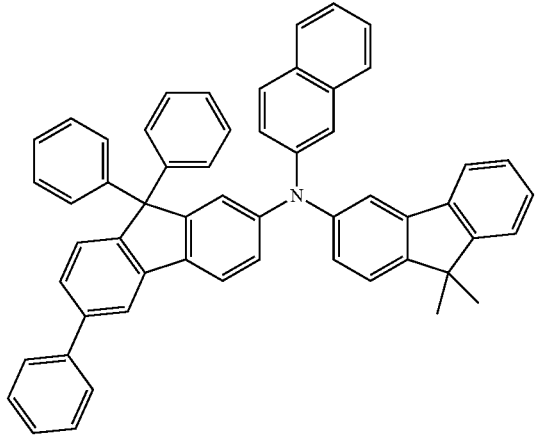
HT40
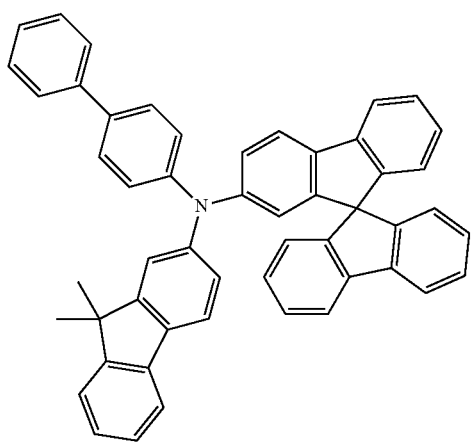
HT43
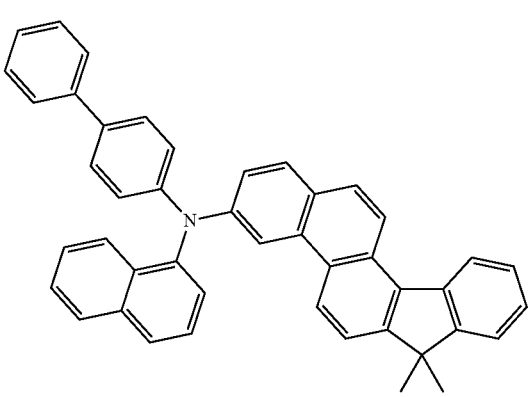
HT41
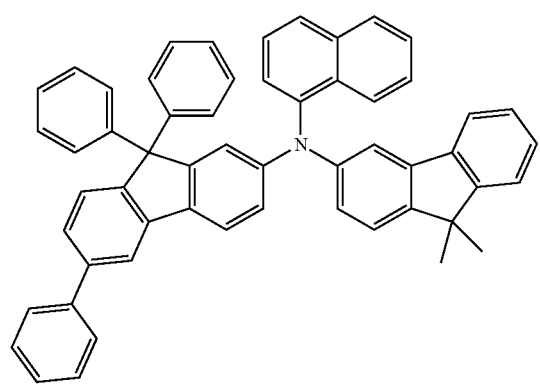
HT44
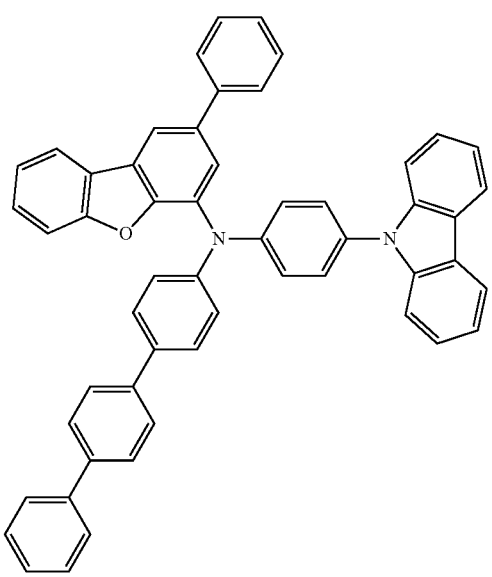

HT45

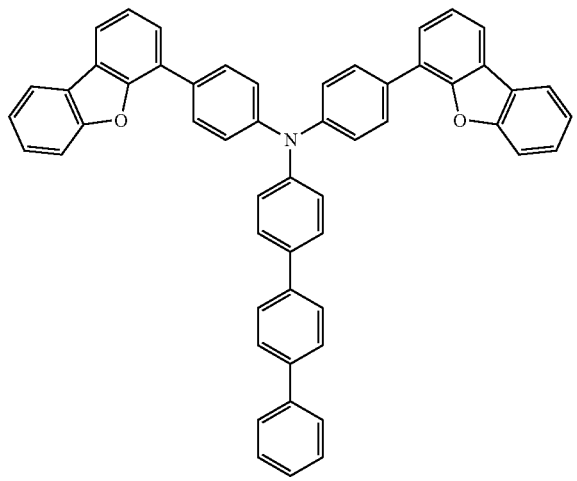

HT46

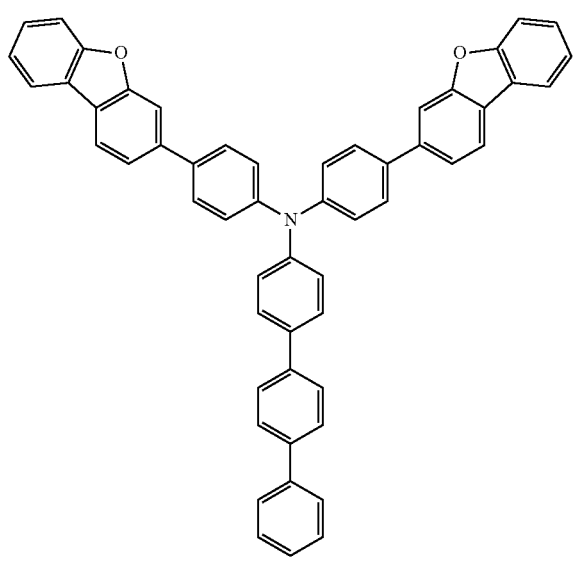

HT47

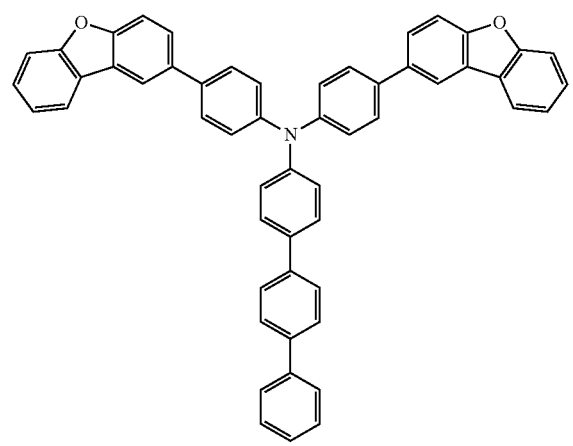

HT48

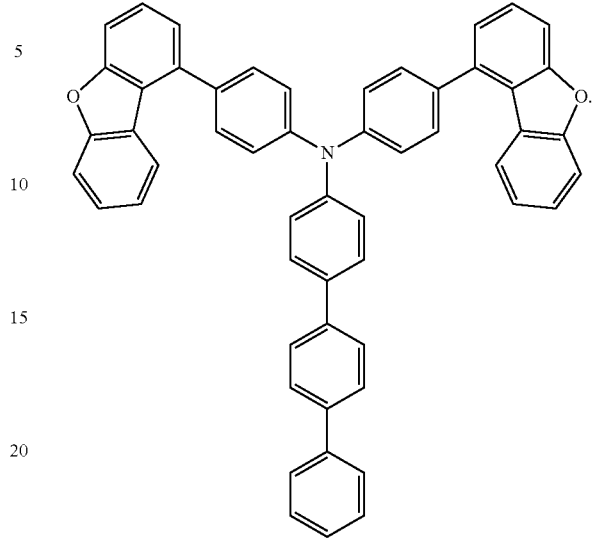

A thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer, and the hole transport layer are each independently within any of these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by the emission layer 155, and the electron blocking layer may block or reduce the flow of electrons from the electron transport layer. The emission auxiliary layer and the electron blocking layer may include any of the materials as described above.

p-Dopant

The hole transport region may further include, in addition to the materials described above, a charge-generation material for improvement of conductive properties. The charge-generation material may be homogeneously or non-homogeneously dispersed in the hole transport region.

The charge-generation material may be, for example, a p-dopant.

In one embodiment, a lowest unoccupied molecular orbital (LUMO) energy level of the p-dopant may be −3.5 eV or less.

The p-dopant may include a quinone derivative, a metal oxide, a cyano group-containing compound, or any combination thereof, but embodiments of the present disclosure are not limited thereto.

In one embodiment, the p-dopant may include at least one selected from:

a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,11-hexaazatriphenylene-hexacarbonitrile (HAT-CN); and a compound represented by Formula 221 below, but embodiments of the present disclosure are not limited thereto:

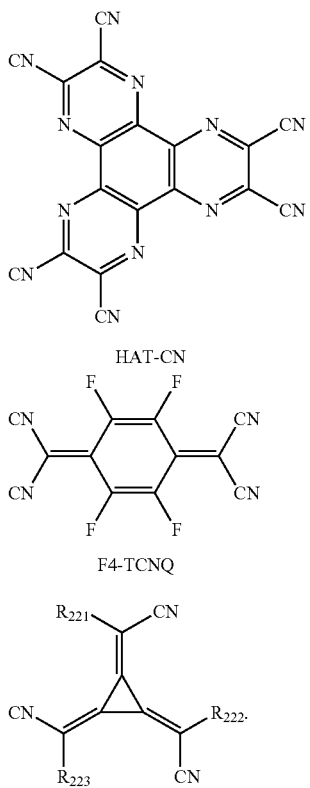

HAT-CN

F4-TCNQ

Formula 221

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Interlayer and Mixed Layer 154

Although not shown in the drawing, the organic light-emitting device 10 includes the mixed layer 154 as described herein. In addition, the interlayer as described herein may be further included.

Emission Layer 155

When the organic light-emitting device 10 is a full-color organic light-emitting device, the emission layer 155 may be patterned into a red emission layer, a green emission layer, and/or a blue emission layer, according to one or more sub-pixels. In one or more embodiments, the emission layer 155 may have a stacked structure of two or more layers selected from a red emission layer, a green emission layer, and/or a blue emission layer, in which the two or more layers contact each other or are separated from each other. In one or more embodiments, the emission layer 155 may include two or more materials selected from a red light-emitting material, a green light-emitting material, and/or a blue light-emitting material, in which the two or more materials are mixed with each other in a single layer to emit white light.

The emission layer 155 may include a host and a dopant. The host may include the second compound as described herein.

In the emission layer, an amount of the dopant in the emission layer 155 may be in a range of about 0.01 parts by weight to about 15 parts by weight based on 100 parts by weight of the host, but embodiments of the present disclosure are not limited thereto.

A thickness of the emission layer 155 may be in a range of about 100 Å to about 1,000 Å, for example, about 200 Å to about 600 Å. When the thickness of the emission layer 155 is within any of these ranges, excellent (or suitable) light-emission characteristics may be obtained without a substantial increase in driving voltage.

In one embodiment, the light emitted from the emission layer 155 of the organic light-emitting device 10 may be blue light.

Compound which can be Further Included in the Host of Emission Layer 155, in Addition to the Second Compound The host of the emission layer 155 may further include any suitable host material, in addition to the second compound as described herein.

For example, the host of the emission layer 155 may further include a compound represented by Formula 301, in addition to the second compound: Formula 301

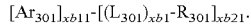

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, $R_{301}$ may be deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be 1, 2, 3, 4, or 5, and $Q_{301}$ to $Q_{303}$ may each independently be the same as described herein in connection with $Q_1$.

In one or more embodiments, when xb11 in Formula 301 is 2 or more, two or more $Ar_{301}(s)$ may be linked to each other via a single bond.

In one embodiment, the host may include a compound represented by Formula 301-1, a compound represented by Formula 301-2, or any combination thereof:

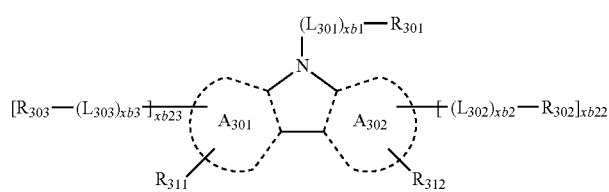

Formula 301-1

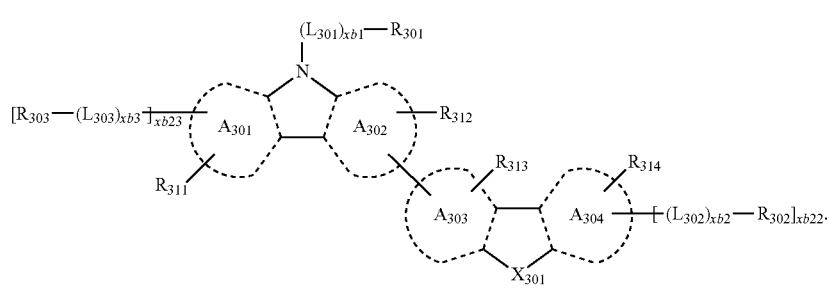

Formula 301-2

In Formulae 301-1 to 301-2, ring $A_{301}$ to ring $A_{304}$ may each independently be a $C_5$-$C_{60}$ carbocyclic group or a $C_1$-$C_{60}$ heterocyclic group, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ are the same as described above, $L_{302}$ to $L_{304}$ are each independently the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

For example, the compound which may be further included in the host in addition to the second compound may be selected from 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H27 to H55:

H27

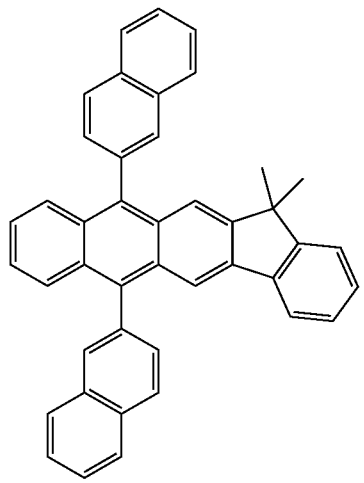

-continued

H28

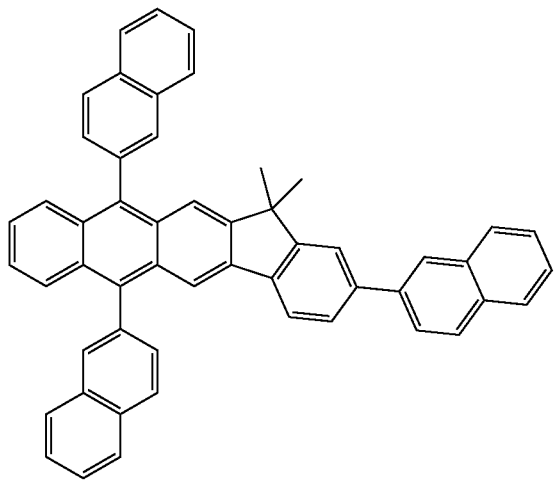

H29

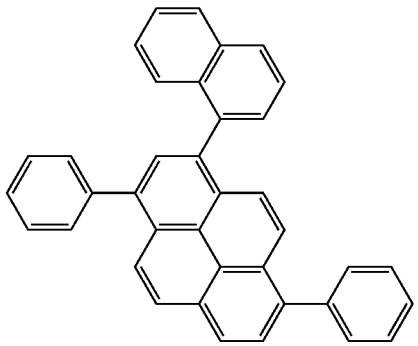

H30
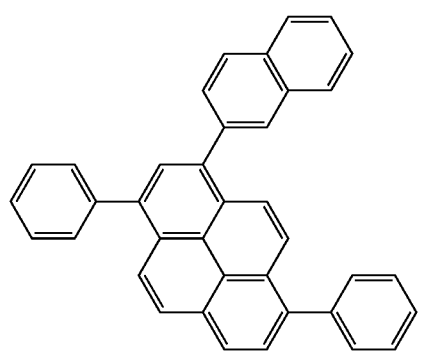
H31
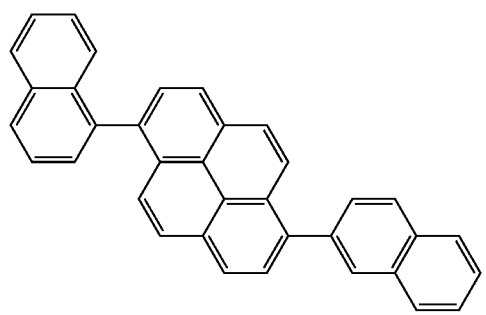
H32
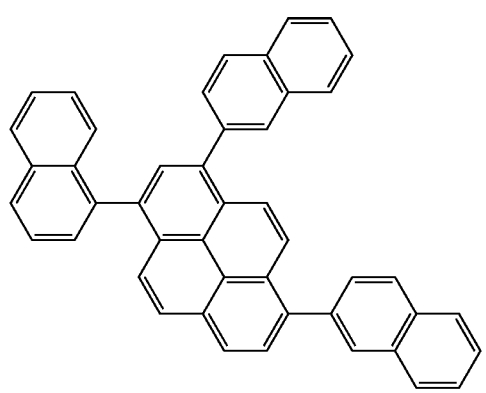
H33
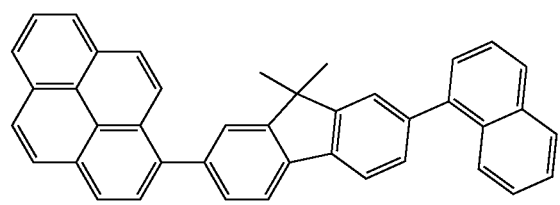
H34
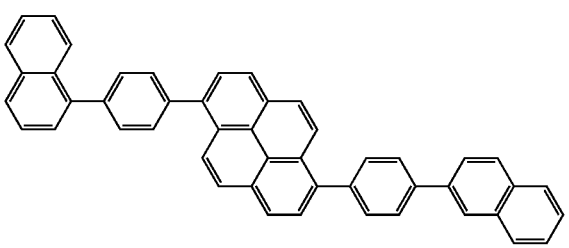
H35
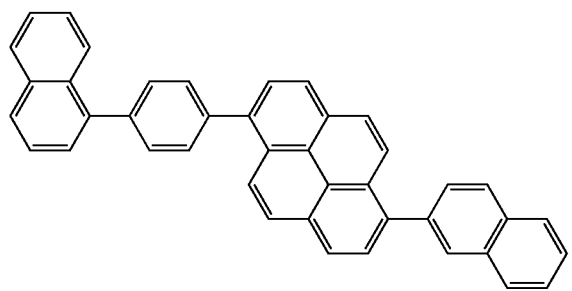
H36
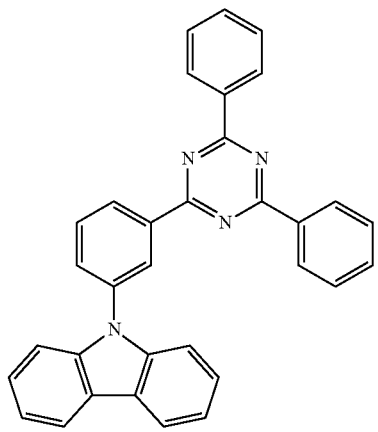
H37
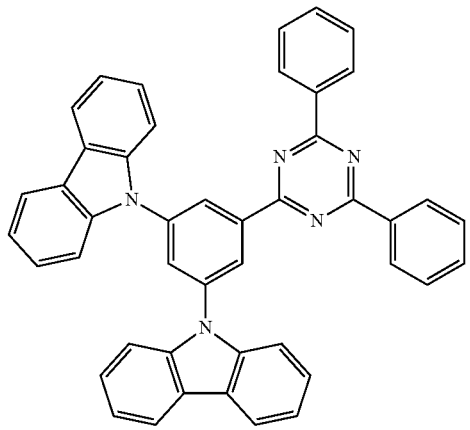
H38
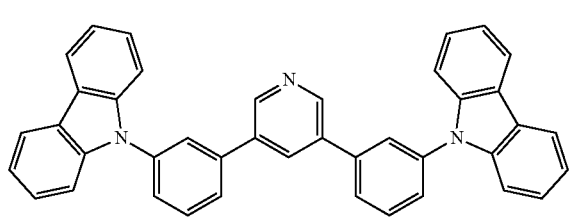

H39
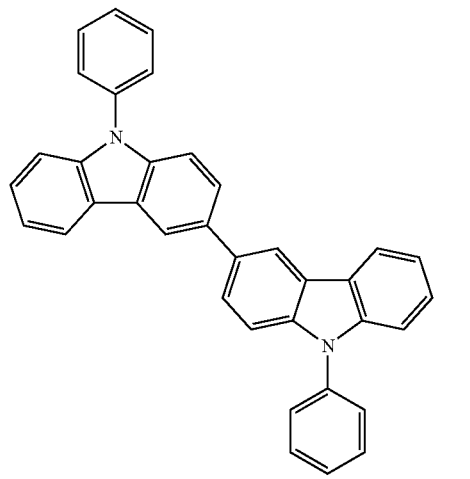
H40
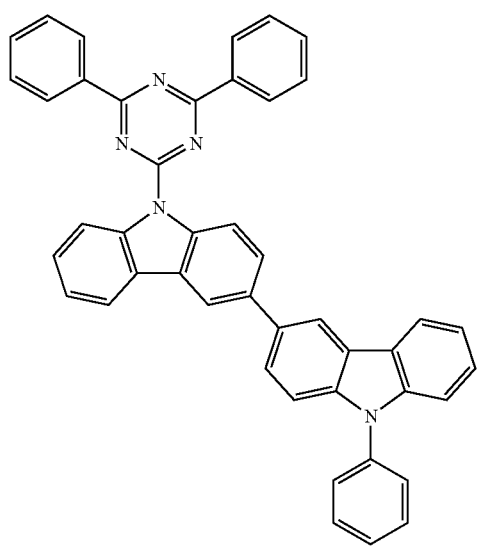
H41
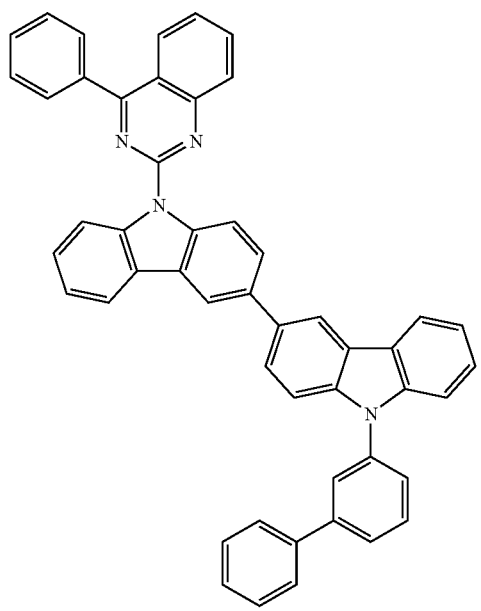
H42
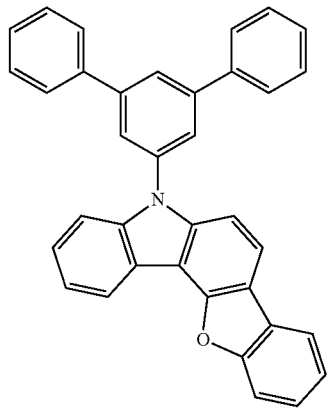
H43
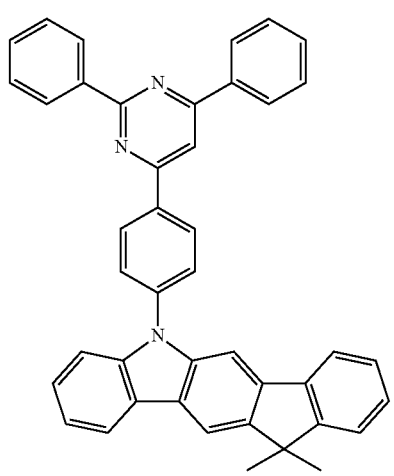
H44
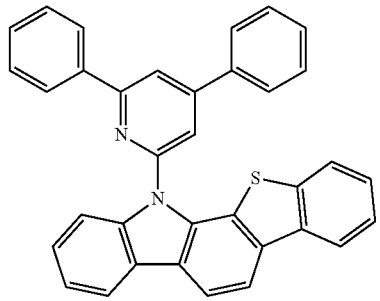
H45
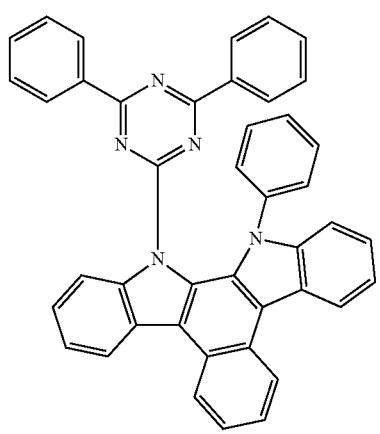

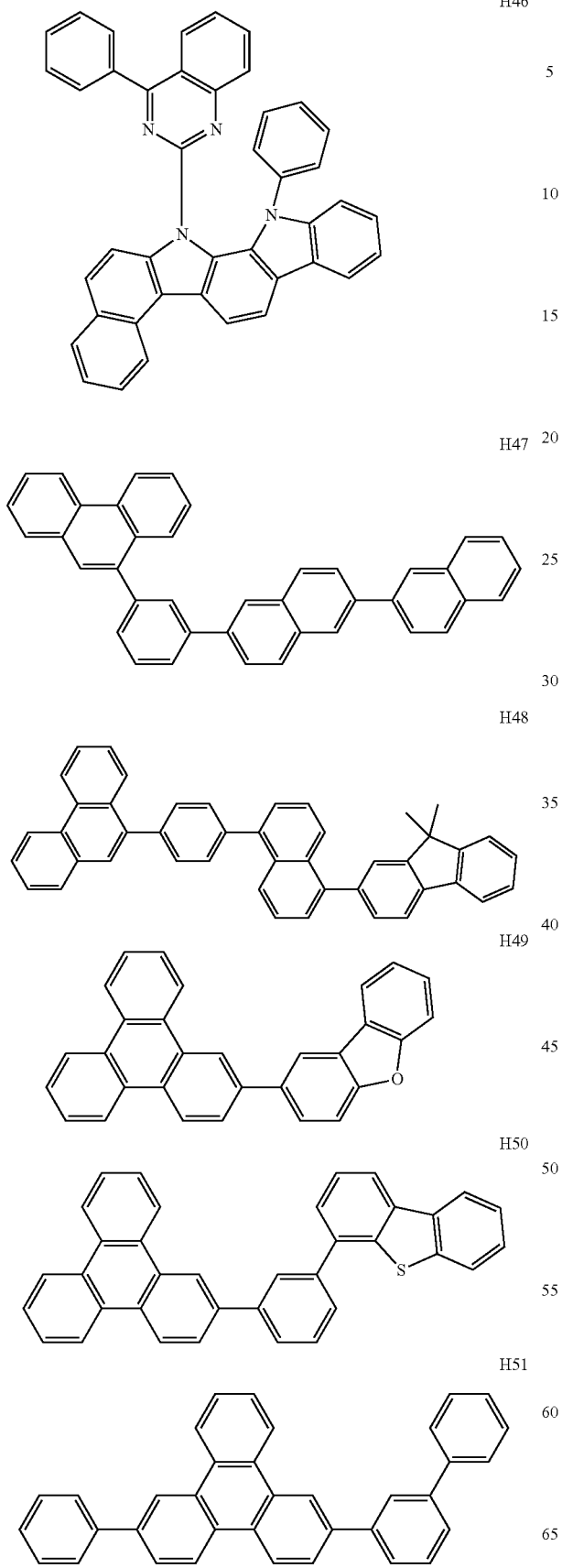
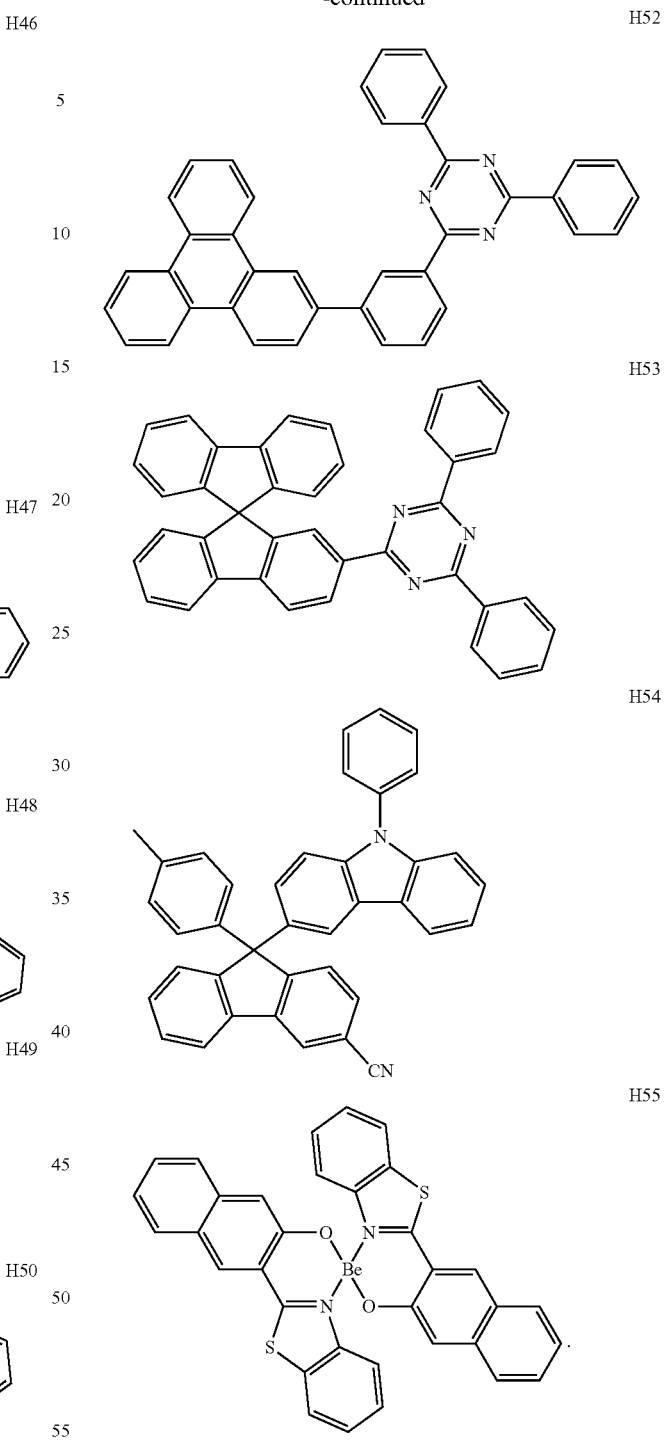

Phosphorescent Dopant in Emission Layer 155

The dopant of the emission layer 155 may include a phosphorescent dopant.

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may further include an organometallic compound represented by Formula 401:

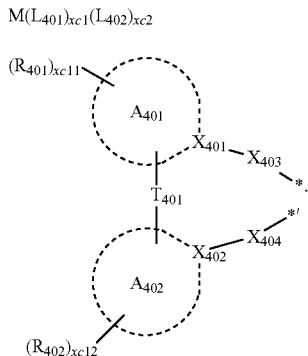

$$M(L_{401})_{xc1}(L_{402})_{xc2} \quad \text{Formula 401}$$

Formula 402

In Formulae 401 and 402,

M may be a transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more $L_{401}$(s) may be identical to or different from each other, $L_{402}$ may be an organic ligand, xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_5$-$C_{60}$ carbocyclic group or a $C_1$-$C_{60}$ heterocyclic group, $T_{401}$ may be a single bond, *—O—*', *—S—*', *—C(=O)—*', *—N(Q_{411})-*', *—C(Q_{411})(Q_{412})-*', *—C(Q_{411})=C(Q_{412})-*', *—C(Q_{411})=*', or *=C(Q_{411})=*', $X_{403}$ and $X_{404}$ may each independently be a chemical bond (for example, a covalent bond or a coordinate bond), O, S, N(Q_{413}), B(Q_{413}), P(Q_{413}), C(Q_{413})(Q_{414}), or Si(Q_{413})(Q_{414}), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si(Q_{401})(Q_{402})(Q_{403}), —N(Q_{401})(Q_{402}), —B(Q_{401})(Q_{402}), —C(=O)(Q_{401}), —S(=O)_2(Q_{401}), or —P(=O)(Q_{401})(Q_{402}), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may be nitrogen at the same time.

In one or more embodiments, when xc1 in Formula 402 is 2 or more, two rings $A_{401}$ (s) in two or more $L_{401}$ (s) may optionally be linked to each other via $T_{402}$, which is a linking group, or two rings $A_{402}$(s) in two or more $L_{401}$ (s) may optionally be linked to each other via $T_{403}$, which is a linking group. $T_{402}$ and $T_{403}$ may each independently be the same as described in connection with $T_{401}$.

$L_{402}$ in Formula 401 may be an organic ligand. For example, $L_{402}$ may be halogen group, a diketone group (for example, an acetylacetonate group), a carboxylic acid group (for example, picolinate group), —C(=O), an isonitrile group, a —CN group, a phosphorus group (for example, a phosphine group and/or a phosphite group), or any combination thereof, but embodiments of the present disclosure are not limited thereto.

Fluorescent Dopant in Emission Layer 155

The dopant of the emission layer 155 may include a fluorescent dopant.

The fluorescent dopant may include amine group-containing compound, a styryl group-containing compound, or any combination thereof.

For example, the fluorescent dopant may include a compound represented by Formula 501:

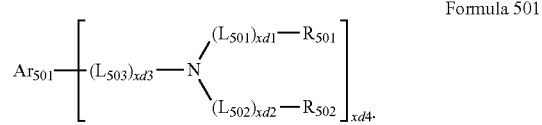

Formula 501

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be 0, 1, 2, or 3, $R_{501}$ and $R_{502}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, xd4 may be 1, 2, 3, 4, 5, or 6.

For example, Ar$_{501}$ in Formula 501 may be a condensed cyclic ring (for example, an anthracene group, a chrysene group, a pyrene group, etc.) in which three or more monocyclic groups are condensed (e.g., fused).

In one embodiment, xd4 in Formula 501 may be 2, but embodiments of the present disclosure are not limited thereto.

In one embodiment, Ar$_{501}$ in Formula 501 may be a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, or an indenophenanthrene group, each independently unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, or any combination thereof.

In one or more embodiments, L$_{501}$ to L$_{503}$ in Formula 501 may each independently be a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, or a pyridinylene group, each independently unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, or any combination thereof.

In one or more embodiments, R$_{501}$ and R$_{502}$ in Formula 501 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si(Q$_{31}$)(Q$_{32}$)(Q$_{33}$), or any combination thereof.

For example, the fluorescent dopant may be selected from Compounds FD1 to FD22:

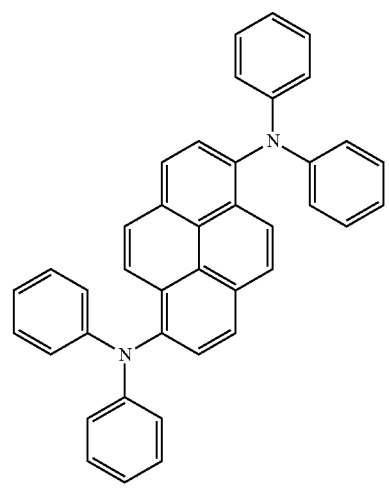

FD1

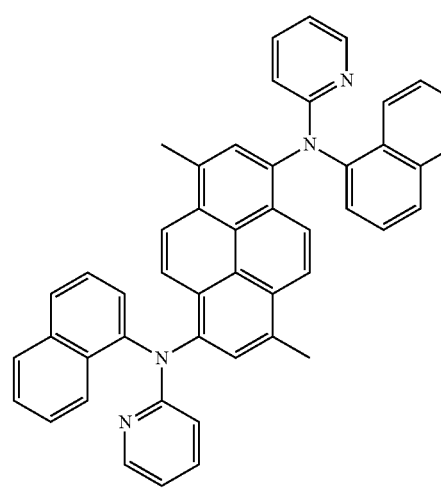

FD2

FD3
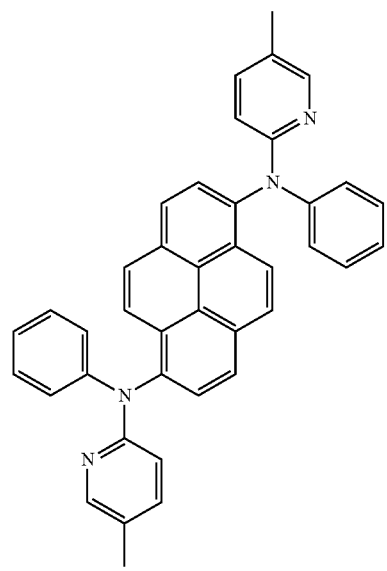
FD4
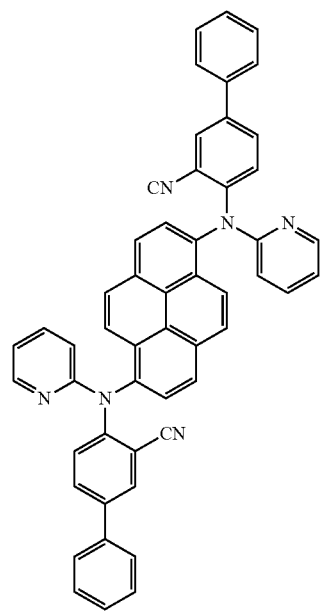
FD5
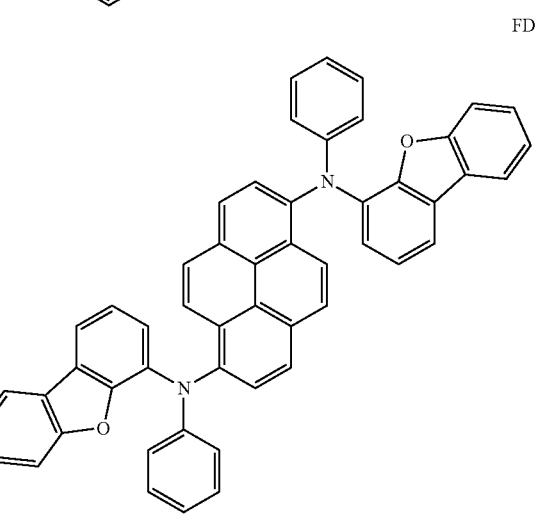
FD6
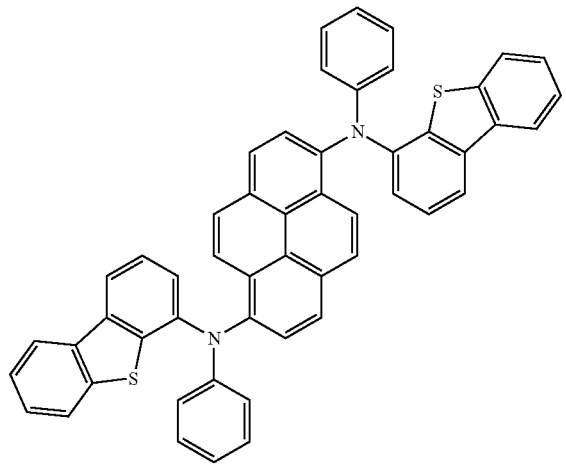
FD7
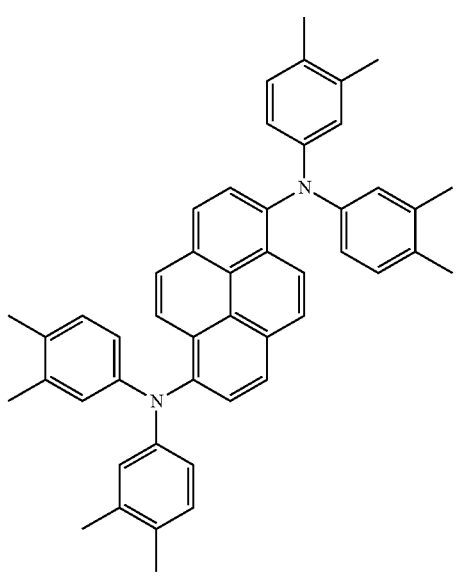
FD8
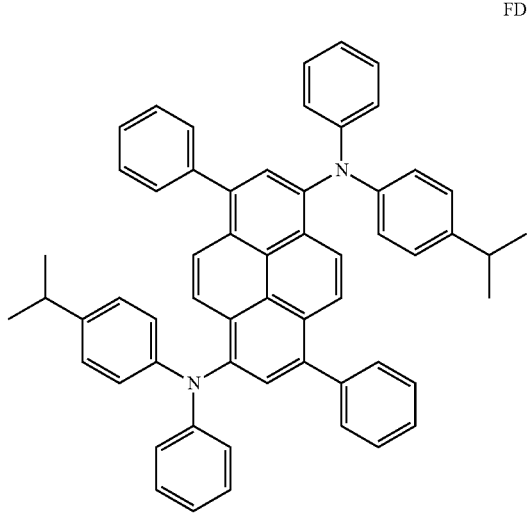

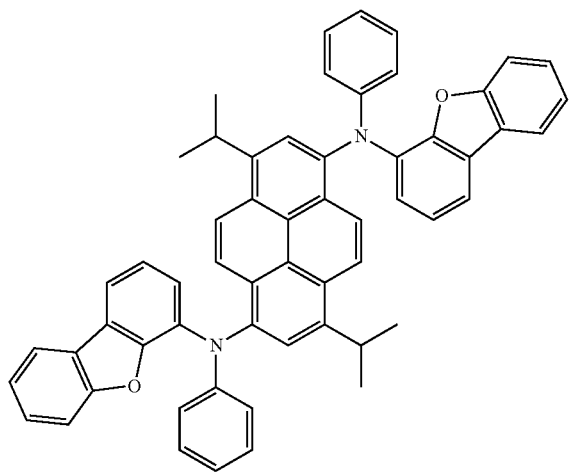
FD9
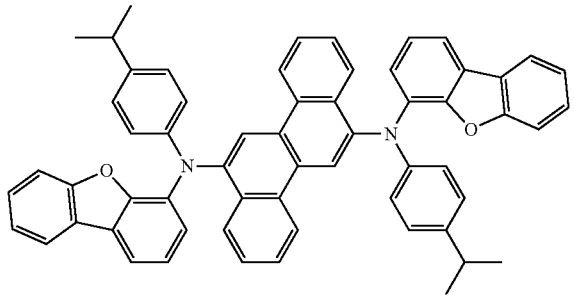
FD13
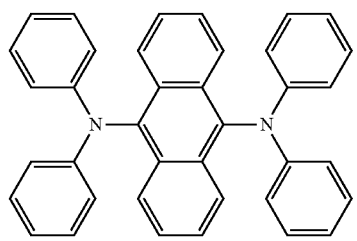
FD14
FD10
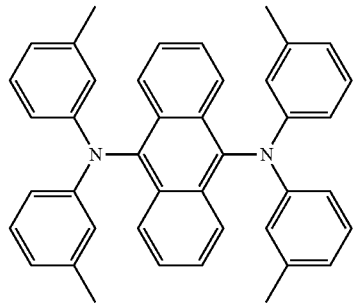
FD15
FD11
FD16
FD12
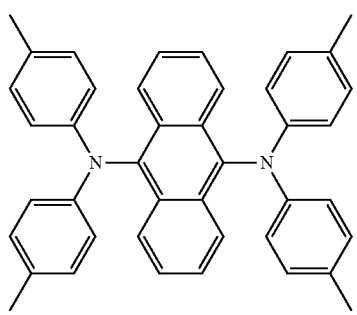
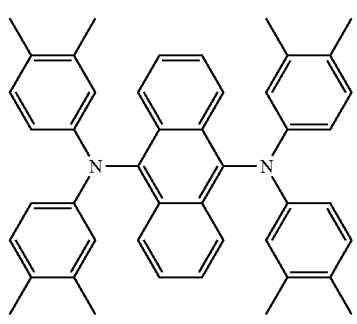
FD17

FD18
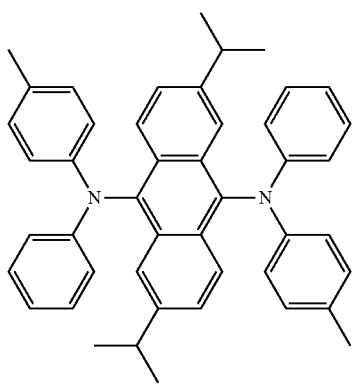

FD19
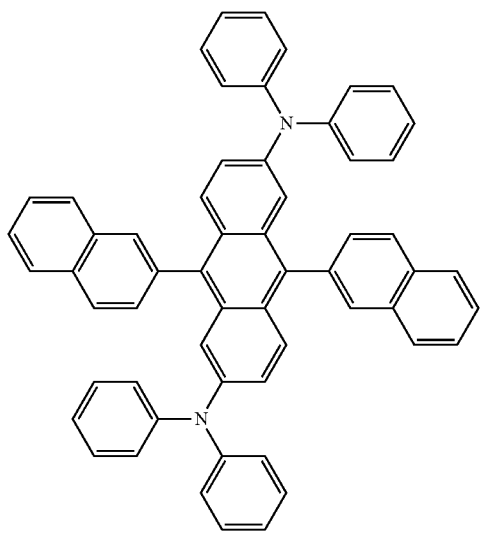

FD20
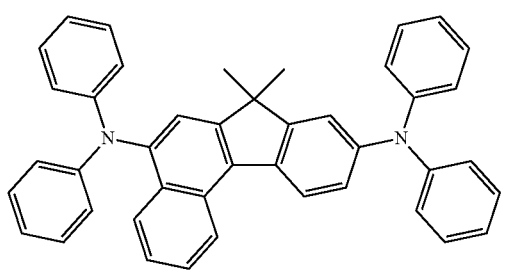

FD21
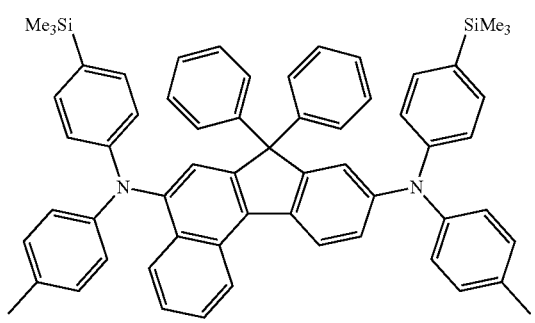

FD22
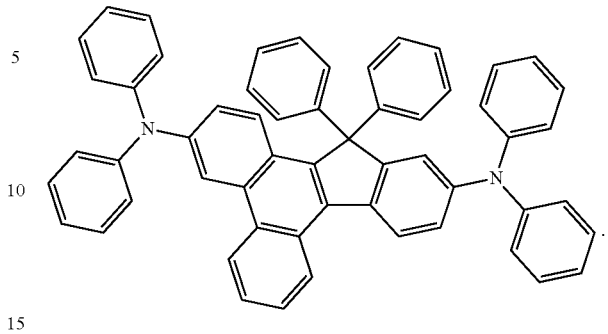

Buffer Layer 156

The buffer layer 156 as described herein may be located on the emission layer 155.

Electron Transport Region

Although not shown in the drawing, the organic light-emitting device 10 may further include an electron transport region located between the buffer layer 156 and the second electrode 190.

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include a buffer layer, a hole blocking layer, an electron control layer, an electron transport layer, an electron injection layer, or any combination thereof.

For example, the electron transport region may include an electron transport layer and/or an electron injection layer which are sequentially stacked from the buffer layer 156.

The electron transport region may include a metal-free compound including at least one π electron-depleted nitrogen ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

For example, the electron transport region may include a compound represented by Formula 601 below:

$$[Ar_{601}]_{xe11}\text{-}[(L_{601})_{xe1}\text{-}R_{601}]_{xe21}. \quad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xe1 may be an integer from 0 to 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the π electron-depleted nitrogen-containing ring.

In one embodiment, ring $Ar_{601}$ in Formula 601 may be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each independently unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, $-Si(Q_{31})(Q_{32})(Q_{33})$, $-S(=O)_2(Q_{31})$, $-P(=O)(Q_{31})(Q_{32})$, or any combination thereof.

When xe11 in Formula 601 is 2 or more, two or more $Ar_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1 below:

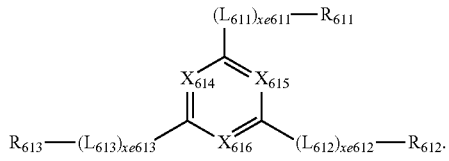

Formula 601-1

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, or a naphthyl group.

In one embodiment, $L_{601}$ and $L_{611}$ to $L_{613}$ in Formulae 601 and 601-1 may each independently be a phenylene group, a naphthylene group, a fluorenylene group, a spirobifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, or azacarbazolylene group, each independently unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof; or —S($=$O)$_2$(Q$_{601}$), or —P($=$O)(Q$_{601}$)(Q$_{602}$), wherein Q$_{601}$ and Q$_{602}$ may each independently be the same as described herein in connection with Q$_1$.

The electron transport region may include at least one compound selected from Compounds ET1 to ET37, but embodiments of the present disclosure are not limited thereto:

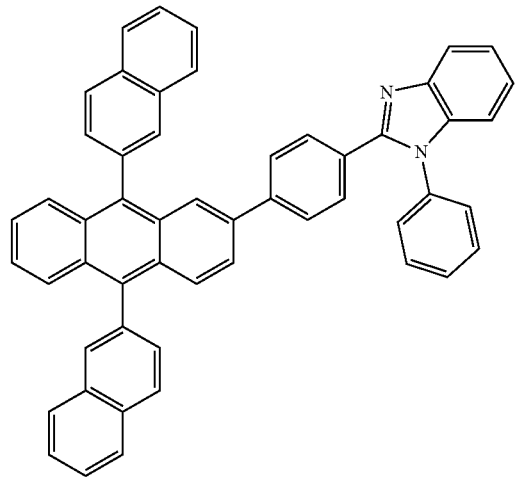

ET1

ET2 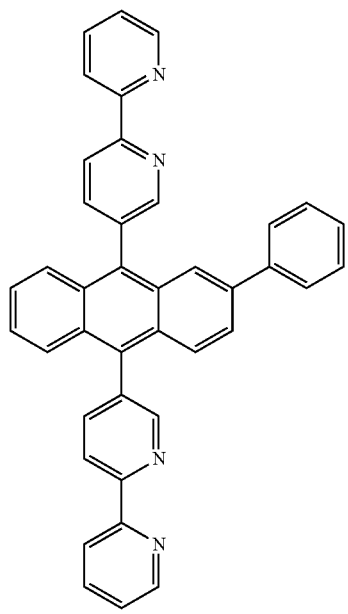
ET3 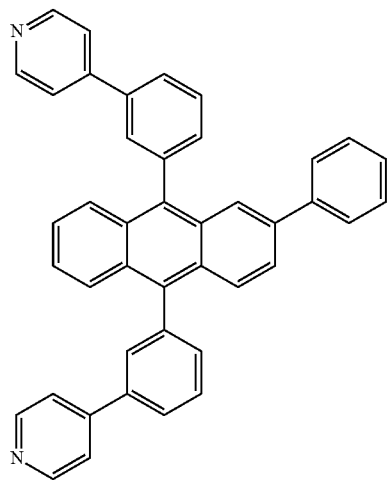
ET4 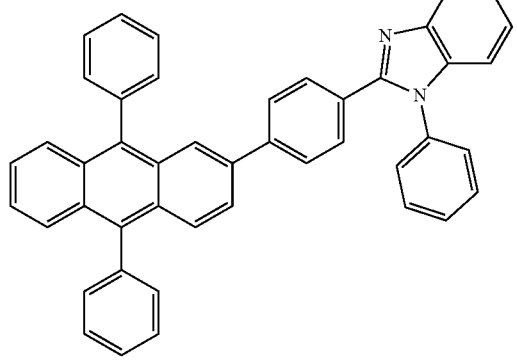
ET5 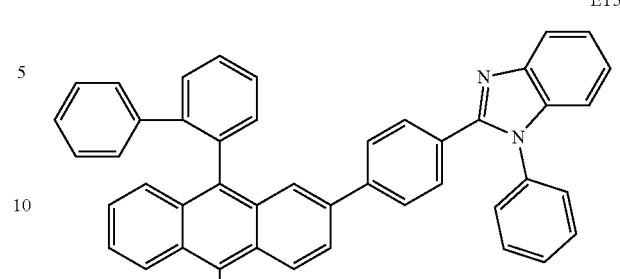
ET6 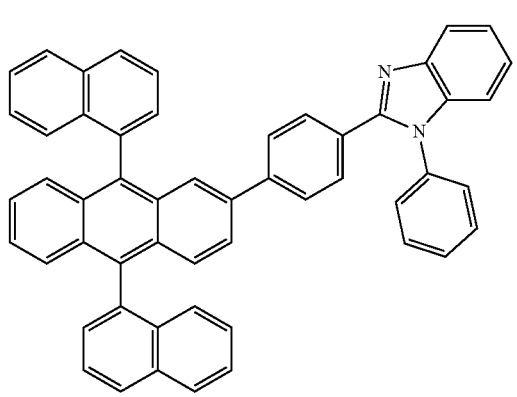
ET7 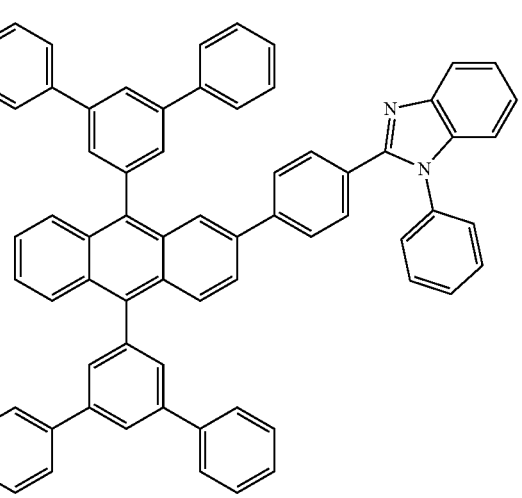

ET8
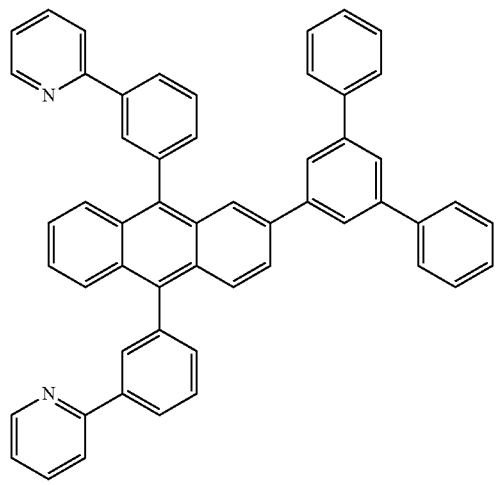
ET10
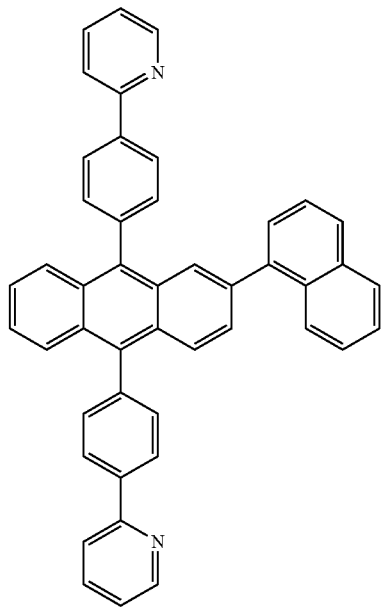
ET11
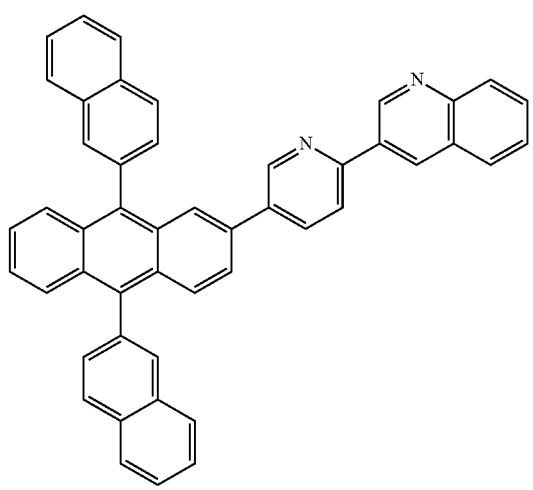
ET9
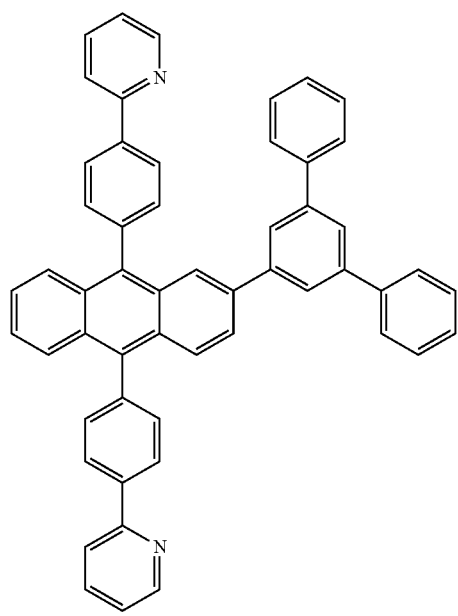
ET12
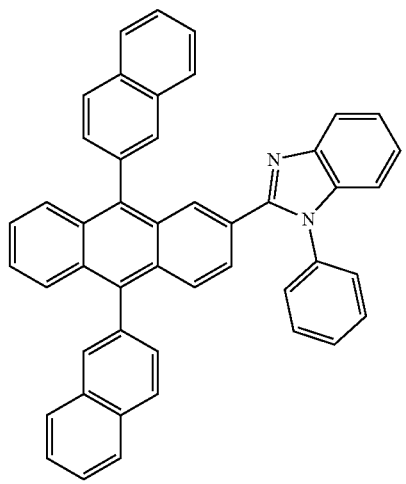

ET13
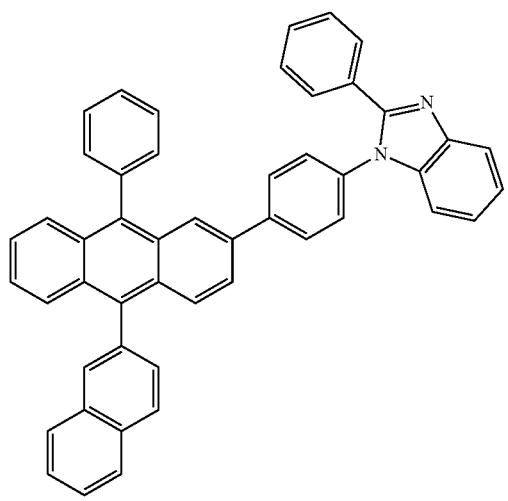
ET14
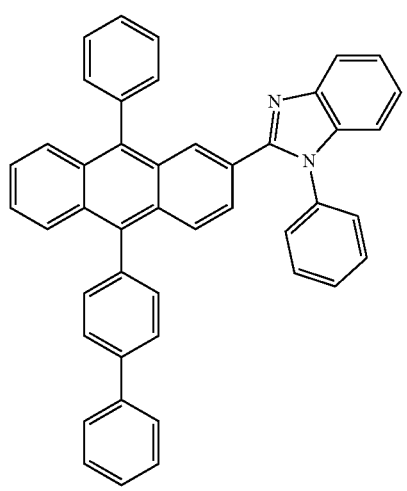
ET15
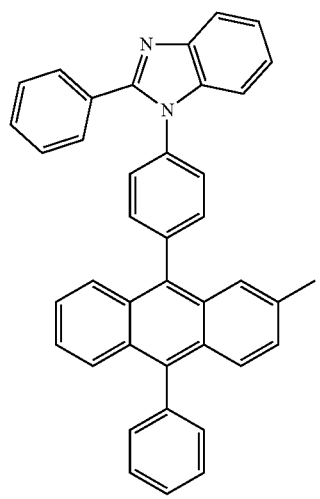
ET16
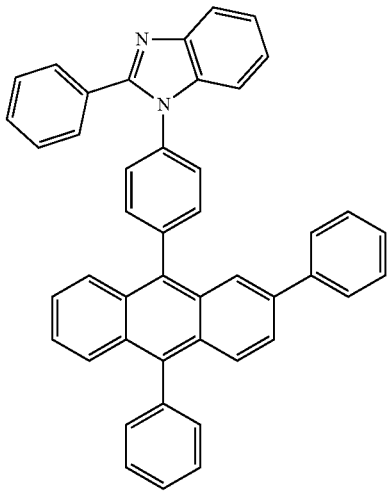
ET17
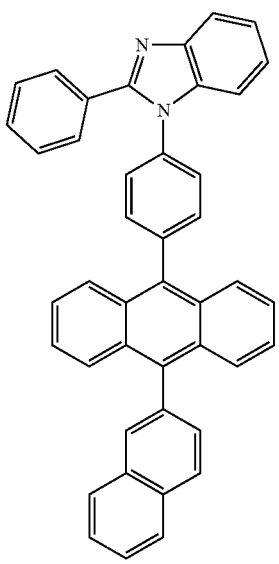
ET18
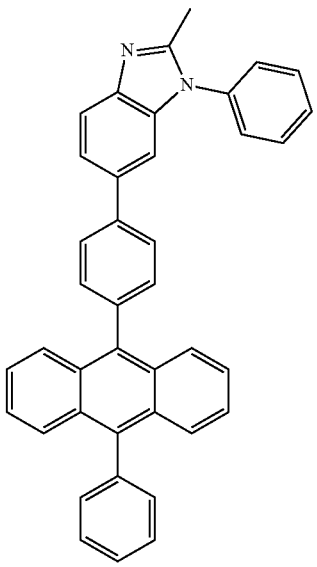

ET19
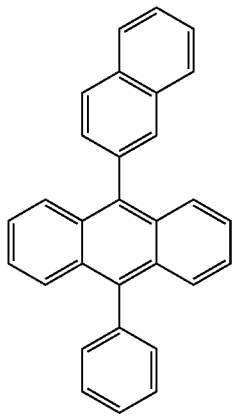
ET20
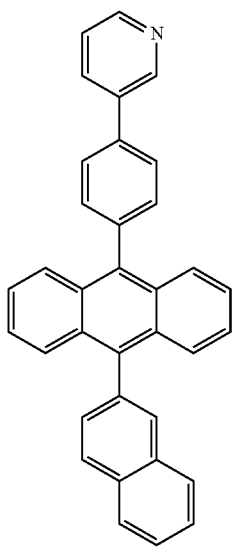
ET21
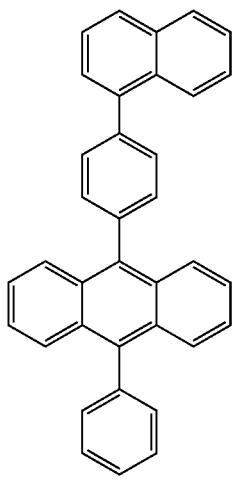
ET22
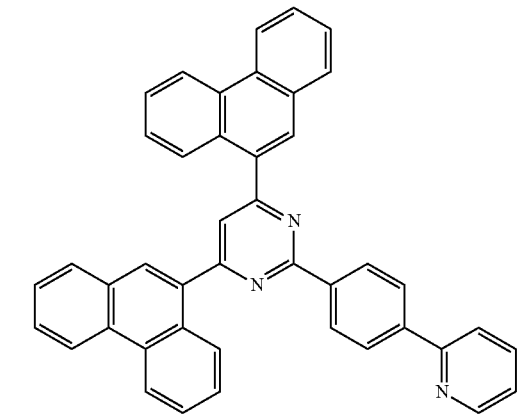
ET23
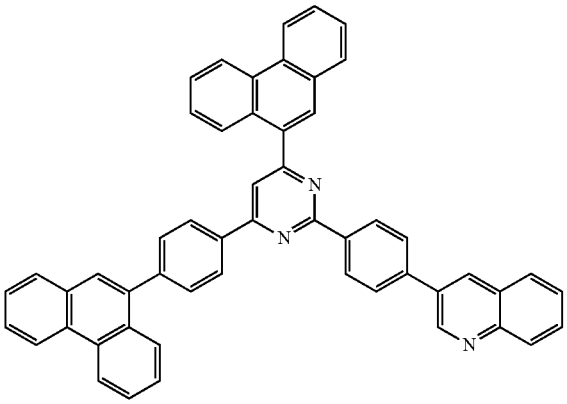
ET24
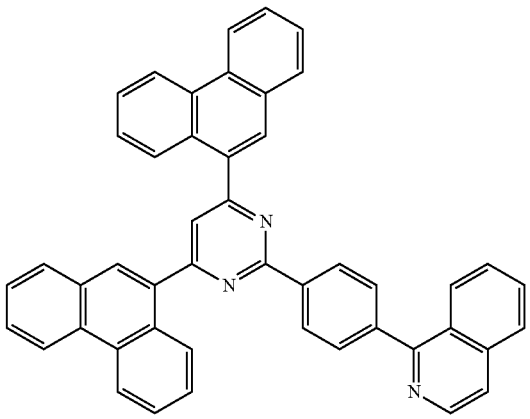

ET25
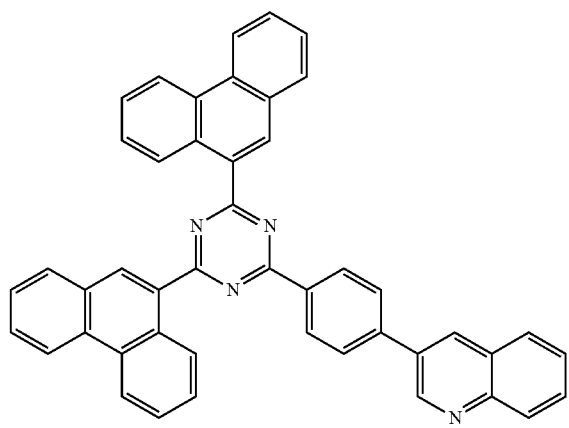
ET26
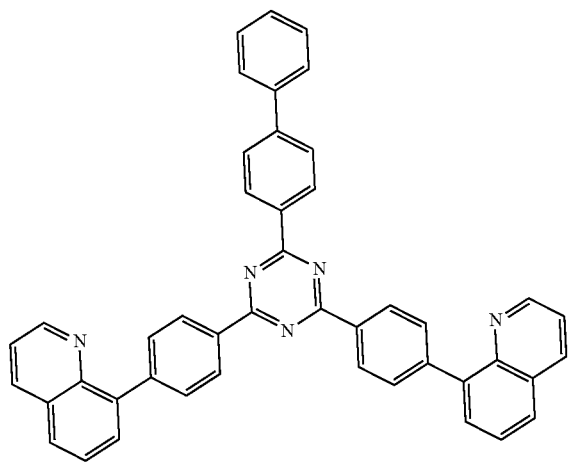
ET27
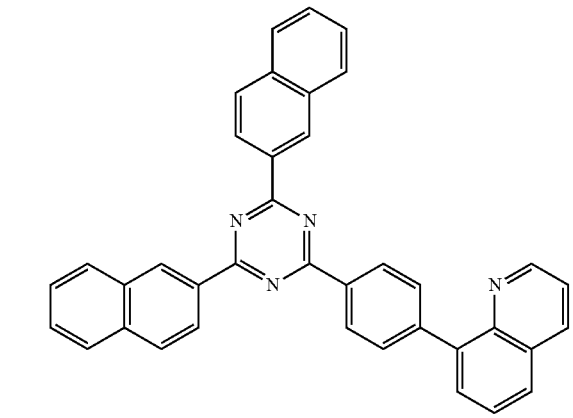
ET28
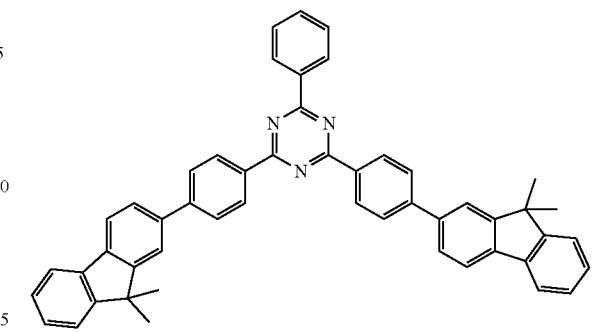
ET29
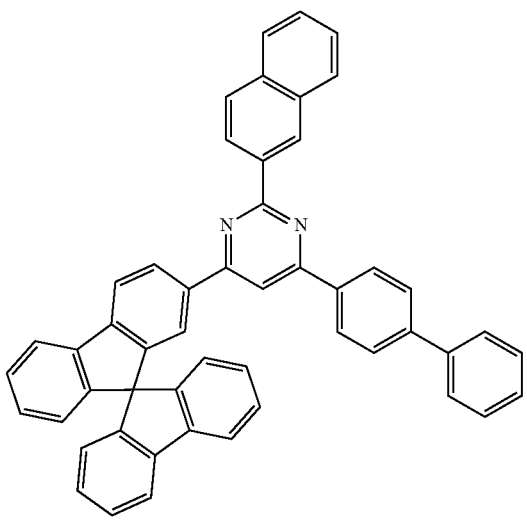
ET30
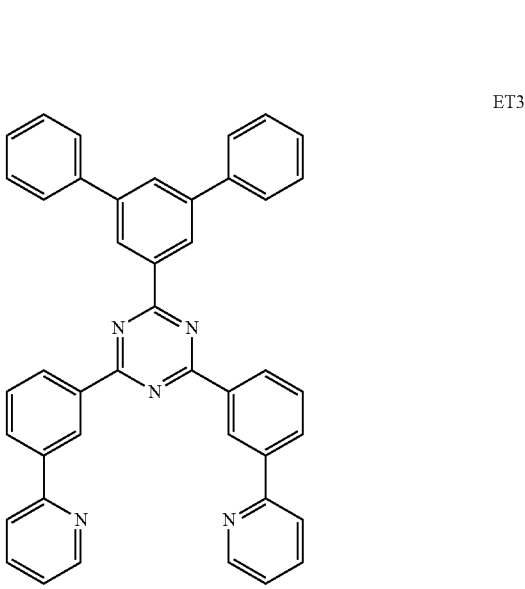

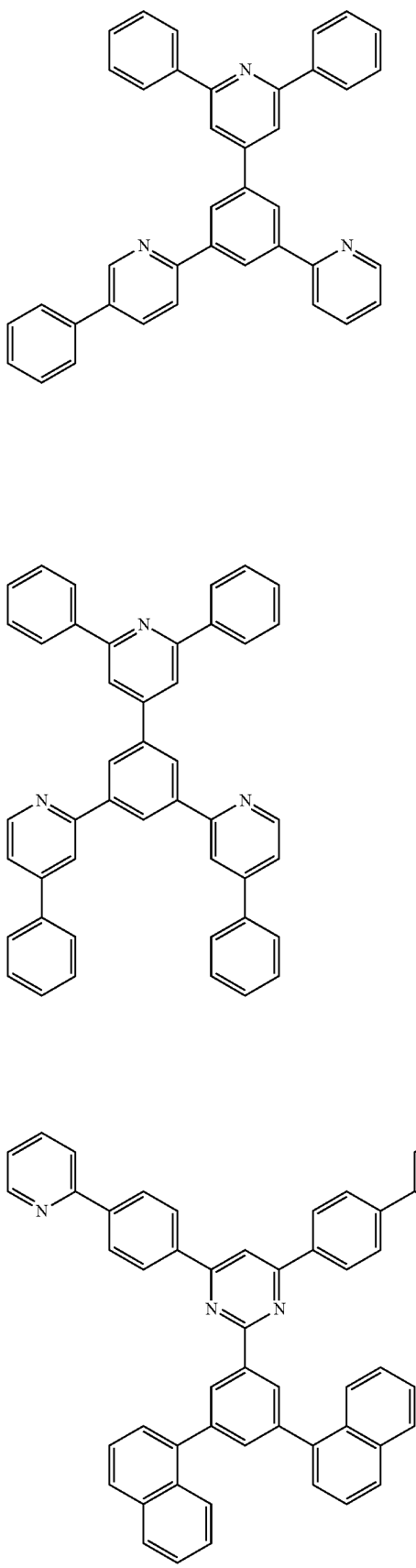
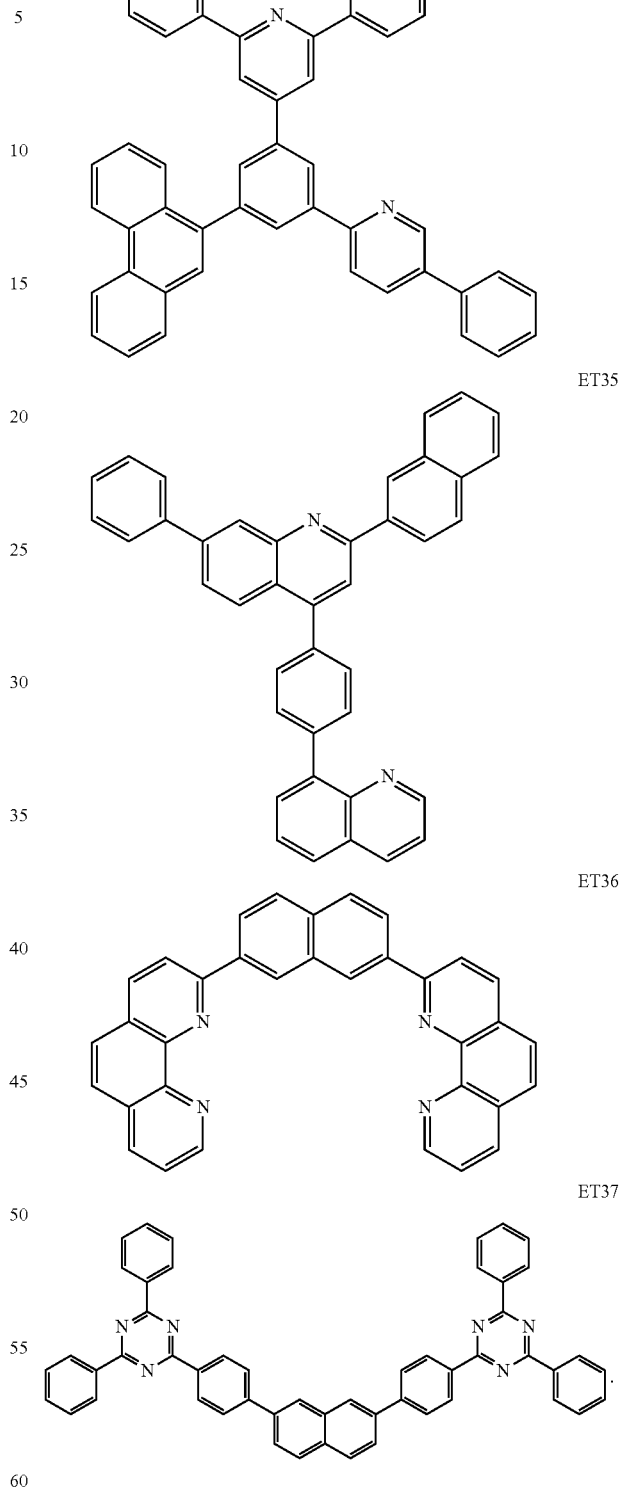
In one or more embodiments, the electron transport region may include at least one compound selected from 2,9-dimethyl-4,7-diphenyl-1,10-phenanthroline (BCP), 4,7-diphenyl-1,10-phenanthroline (Bphen), Alq3, BAlq, 3-(biphenyl-4-yl)-5-(4-tert-butylphenyl)-4-phenyl-4H-1,2,4-triazole (TAZ), and NTAZ.

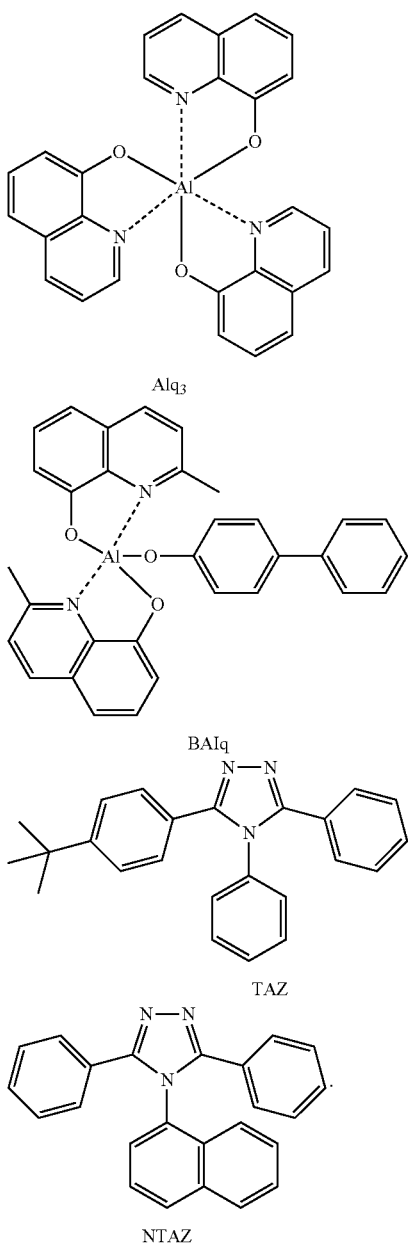

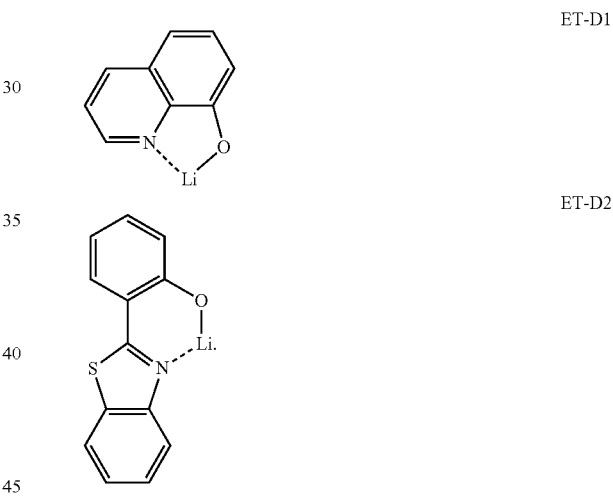

Thicknesses of the buffer layer (in the electron transport region), the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are each independently within any of these ranges, excellent (or suitable) hole blocking characteristics and/or (or suitable) excellent electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within any of the ranges described above, the electron transport layer may have satisfactory (or suitable) electron transport characteristics without a substantial increase in driving voltage.

The electron transport region (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may each independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) and/or Compound ET-D2:

The electron transport region may include an electron injection layer that facilitates electron injection from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, and/or iodides) of the alkali metal, the alkaline earth-metal, and the rare earth metal, respectively.

The alkali metal compound may be selected from alkali metal oxides (such as $Li_2O$, $Cs_2O$, and/or $K_2O$), and alkali metal halides (such as LiF, NaF, CsF, KF, LiI, NaI, CsI, and/or KI). In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ (0<x<1), and/or $Ba_xCa_{1-x}O$ (0<x<1). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Sc_2O_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may respectively include an ion of alkali metal, alkaline earth-metal, and rare earth metal as described above, and a ligand coordinated with a metal ion of the alkali metal complex, the alkaline earth-metal complex, or the rare earth metal complex may each independently be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (e.g., may consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within any of the ranges described above, the electron injection layer may have satisfactory (or suitable) electron injection characteristics without a substantial increase in driving voltage.

Second Electrode 190

The second electrode 190 may be located above the buffer layer 156 and/or the electron transport region as described above. The second electrode 190 may be a cathode, which is an electron injection electrode, and in this regard, a material for forming the second electrode 190 may be selected from a metal, an alloy, an electrically conductive compound, and combinations thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure or a multi-layered structure including two or more layers.

The thickness of the second electrode 190 may be, for example, from about 10 nm to about 1000 nm, and from about 100 nm to about 300 nm.

Capping Layer

A first capping layer may be located outside the first electrode 110, and/or a second capping layer may be located outside the second electrode 190. In one embodiment, the organic light-emitting device 10 may include: the first capping layer, the first electrode 110, the mixed layer 154, the emission layer 155, the buffer layer 156, and the second electrode 190, which are sequentially stacked in this stated order; the first electrode 110, the mixed layer 154, the emission layer 155, the buffer layer 156, the second electrode 190, and the second capping layer, which are sequentially stacked in this stated order; or the first capping layer, the first electrode 110, the mixed layer 154, the emission layer 155, the buffer layer 156, the second electrode 190, and the second capping layer, which are sequentially stacked in this stated order.

Light generated by the emission layer 155 of the organic light-emitting device 10 may be extracted to the outside through the first electrode 110, which is a semi-transparent electrode or a transparent electrode, and the first capping layer, and/or light generated by the emission layer 155 of the organic light-emitting device 10 may be extracted outside through the second electrode 190, which is a semi-transparent electrode or a transparent electrode, and the second capping layer.

The first capping layer and the second capping layer may increase external light-emission efficiency according to the principle of constructive interference.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-based complex, or a combination thereof. The carbocyclic compound, the heterocyclic compound, and the amine group-containing compound may each independently be optionally substituted with a substituent containing O, N, S, Se, Si, F, Cl, Br, I, or any combination thereof. In one embodiment, at least one selected from the first capping layer and the second capping layer may each independently include an amine group-containing compound.

For example, at least one of the first capping layer or the second capping layer may each independently include a compound represented by Formula 201, a compound represented by Formula 202, or any combination thereof.

Apparatus

The organic light-emitting device 10 may be included in various suitable apparatuses. For example, a light-emitting apparatus, an authentication apparatus, and/or an electronic apparatus, which includes the organic light-emitting device 10, may be provided.

The light-emitting apparatus may further include a thin-film transistor, in addition to the organic light-emitting device 10 as described above. The thin-film transistor may include a source electrode, a drain electrode, and an active layer, and any one selected from the source electrode and the drain electrode may be electrically connected to one of the first electrode 110 or the second electrode 190 of the organic light-emitting device 10.

The thin-film transistor may further include a gate electrode, a gate insulation layer, and/or the like.

The active layer may include crystalline silicon, amorphous silicon, organic semiconductor, oxide semiconductor, and/or the like, but embodiments of the present disclosure are not limited thereto.

The light-emitting apparatus may further include a sealing portion for sealing the organic light-emitting device 10. The sealing portion may be located between the color filter and the organic light-emitting device 10. The sealing portion allows light from the organic light-emitting device 10 to be extracted to the outside, while simultaneously (or concurrently) preventing (or reducing) external air and moisture from penetrating into the organic light-emitting device 10. The sealing portion may be a sealing substrate including a transparent glass or a plastic substrate. The sealing part may be a thin film encapsulation layer including a plurality of organic layers and/or a plurality of inorganic layers. When the sealing portion is a thin film encapsulation layer, the light-emitting apparatus may be flexible.

The light-emitting apparatus may be used as various suitable displays, light sources, and the like.

The authentication apparatus may be, for example, a biometric authentication apparatus for authenticating an individual by using biometric information of a biometric body (for example, a finger tip, a pupil, and/or the like).

The authentication apparatus may further include, in addition to the organic light-emitting device 10, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, and/or endoscope displays), fish finders, various measuring instruments, meters (for example, meters for a vehicle, an aircraft, and/or a vessel), projectors, and/or the like, but embodiments of the present disclosure are not limited thereto.

Preparation Method

Respective layers constituting the hole transport region, the emission layer, the electron transport layer, and other layers (including, without limitation, the interlayer, the mixed layer 154, and the buffer layer 156) may each be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, the electron transport layer, and the other layers are each independently formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed, and the structure of a layer to be formed.

When layers constituting the hole transport region, the emission layer, the electron transport layer, and the other layers are each independently formed by spin coating, the spin coating may be performed at a coating speed of about 2,000 rpm to about 5,000 rpm and at a heat treatment temperature of about 80° C. to 200° C. by taking into account a material to be included in a layer to be formed and the structure of a layer to be formed.

General Definition of Substituents

The term "$C_1$-$C_{60}$ alkyl group" as used herein refers to a linear or branched aliphatic hydrocarbon monovalent group having 1 to 60 carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at either terminus of a $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at either terminus of a $C_2$-$C_{60}$ alkyl group, and non-limiting examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and non-limiting examples thereof include a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1]pentyl group, a bicyclo[2.1.1]hexyl group, a bicyclo[2.2.1]heptyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group with 1 to 10 carbon atoms and containing a heteroatom (for example, N, O, Si, P, S, or any combination thereof) as a ring-forming atom, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group with 1 to 10 carbon atoms and containing a heteroatom (for example, N, O, Si, P, S, or any combination thereof) as a ring-forming atom, wherein the ring has at least one double bond. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. The term "$C_6$-$C_{60}$ arylene group" used herein refers to a divalent group having the same structure as that of the $C_6$-$C_{60}$ aryl group. When the $C_6$-$C_{60}$ aryl group and the $C_6$-$C_{60}$ arylene group each independently include two or more rings, the respective two or more rings may be fused to each other.

The term "$C_1$-$C_{60}$ heteroaryl group" as used herein refers to a monovalent heterocyclic aromatic system having a hetero atom (for example, N, O, Si, P, S, or any combination thereof) as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. The term "$C_1$-$C_{60}$ heteroarylene group" as used herein refers to a divalent group having the same structure as the $C_1$-$C_{60}$ heteroaryl group. When the $C_1$-$C_{60}$ heteroaryl group and the $C_1$-$C_{60}$ heteroarylene group each independently include two or more rings, the respective two or more rings may be condensed with each other.

The term "$C_6$-$C_{60}$ aryloxy group" as used herein refers to a monovalent group represented by —$OA_{102}$ (wherein $A_{102}$ is the $C_6$-$C_{60}$ aryl group), and a $C_6$-$C_{60}$ arylthio group used herein refers to a monovalent group represented by —$SA_{103}$ (wherein $A_{103}$ is the $C_6$-$C_{60}$ aryl group).

The term "monovalent non-aromatic condensed polycyclic group" as used herein refers to a monovalent group having two or more rings condensed with each other, only carbon atoms as ring-forming atoms (e.g., having 8 to 60 carbon atoms), and no aromaticity in its entire molecular structure (e.g., the molecular structure as a whole is non-aromatic). Non-limiting examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group in which two or more rings are condensed to each other, which includes, as a ring-forming atom, a heteroatom (for example, N, O, Si, P, and S, or any combination thereof) other than carbon atoms, and which has no aromaticity in its entire molecular structure (e.g., the molecular structure as a whole is non-aromatic). Non-limiting examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon atoms as ring-forming atoms and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a compound (such as benzene), a monovalent group (such as a phenyl group), and/or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

Non-limiting examples of the $C_5$-$C_{60}$ carbocyclic group include a cyclopropane group, a cyclobutane group, a cyclopentane group, a cyclohexane group, a cycloheptane group, a cyclooctane group, an adamantane group, a norbonane group, a bicyclo[1.1.1]pentane group, a bicyclo[2.1.1]hexane group, a bicyclo[2.2.1]heptane group, a bicyclo[2.2.2]octane group, a cyclopentadiene group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and an indenoanthracene group.

The term "$C_1$-$C_{60}$ heterocyclic group" as used herein refers to a monocyclic or polycyclic group which includes 1 to 60 carbon atoms and, as a ring-forming atom, a heteroatom (for example, N, O, Si, P, S, or any combination specifically), in addition to carbon atoms (the carbon number may be 1 to 60). The $C_1$-$C_{60}$ heterocyclic group may be an aromatic heterocyclic group or a non-aromatic heterocyclic group. The $C_1$-$C_{60}$ heterocyclic group may be a compound (such as a pyridine), a monovalent group (such as a pyridinyl group), and/or a divalent group (such as a pyridinylene group). In one or more embodiments, depending on the number of substituents connected to the $C_1$-$C_{60}$ heterocyclic group, the $C_1$-$C_{60}$ heterocyclic group may be a trivalent group or a quadrivalent group.

Non-limiting examples of the $C_1$-$C_{60}$ heterocyclic group include a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthoindole group, an isoindole group, a benzo isoindole group, a naphthoisoindole group, a benzosilole group, a benzothiophene group, a benzofuran group, a carbazole group, a dibenzosilole group, a dibenzothiophene group, a dibenzofuran group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and a benzothienodibenzothiophene group.

The "$C_1$-$C_{60}$ cyclic group" as used herein may be, for example, a $C_5$-$C_{60}$ carbocyclic group or a $C_1$-$C_{60}$ heterocyclic group.

The term "π electron-depleted nitrogen-containing $C_1$-$C_{60}$ heterocyclic group" as used herein refers to a $C_1$-$C_{60}$ heterocyclic group having at least one *—N=*' moiety as a ring-forming moiety, and the term "π-electron-rich $C_5$-$C_{60}$ cyclic group" as used herein refers to a $C_5$-$C_{60}$ cyclic group having *—N=*' moiety as a ring-forming moiety.

For example, the π electron-depleted nitrogen-containing $C_1$-$C_{60}$ heterocyclic group may be i) a first ring (for example, a triazine group and/or the like), ii) a condensed ring in which two or more first rings are condensed with each other (for example, an oxazolopyridine group and/or the like) or iii) a condensed ring in which one or more first rings are condensed with one or more second rings (for example, a quinoline group and/or the like); and the π-electron-rich $C_5$-$C_{60}$ cyclic group may be a) a monocyclic group including a second ring (for example, a benzene group and/or the like) or b) a condensed ring in which two or more second rings are condensed with each other (for example, a dibenzofuran group and/or the like), the first ring may be a pyridine group, a pyrimidine group, a pyrazine group, a pyridazine group, a triazine group, a pyrazole group, an imidazole group, a triazole group, a tetrazole group, an oxazole group, an isooxazole group, a thiazole group, an isothiazole group, an oxadiazole group, or a thiadiazole group, and the second ring may be a cyclopropane group, cyclobutane group, a cyclopentane group, a cyclohexane group, a cycloheptane group, a cyclooctane group, an adamantane group, a norbonane group, a bicyclo[1.1.1]pentane group, a bicyclo[2.1.1]hexane group, a bicyclo[2.2.1]heptane group, a bicyclo[2.2.2]octane group, cyclopentadiene group, a benzene group, a pyrrole group, a furan group, a thiophene group, a silole group, or a borole group.

Non-limiting examples of the π-electron-rich $C_5$-$C_{60}$ cyclic group include a cyclopropane group, cyclobutane group, a cyclopentane group, a cyclohexane group, a cycloheptane group, cyclooctane group, an adamantane group, a norbonane group, a bicyclo[1.1.1]pentane group, a bicyclo[2.1.1]hexane group, a bicyclo[2.2.1]heptane group, a bicyclo[2.2.2]octane group, cyclopentadiene group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, an indenoanthracene group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and the like.

The substituent of the substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —O($Q_{11}$), —S($Q_{11}$), —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each independently unsubstituted or substituted with deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —O($Q_{21}$), —S($Q_{21}$), —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)$_2$($Q_{21}$), —P(=O)($Q_{21}$)($Q_{22}$), or any combination thereof;

—O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), or —P(=O)($Q_{31}$)($Q_{32}$); or any combination thereof.

$Q_1$ to $Q_3$, $Q_{11}$ to $Q_{13}$, $Q_{21}$ to $Q_{23}$ and $Q_{31}$ to $Q_{33}$ used herein may each independently be hydrogen; deuterium; —F; —Cl; —Br; —I; a hydroxyl group; a cyano group; a nitro group; an amidino group; a hydrazine group; a hydrazone group; a $C_1$-$C_{60}$ alkyl group which is unsubstituted or substituted with deuterium, —F, a cyano group, a $C_1$-$C_{60}$ alkyl group, a phenyl group, a biphenyl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, —F, a cyano group, a $C_1$-$C_{10}$ alkyl group, a phenyl group, a biphenyl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_3$, $Q_{11}$ to $Q_{13}$, $Q_{21}$ to $Q_{23}$ and $Q_{31}$ to $Q_{33}$ used herein may each independently be hydrogen, a $C_1$-$C_{10}$ alkyl group, a phenyl group, a biphenyl group, or a naphthyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group". For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a phenyl group having, as a substituent, a $C_6$-$C_{60}$ aryl group substituted with a $C_6$-$C_{60}$ aryl group.

* and *' used herein, unless defined otherwise, each refer to a binding site to a neighboring atom in a corresponding formula.

EXAMPLES

Evaluation Example 1: Measurement of Triplet Energy Level

Quantum chemical calculations were performed on the compounds listed in Table 1 using Gaussian 09, which is a quantum chemistry calculation program manufactured by Gaussian, Inc. In the calculation, B3LYP was used as a structural optimization in a ground state, and 6-31G* (d,p) was used as a function. Information about structural/electronic characteristics for the optimized structure was obtained, and a structural optimization was performed by using a time dependent-density functional theory (TD-DFT) so as to obtain characteristics of singlet and triplet excited states, and a calculation value of triplet energy was obtained.

TABLE 1
| | Compound No. | T1(eV) (calculated) |
|---|---|---|
| Interlayer | A1 | 1.84 |
| | A-A | 2.08 |
| Host | BH | 1.73 |
| | BH-A | 1.72 |
| Dopant | BD | 2.65 |
| Buffer layer | BF3-18 | 1.73 |
| | BF-A | 2.83 |
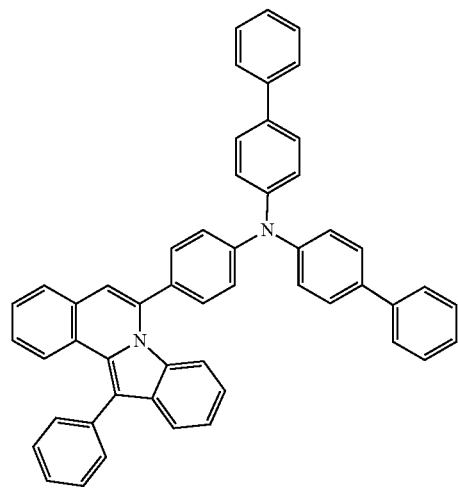
A1
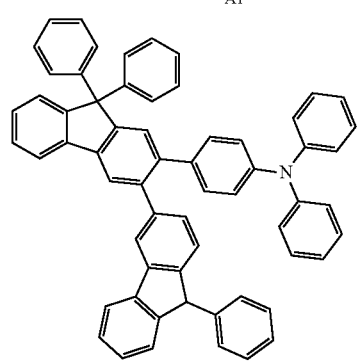
A-A
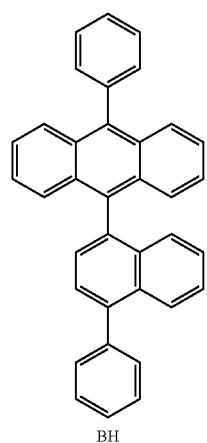
BH
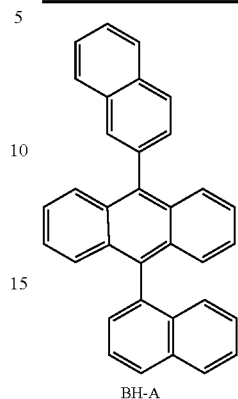
BH-A
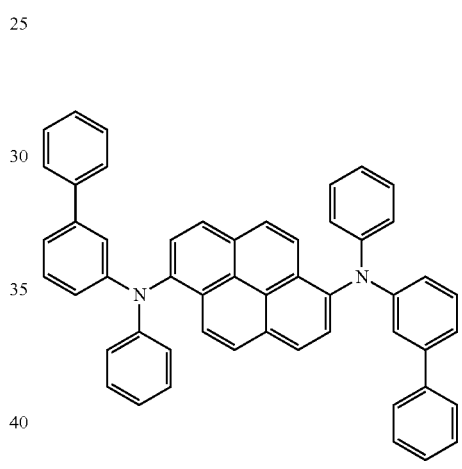
BD
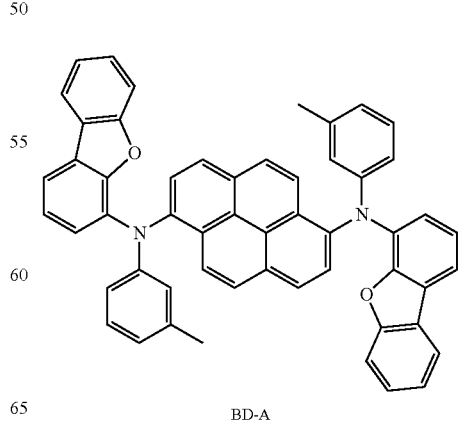
BD-A

TABLE 1-continued

| Compound No. | T1(eV) (calculated) |
| --- | --- |

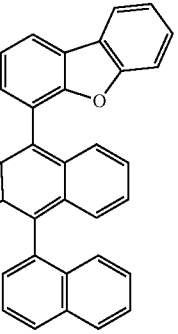

BF3-18

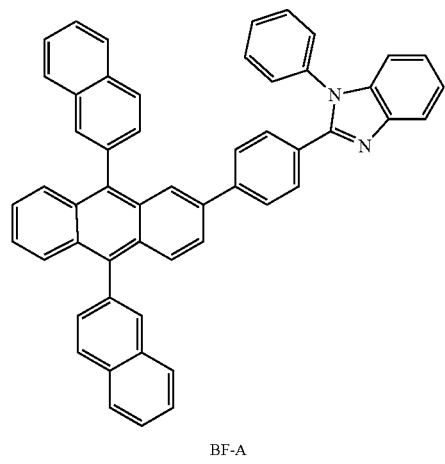 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

BF-A

Example 1

A glass substrate with a 15 Ω/cm² (1200 Å) ITO electrode (anode) formed thereon (product of Corning Inc.) was cut to a size of 50 mm×50 mm×0.5 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

Compound HT1 was vacuum-deposited on the ITO electrode to form a first hole transport layer having a thickness of 100 nm, and then, Compound HT2 was vacuum-deposited on the first hole transport layer to form a second hole transport layer having a thickness of 10 nm.

Compound A1 was vacuum-deposited on the second hole transport layer to form an interlayer having a thickness of 50 nm, and then, Compound A1 and Compound BH were co-deposited on the interlayer at a weight ratio of 97:3 to form a mixed layer having a thickness of 20 nm.

Compound BH, as a host, and Compound BD, as a dopant, were co-deposited on the mixed layer at a weight ratio of 97:3 to form an emission layer having a thickness of 20 nm.

Compound BF3-18 was vacuum-deposited on the emission layer to form a buffer layer having a thickness of 5 nm thickness, and Compound ET37 and Liq were co-deposited at the weight ratio of 5:5 on the buffer layer to form an electron transport layer having a thickness of 20 nm. Liq was vacuum-deposited on the electron transport layer to form an electron injection layer having a thickness of 1 nm, and then, Mg:Ag were co-deposited on the electron injection layer to form a second electrode (cathode) having a thickness of 10 nm, thereby completing the manufacture of an organic light-emitting device having the structure of ITO/HT1 (100 nm)/HT2 (10 nm)/A1 (50 nm)/A1:BH (97:3, 20 nm)/BH:BD (97:3, 20 nm)/BF3-18 (5 nm)/ET37:Liq (5:5, 20 nm)/Liq (1 nm)/Mg:Ag (10 nm). According to Table 1, it can be seen that the organic light-emitting device of Example 1 satisfies Equation 1 and Equation 3 described herein.

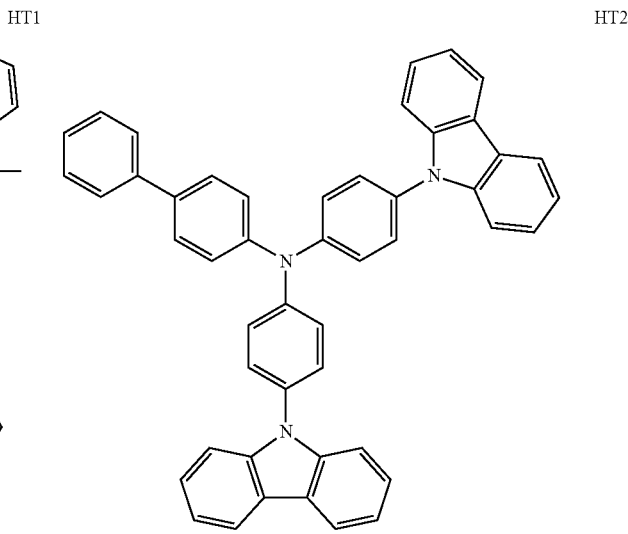

HT1

HT2

-continued
A1
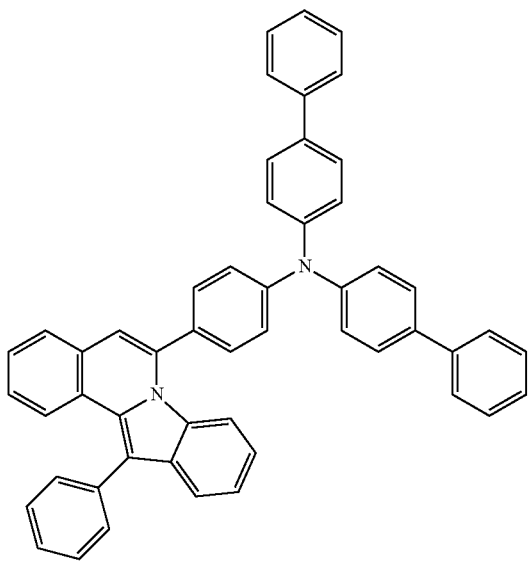
BH
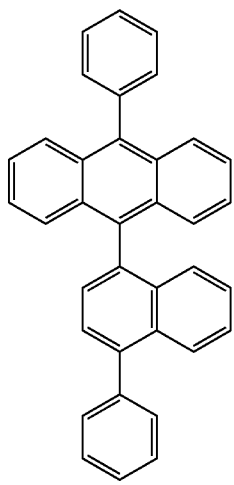
BD
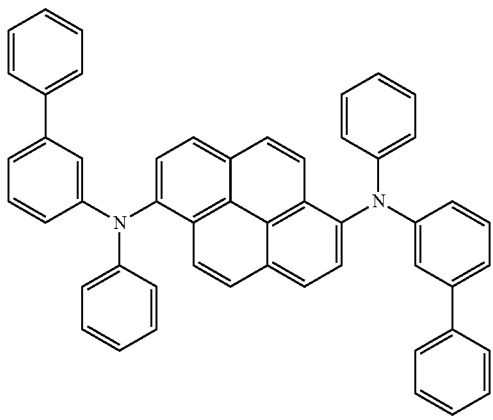
BF3-18
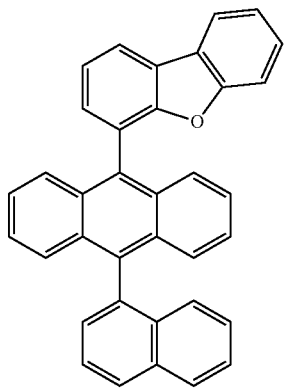
ET37
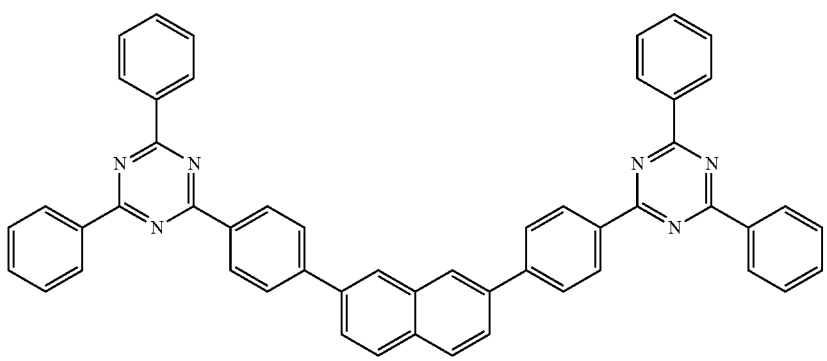

Comparative Example A

An organic light-emitting device of Comparative Example A was manufactured in substantially the same manner as in Example 1, except that the compounds shown in Table 2 were used to form the interlayer, the emission layer and the buffer layer, and the mixed layer was not formed.

Evaluation Example 2

The current efficiency (cd/A) and half lifespan (hr) of the organic light-emitting devices of Example 1 and Comparative Example A were measured using a Keithley SMU 236 and luminance meter PR650, and the results are shown in Table 3. The half lifespan is a measure of the time (hr) taken for the initial luminance (100%) to reach 50%. The current efficiency and half lifespan in Table 3 are expressed as relative values.

TABLE 2

| | Interlayer | Mixed layer | | Emission layer | | Buffer layer |
|---|---|---|---|---|---|---|
| | First compound | First compound | Second compound | Host (second compound) | Dopant | |
| Example 1 | A1 | A1 | BH | BH | BD | BF3-18 |
| Comparative Example A | A-A | — | | BH-A | BD-A | BF-A |

TABLE 3

| | Current efficiency (relative value) | Half lifespan (relative value) |
|---|---|---|
| Example 1 | 105% | 165% |
| Comparative Example A | 100 % | 100 % |

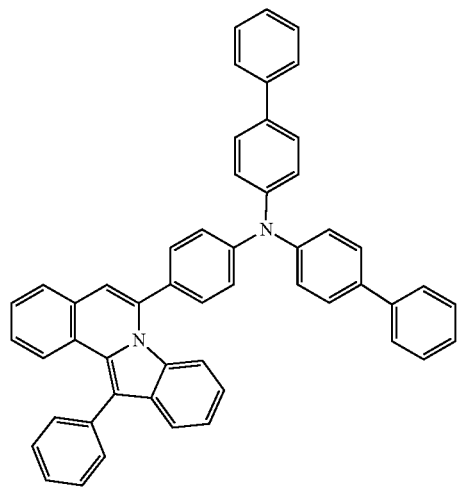

A1

TABLE 3-continued

| | Current efficiency (relative value) | Half lifespan (relative value) |
|---|---|---|

A-A

BH

BH-A

BD

TABLE 3-continued

| Current efficiency (relative value) | Half lifespan (relative value) |
|---|---|
| BD-A | |
| BF3-18 | |
| BF-A | |

Table 3 shows that the current efficiency and half lifespan of the organic light-emitting device of Example 1 is higher and longer, respectively, than the current efficiency and half lifespan of the organic light-emitting device of Comparative Example A.

An organic light-emitting device including a mixed layer, an emission layer and a buffer layer as described above, and satisfying one of Equation 1 or Equation 2, and Equation 3, may have high light-emission efficiency and long lifespan.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. An organic light-emitting device comprising:
a first electrode;
a second electrode facing the first electrode;
an emission layer between the first electrode and the second electrode;
a mixed layer between the first electrode and the emission layer; and
a buffer layer between the emission layer and the second electrode,
wherein the mixed layer comprises a first compound and a second compound,
the first compound and the second compound are different from each other,
the emission layer comprises a host and a dopant,
the host comprises the second compound, and
the organic light-emitting device satisfies at least one of Equation 1, Equation 2, or Equation 3:

Equation 1

$$T1(D) \geq T1(\text{Mix}) + 0.3 \text{ eV} \qquad 1$$

Equation 2

$$T1(H) \geq T1(\text{Mix}) + 0.3 \text{ eV} \qquad 2$$

Equation 3

$$T1(\text{Mix}) < T1(\text{Buffer}) + 0.5 \text{ eV} \qquad 3$$

wherein, in Equation 1 to Equation 3,
T1(D) is a triplet energy level (eV) of the dopant,
T1(H) is i) a triplet energy level (eV) of the second compound, if the host consists of the second compound, or ii) a highest triplet energy level (eV) among triplet energy levels (eV) of one or more additional compounds in the host, if the host further comprises the one or more additional compound other than the second compound,
T1(Mix) is a highest triplet energy level (eV) among triplet energy levels (eV) of one or more compounds in the mixed layer, T1(Buffer) is i) a triplet energy level (eV) of a compound in the buffer layer, if the buffer layer consists of the compound, or ii) a highest triplet energy level (eV) among triplet energy levels (eV) of a plurality of compounds in the buffer layer, if the buffer layer comprises at least two compounds which are different from each other, and T1(D), T1(H), T1(Mix), and T1(Buffer) are each evaluated utilizing a density functional method (DFT).

2. The organic light-emitting device of claim 1, wherein the organic light-emitting device satisfies both of Equation 1 and Equation 3, and optionally satisfies Equation 2.

3. The organic light-emitting device of claim 1, wherein the first compound is a monoamine compound comprising an indoloquinoline group or an indoloisoquinoline group.

4. The organic light-emitting device of claim 1, wherein the second compound comprises three or more $C_1$-$C_{60}$ cyclic groups, the three or more $C_1$-$C_{60}$ cyclic groups are each independently identical to or different from each other, and the three or more $C_1$-$C_{60}$ cyclic groups are linked to each other via a single bond.

5. The organic light-emitting device of claim 1, wherein the second compound comprises at least one anthracene group.

6. The organic light-emitting device of claim 1, wherein the first compound is represented by Formula 1, and the second compound is represented by Formula 2:

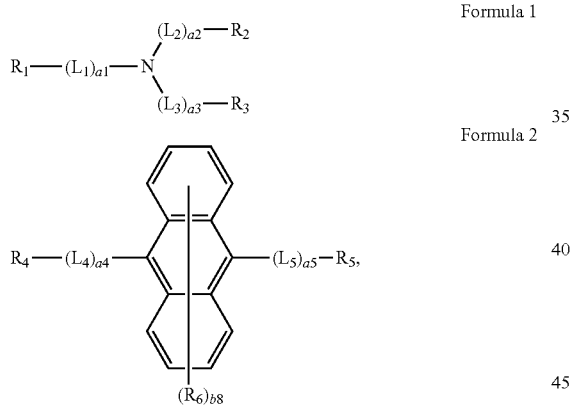

wherein, in Formula 1 and Formula 2, $L_1$ to $L_5$ are each independently a single bond, a $C_5$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, a1 to a5 are each independently an integer from 1 to 10, $R_3$ is an indoloquinoline group that is unsubstituted or substituted with at least one $R_{10a}$, or an indoloisoquinoline group that is unsubstituted or substituted with at least one $R_{10a}$, $R_1$, $R_2$, $R_4$, and $R_5$ are each independently a $C_5$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $R_{10a}$ and $R_6$ are each independently hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b8 is an integer from 0 to 8, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group is:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —O($Q_{11}$), —S($Q_{11}$), —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —O($Q_{21}$), —S($Q_{21}$),—Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)$_2$($Q_{21}$),—P(=O)($Q_{21}$)($Q_{22}$), or any combination thereof;

—O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), or —P(=O)($Q_{31}$)($Q_{32}$); or any combination thereof, wherein $Q_1$ to $Q_3$, $Q_{11}$ to $Q_{13}$, $Q_{21}$ to $Q_{23}$ and $Q_{31}$ to $Q_{33}$ are each independently hydrogen; deuterium; —F; —Cl; —Br; —I; a hydroxyl group; a cyano group; a nitro group; an amidino group; a hydrazine group; a hydrazone group; a $C_1$-$C_{60}$ alkyl group which is unsubstituted or substituted with deuterium, —F, a cyano group, a $C_1$-$C_{60}$ alkyl group, a phenyl group, a biphenyl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group;

a $C_6$-$C_{60}$ aryl group which is unsubstituted or substituted with deuterium, —F, a cyano group, a $C_1$-$C_{10}$ alkyl group, a phenyl group, a biphenyl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

7. The organic light-emitting device of claim 6, wherein $R_3$ is represented by one selected from Formulae 1A-1 to 1A-10, 1B-1 to 1B-10, and 1C-1 to 1C-10:

1A-1

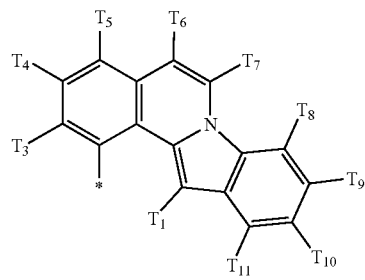

1A-2

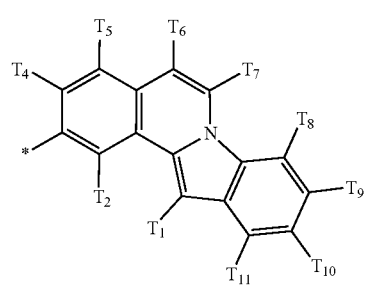

1A-3

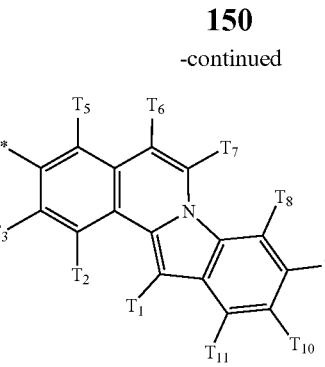

1A-4

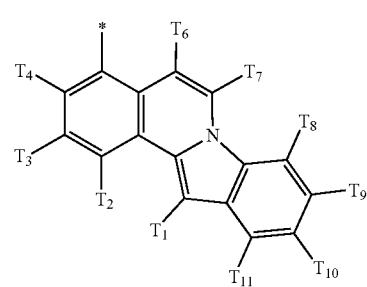

1A-5

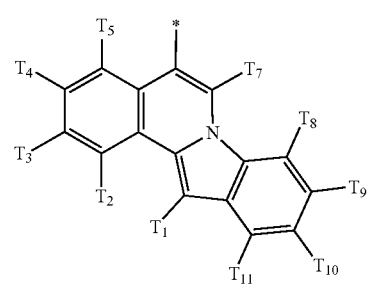

1A-6

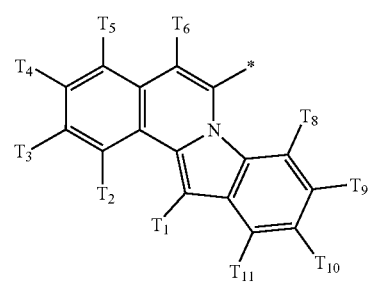

1A-7

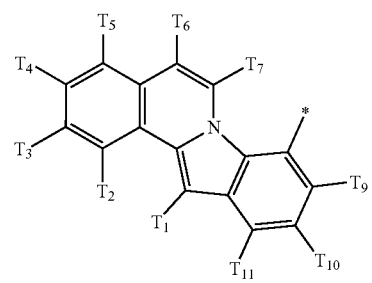

1A-8
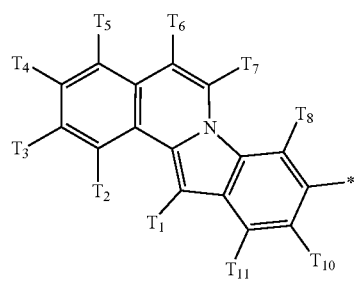
1A-9
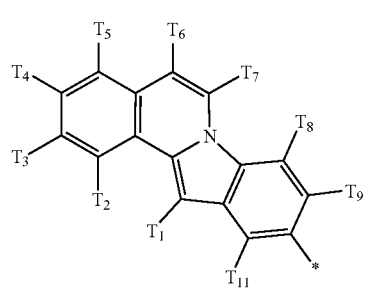
1A-10
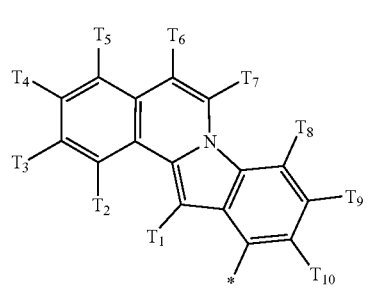
1B-1
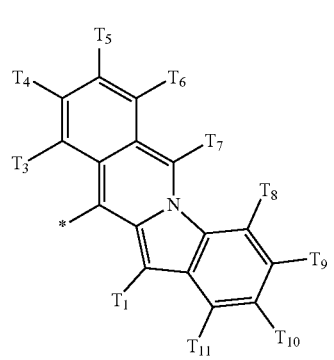
1B-2
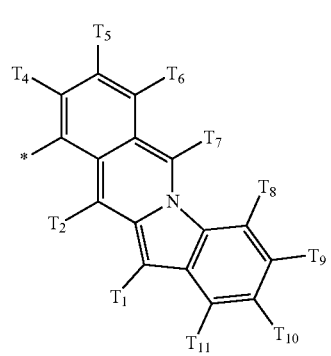
1B-3
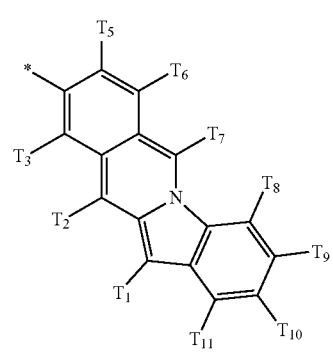
1B-4
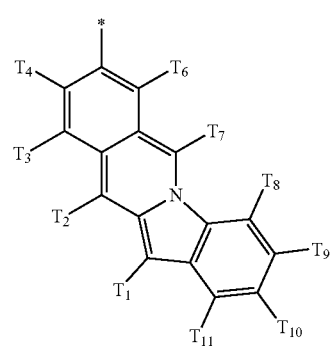
1B-5
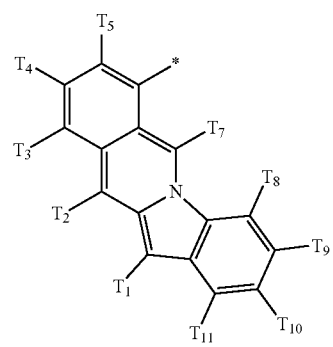
1B-6
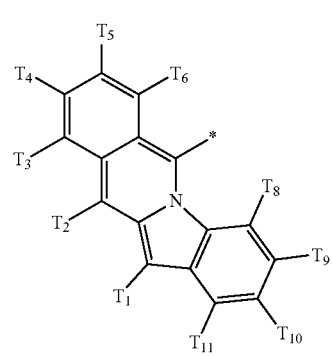

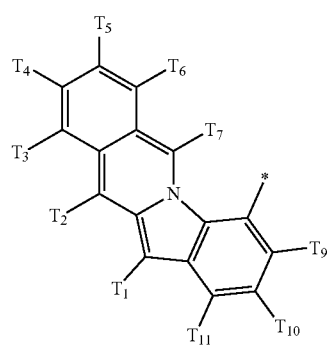
1B-7
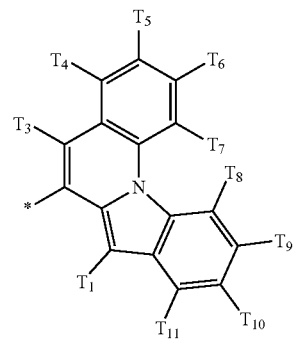
1C-1
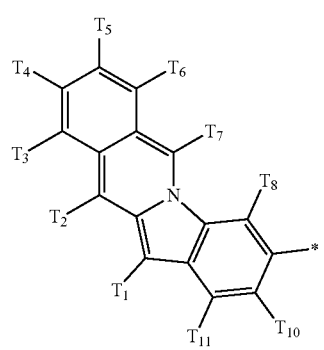
1B-8
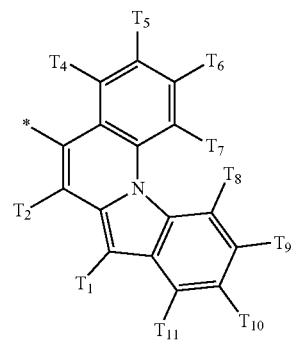
1C-2
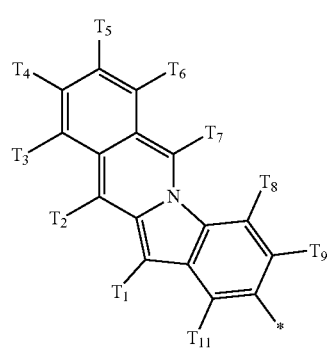
1B-9
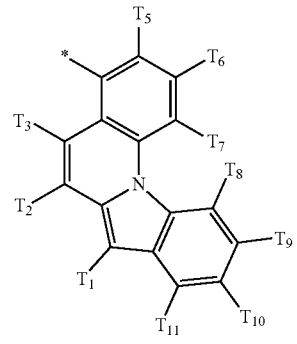
1C-3
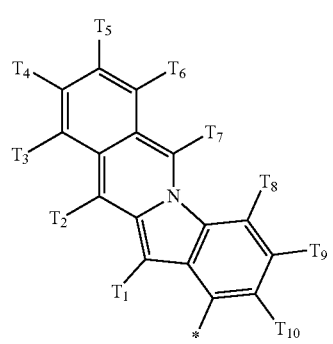
1B-10
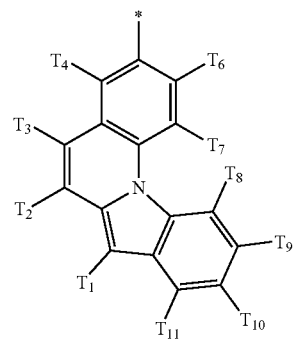
1C-4

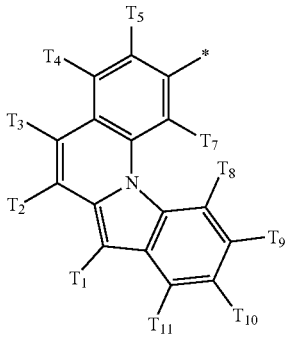

1C-5

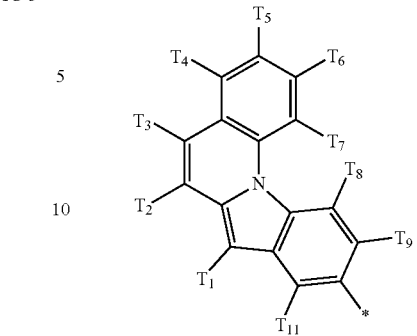

1C-6

1C-9

1C-10

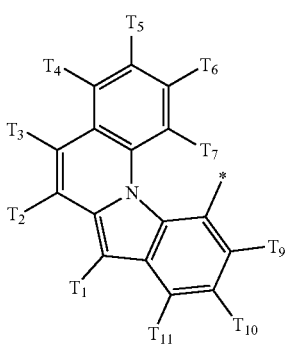

1C-7

1C-8 wherein $T_1$ to $T_{11}$ in Formulae 1A-1 to 1A-10, 1B-1 to 1B-10 and 1C-1 to 1C-10 are each independently the same as described in connection with the $R_{10a}$ in Formula 1, and * indicates a binding site to the $L_3$.

8. The organic light-emitting device of claim 6, wherein $R_1$, $R_2$, $R_4$ and $R_5$ are each independently a π-electron-rich $C_5$-$C_{30}$ cyclic group or a pyridine group, each independently unsubstituted or substituted with deuterium, —F, a $C_1$-$C_{20}$ alkyl group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo[2.2.1]heptyl group, a ($C_1$-$C_{20}$ alkyl) bicyclo[2.2.2]octyl group, a phenyl group, a ($C_1$-$C_{20}$ alkyl)phenyl group, a biphenyl group, a terphenyl group, a naphthyl group, a pyridinyl group, a phenoxy group, or any combination thereof.

9. The organic light-emitting device of claim 1, wherein the first compound does not comprise a carbazole group.

10. The organic light-emitting device of claim 1, wherein a thickness of the mixed layer is in a range from about 1 nm to about 200 nm.

11. The organic light-emitting device of claim 1, wherein the dopant is a fluorescent dopant.

12. The organic light-emitting device of claim 1, wherein the dopant is a diamine compound comprising a pyrene group.

13. The organic light-emitting device of claim 1, wherein the host of the emission layer consists of the second compound.

14. The organic light-emitting device of claim 1, wherein the buffer layer comprises a hole transport compound, an electron transport compound, or any combination thereof, the hole transport compound is different from the electron transport compound, the hole transport compound does not include an electron transport group, the electron transport compound comprises at least one electron transport group, and the electron transport group is a fluoro group, a cyano group, a 1r electron-depleted nitrogen-containing $C_1$-$C_{60}$ heterocyclic group, one of the groups represented by the following formulae, or any combination thereof:

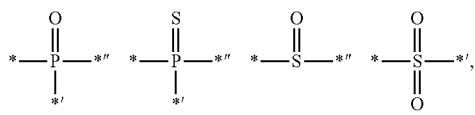

wherein *, *', and *" in the formulae above are each independently a binding site to a respective neighboring atom.

15. The organic light-emitting device of claim 1, wherein the mixed layer and the emission layer are in direct contact with each other, and the emission layer and the buffer layer are in direct contact with each other.

16. The organic light-emitting device of claim 1, further comprising an interlayer between the first electrode and the mixed layer.

17. The organic light-emitting device of claim 16, wherein the interlayer comprises the first compound.

18. The organic light-emitting device of claim 16, wherein the interlayer and the mixed layer are in direct contact with each other.

19. The organic light-emitting device of claim 1, further comprising a hole transport region between the first electrode and the mixed layer, wherein the hole transport region comprises a carbazole group.

20. An apparatus comprising the organic light-emitting device of claim 1.

* * * * *

UNITED STATES PATENT AND TRADEMARK OFFICE
CERTIFICATE OF CORRECTION

PATENT NO. : 12,284,859 B2
APPLICATION NO. : 18/179306
DATED : April 22, 2025
INVENTOR(S) : Seungjin Chu et al.

It is certified that error appears in the above-identified patent and that said Letters Patent is hereby corrected as shown below:

In the Claims

In Column 147, Line 9, in Claim 1, delete "method" and insert -- theory --.

In Column 148, Line 19, in Claim 6, delete "—C(=O)($Q_1$),—S(=O)$_2$($Q_1$)," and insert -- —C(=O)($Q_1$), —S(=O)$_2$($Q_1$), --.

In Column 148, Lines 53-54, in Claim 6, delete "—S($Q_{11}$),—Si($Q_{11}$)($Q_{12}$)($Q_{13}$)," and insert -- —S($Q_{11}$), —Si($Q_{11}$)($Q_{12}$)($Q_{13}$), --.

In Column 149, Lines 10-11, in Claim 6, delete "—S($Q_{21}$),—Si($Q_{21}$)($Q_{22}$)($Q_{23}$)," and insert -- —S($Q_{21}$), —Si($Q_{21}$)($Q_{22}$)($Q_{23}$), --.

In Column 149, Lines 12-13, in Claim 6, delete "—S(=O)$_2$($Q_{21}$),—P(=O)($Q_{21}$)($Q_{22}$)," and insert -- —S(=O)$_2$($Q_{21}$), —P(=O)($Q_{21}$)($Q_{22}$), --.

In Column 156, Line 35, in Claim 8, delete "TT-electron-rich" and insert -- π-electron-rich --.

In Column 156, Line 39, in Claim 8, delete "cycloctyl" and insert -- cyclooctyl --.

In Column 156, Line 45, in Claim 8, delete "alkyl)cycloctyl" and insert -- alkyl)cyclooctyl --.

In Column 156, Line 46, in Claim 8, delete "alkyl) norbornenyl" and insert -- alkyl)norbornenyl --.

In Column 156, Line 49, in Claim 8, delete "alkyl) bicyclo" and insert -- alkyl)bicyclo --.

In Column 156, Lines 49-50, in Claim 8, delete "alkyl) bicyclo" and insert -- alkyl)bicyclo --.

In Column 156, Line 50, in Claim 8, delete "alkyl) bicyclo" and insert -- alkyl)bicyclo --.

Signed and Sealed this
Twenty-first Day of October, 2025

John A. Squires
*Director of the United States Patent and Trademark Office*

CERTIFICATE OF CORRECTION (continued)

In Column 156, Line 51, in Claim 8, delete "alkyl) bicyclo" and insert -- alkyl)bicyclo --.

In Column 157, Line 12, in Claim 14, delete "Ir" and insert -- π --.

In Column 157, Lines 17-22, in Claim 14, delete "  " and insert -- 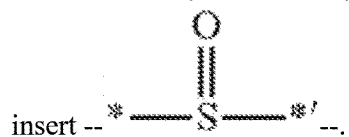 --.